United States Patent
Ohsawa et al.

(10) Patent No.: US 9,799,482 B2
(45) Date of Patent: Oct. 24, 2017

(54) DEVICE MANUFACTURING APPARATUS AND MANUFACTURING METHOD OF MAGNETIC DEVICE USING STRUCTURE TO PASS ION BEAM

(71) Applicant: Toshiba Memory Corporation, Minato-ku (JP)

(72) Inventors: Yuichi Ohsawa, Yokohama (JP); Akio Ui, Tokyo (JP); Junichi Ito, Yokohama (JP); Chikayoshi Kamata, Kawasaki (JP); Megumi Yakabe, Kawasaki (JP); Saori Kashiwada, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/067,832

(22) Filed: Mar. 11, 2016

(65) Prior Publication Data

US 2016/0196951 A1 Jul. 7, 2016

Related U.S. Application Data

(63) Continuation of application No. PCT/JP2015/052752, filed on Jan. 30, 2015.

(30) Foreign Application Priority Data

Jan. 31, 2014 (JP) .................................. 2014-017905

(51) Int. Cl.
*H01J 37/08* (2006.01)
*H01L 43/12* (2006.01)
(Continued)

(52) U.S. Cl.
CPC .............. *H01J 37/08* (2013.01); *H01J 37/09* (2013.01); *H01J 37/20* (2013.01); *H01J 37/30* (2013.01);
(Continued)

(58) Field of Classification Search
CPC .. H01J 37/08; H01J 37/20; H01J 37/30; H01J 37/3053; H01J 37/3056; H01J 37/32009;
(Continued)

(56) References Cited

U.S. PATENT DOCUMENTS

| | | | |
|---|---|---|---|
| 4,636,680 A * | 1/1987 | Bills | H01J 41/04 |
| | | | 313/230 |
| 4,862,032 A | 8/1989 | Kaufman et al. | |

(Continued)

FOREIGN PATENT DOCUMENTS

| | | |
|---|---|---|
| JP | 8-507640 | 8/1996 |
| JP | 9-40441 | 2/1997 |

(Continued)

OTHER PUBLICATIONS

T. Shimatsu, et al., "Dry-etching damage to magnetic anisotropy of Co—Pt dot arrays characterized using anomalous Hall effect", Journal of Applied Physics, AIP, 111, 07B908, 2012, 4 pages.

(Continued)

*Primary Examiner* — David A Vanore
(74) *Attorney, Agent, or Firm* — Oblon, McClelland, Maier & Neustadt, L.L.P.

(57) ABSTRACT

A device manufacturing apparatus and manufacturing method of a magnetic device. The device manufacturing apparatus can include a substrate holding portion configured to hold a substrate, an ion source, an anode disposed in a housing of the ion source, and a cathode disposed outside the housing of the ion source. A first opening can be disposed in a portion of the housing such the anode is exposed to a region between the anode and the substrate holding portion. The ion source can be configured to generate an ion beam with which the substrate is irradiated. A first structure can be disposed between the ion source and the substrate holding portion. The first structure can have a first through hole (Continued)

through which the ion beam can pass. The first structure can include a conductor, and an opening dimension of the first through hole can be equal to or larger than an opening dimension of the first opening.

20 Claims, 44 Drawing Sheets

(51) Int. Cl.
    *H01J 37/30* (2006.01)
    *H01J 37/09* (2006.01)
    *H01J 37/20* (2006.01)
    *H01J 37/305* (2006.01)
    *H01L 27/22* (2006.01)

(52) U.S. Cl.
    CPC .......... *H01J 37/3053* (2013.01); *H01L 43/12* (2013.01); *H01J 2237/083* (2013.01); *H01J 2237/0822* (2013.01); *H01J 2237/3151* (2013.01); *H01L 27/228* (2013.01)

(58) Field of Classification Search
    CPC .......... H01J 37/09; H01J 37/16; H01J 37/261; H01J 37/3178; H01J 37/3233; H01J 37/32724; H01J 41/04; H01J 27/143; H01L 27/228; H01L 43/12; H01L 21/2253
    USPC ....... 250/492.3, 492.21; 118/723 CB, 723 E, 118/723 FE, 723 FI, 723 MP; 313/230, 313/264, 7; 315/111.21, 111.81
    See application file for complete search history.

(56) References Cited

U.S. PATENT DOCUMENTS

| | | | |
|---|---|---|---|
| 5,563,410 A | 10/1996 | Mullock et al. | |
| 6,236,163 B1* | 5/2001 | Maishev | H01J 27/143 118/723 CB |
| 6,777,862 B2 | 8/2004 | Fisch et al. | |
| 8,939,108 B2* | 1/2015 | Bertagnolli | H01J 37/16 118/723 FE |
| 9,006,848 B2* | 4/2015 | Park | H01L 27/224 257/108 |
| 9,460,925 B2* | 10/2016 | Wang | H01L 21/2253 |
| 2006/0225998 A1* | 10/2006 | Song | C23C 14/355 204/192.11 |
| 2010/0080050 A1 | 4/2010 | Ozeki et al. | |
| 2011/0091778 A1* | 4/2011 | Kambara | H01M 8/0247 429/408 |
| 2014/0087483 A1* | 3/2014 | Ohsawa | H01J 37/08 438/3 |
| 2016/0196951 A1* | 7/2016 | Ohsawa | H01J 37/30 250/492.3 |

FOREIGN PATENT DOCUMENTS

| | | |
|---|---|---|
| JP | 11-176373 | 7/1999 |
| JP | 2000-223064 | 8/2000 |
| JP | 2002-534795 | 10/2002 |
| JP | 2007-300011 | 11/2007 |
| JP | 2009-231294 | 10/2009 |
| JP | 2013-12546 | 1/2013 |
| JP | 2014-67837 | 4/2014 |

OTHER PUBLICATIONS

International Search Report issued Mar. 10, 2015 in PCT/JP2015/052752 filed Jan. 30, 2015 (with English translation).

Written Opinion issued Mar. 10, 2015 in PCT/JP2015/052752 filed Jan. 30, 2015 (with English Translation).

* cited by examiner

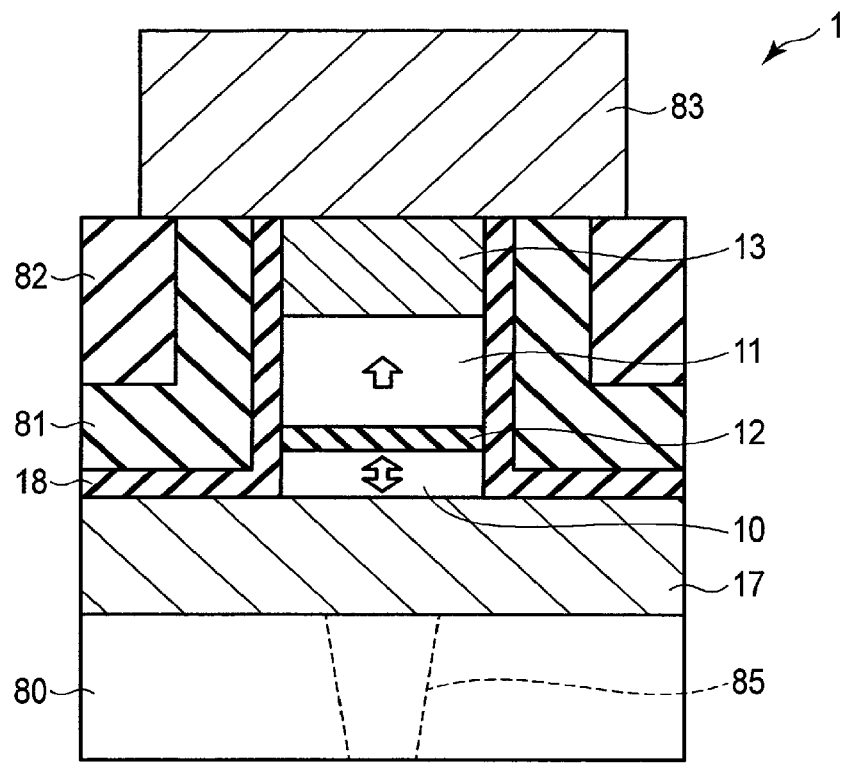
F I G. 2
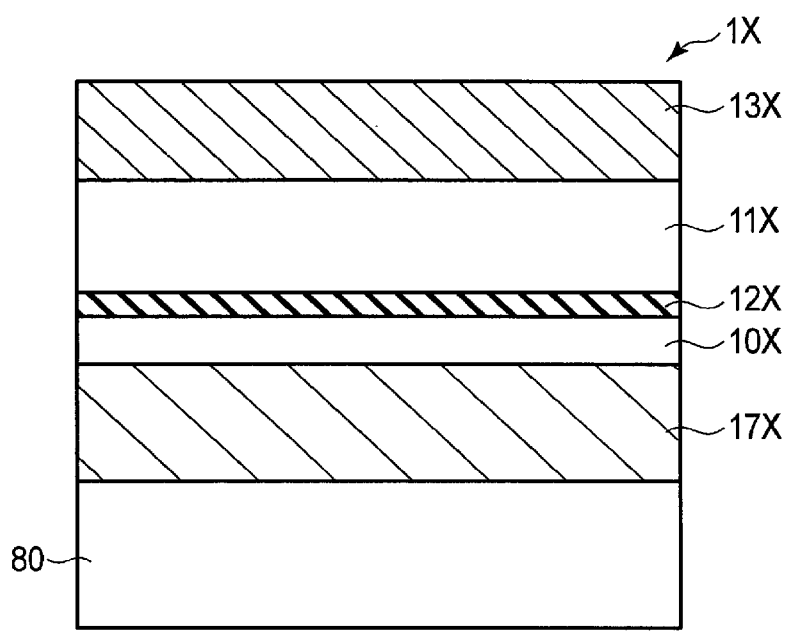
F I G. 3

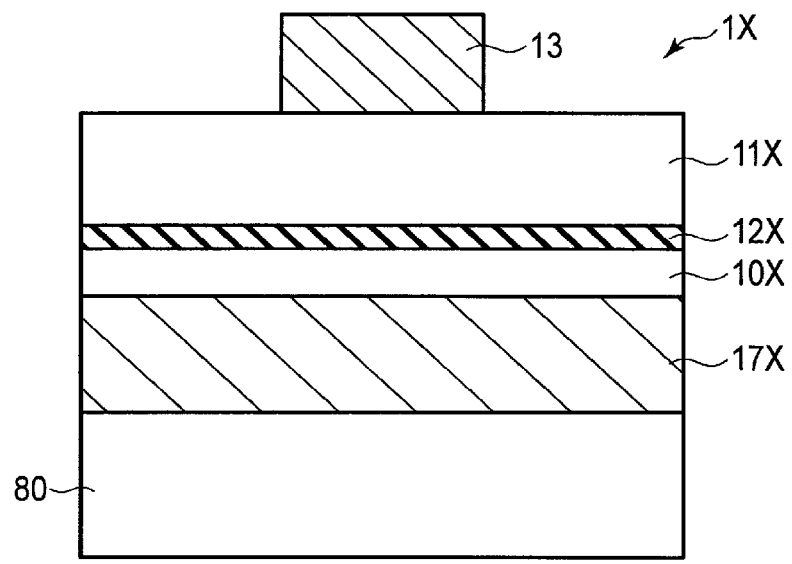
F I G. 4
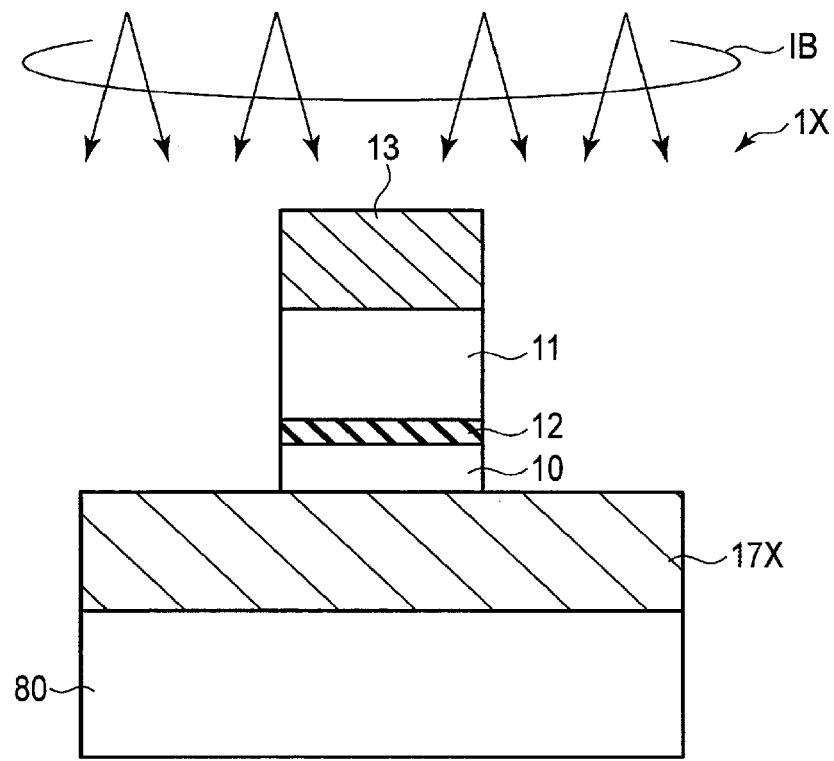
F I G. 5

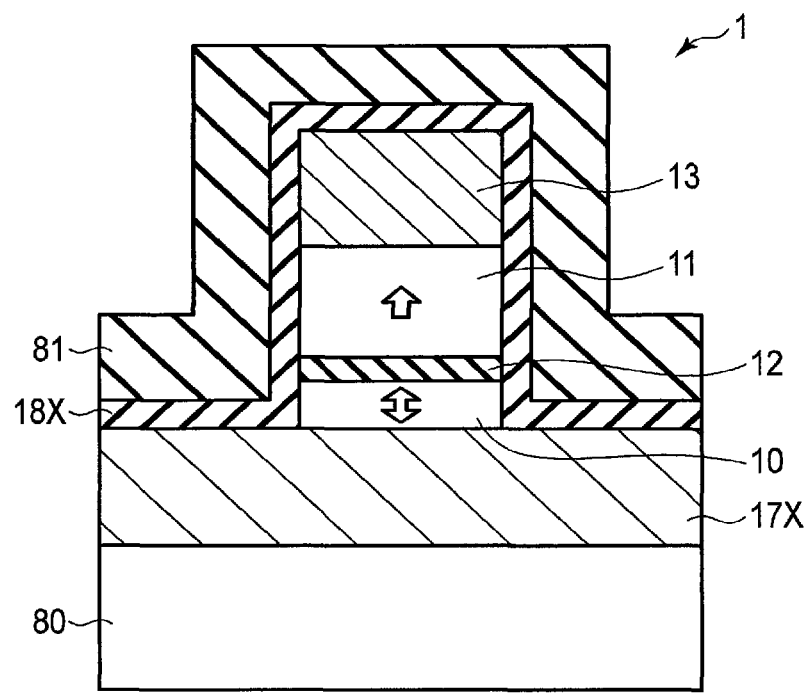
F I G. 6
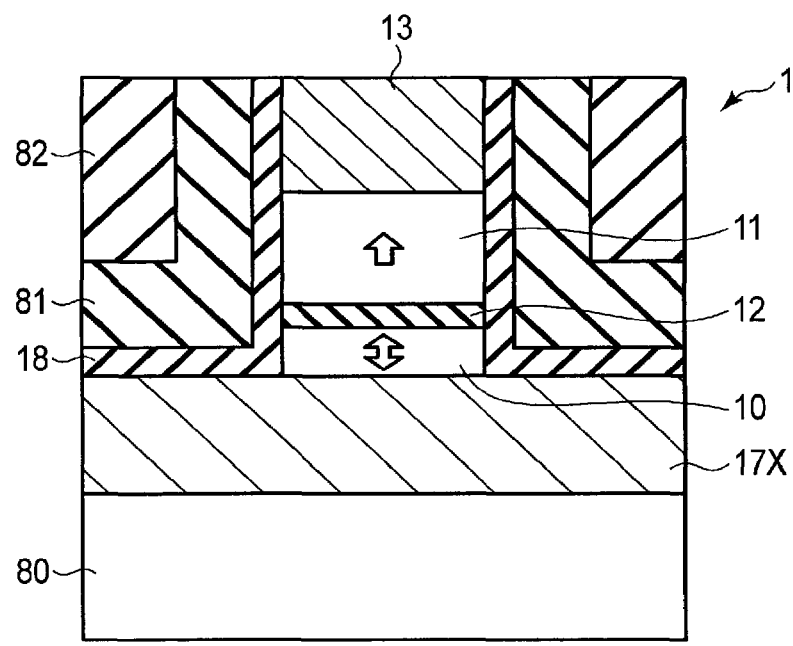
F I G. 7

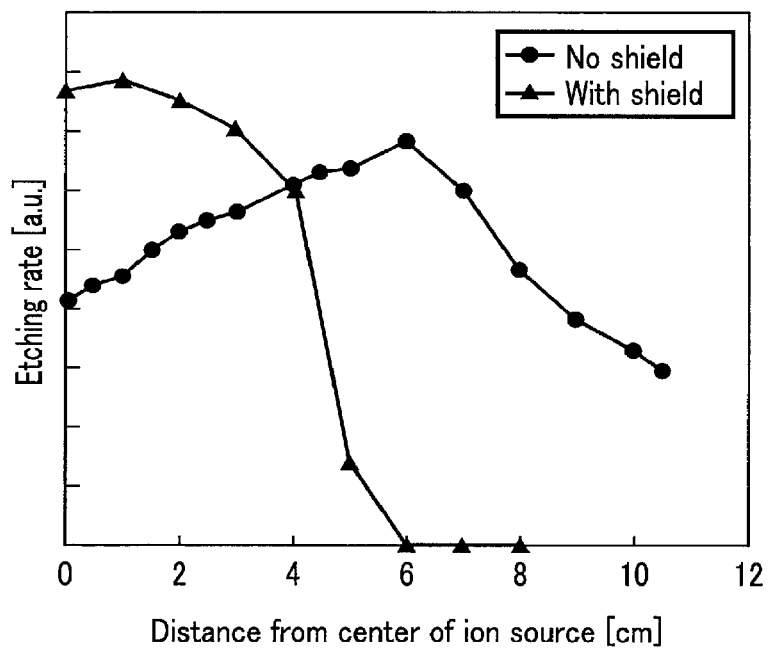
F I G. 11
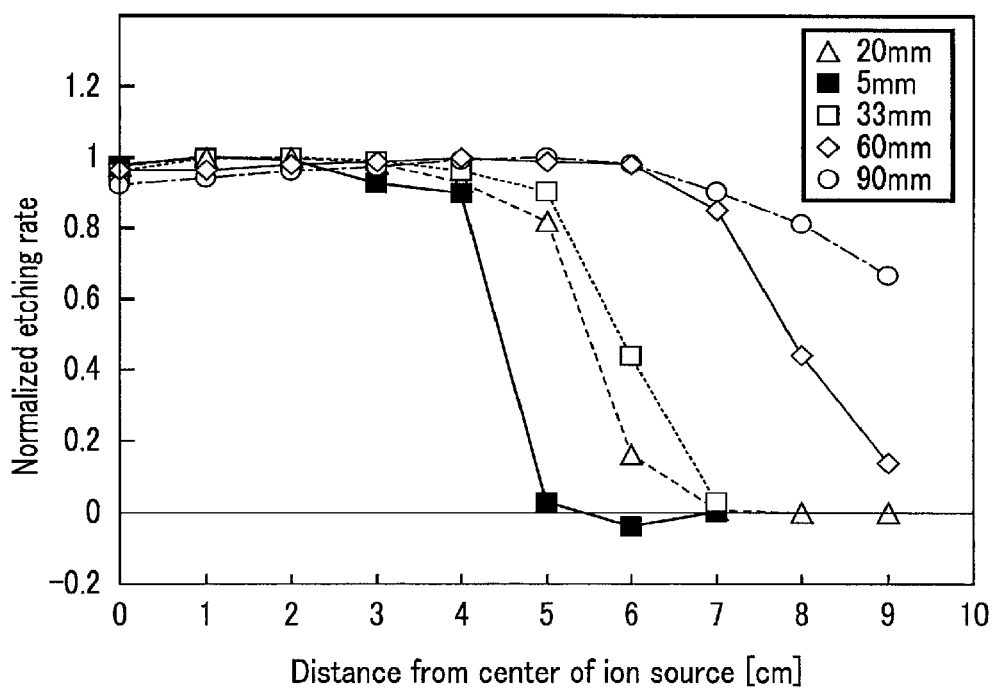
F I G. 12

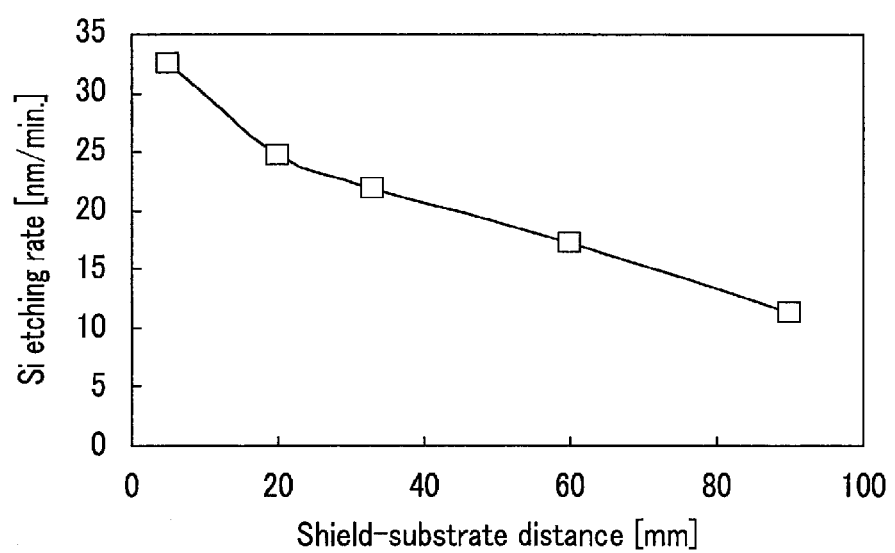
F I G. 13

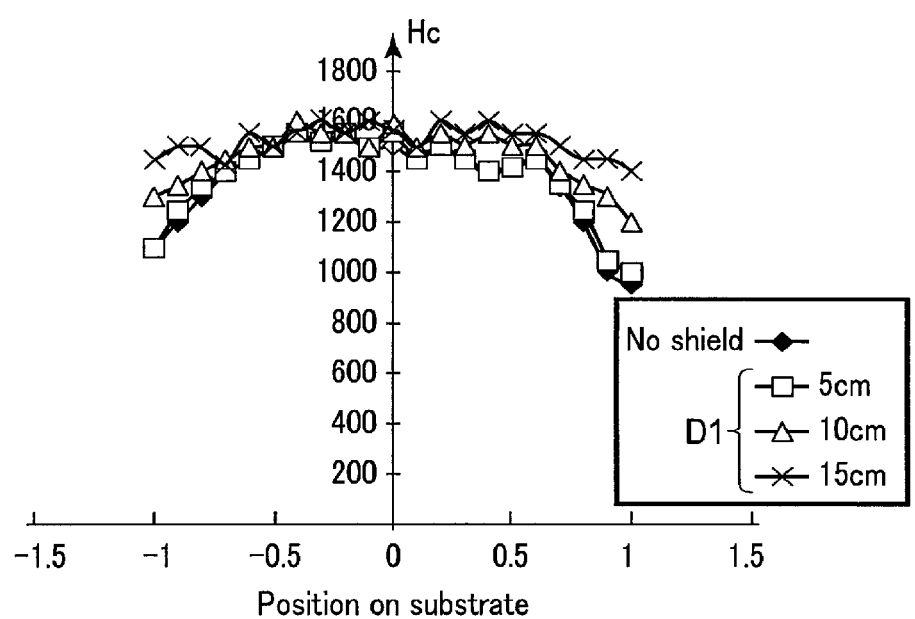
F I G. 15

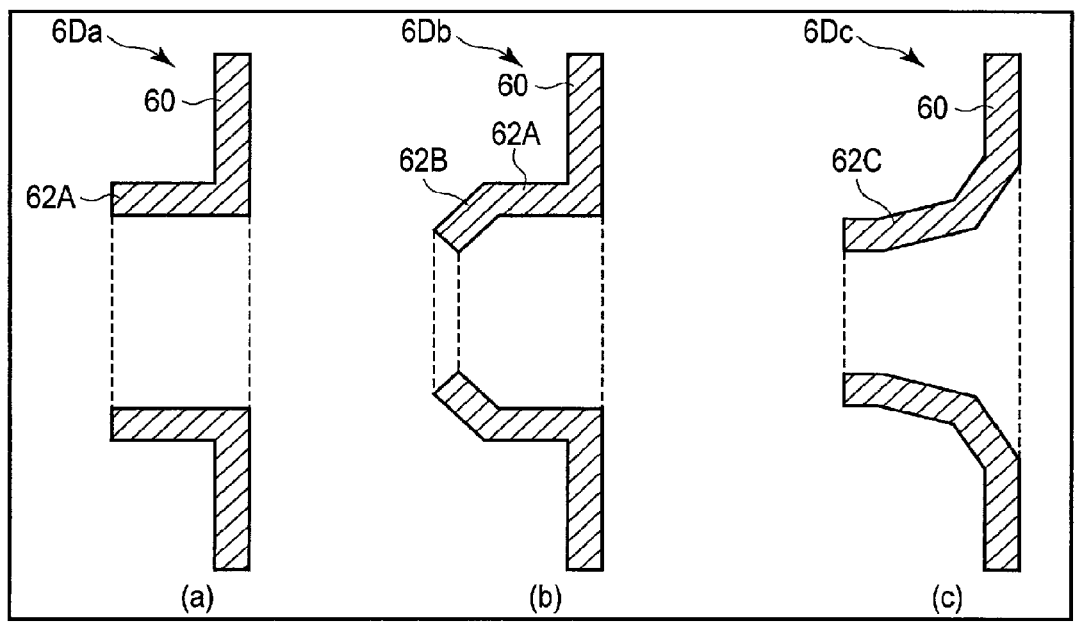
F I G. 20
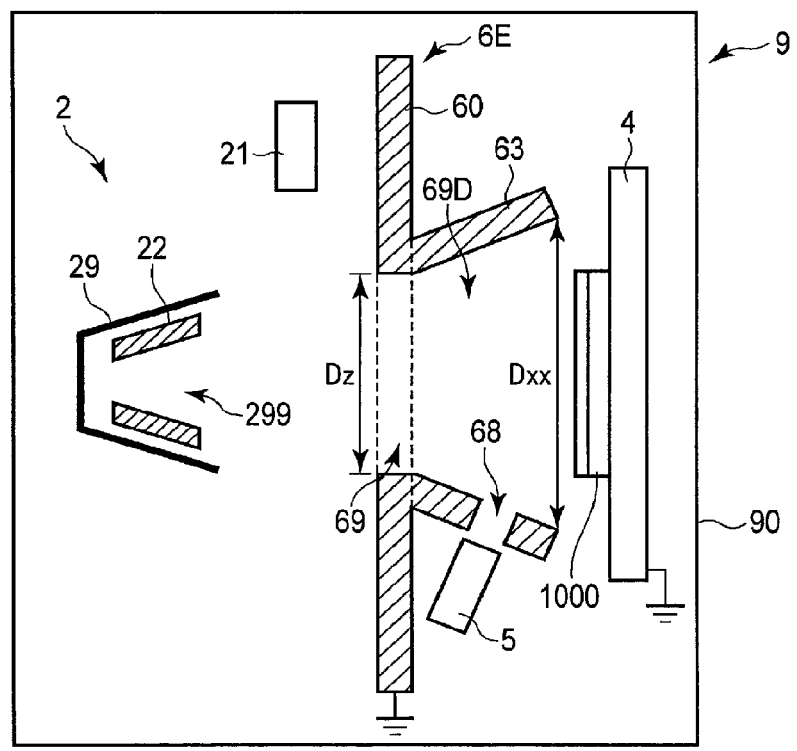
F I G. 21

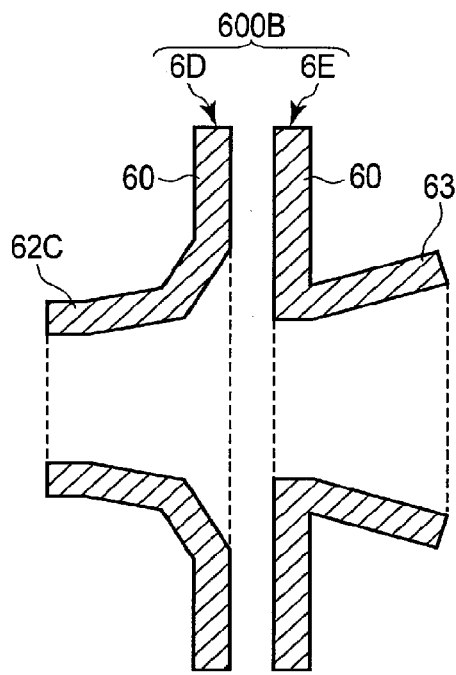
F I G. 22
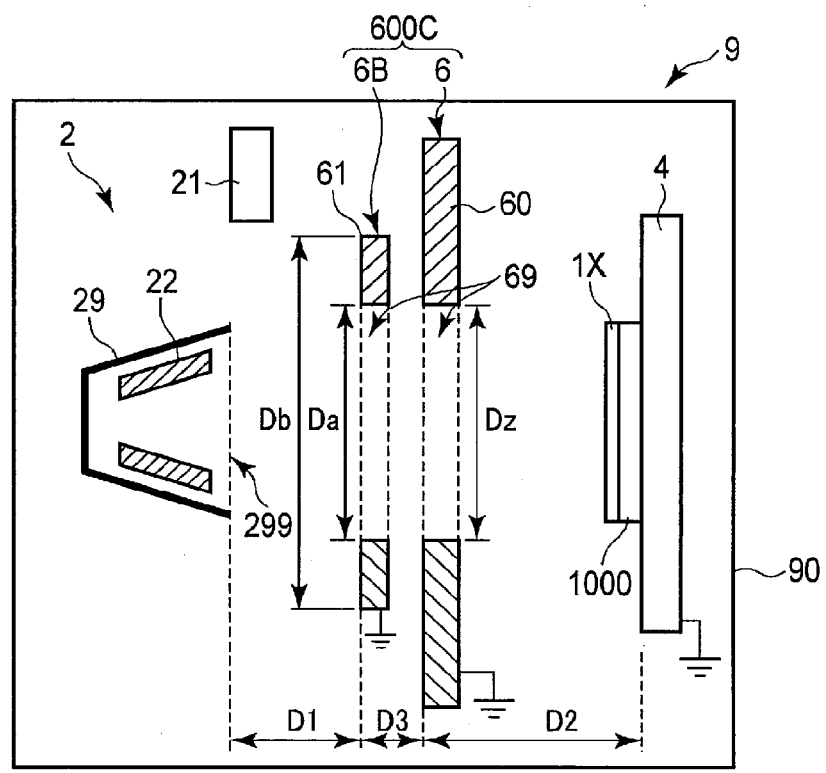
F I G. 23

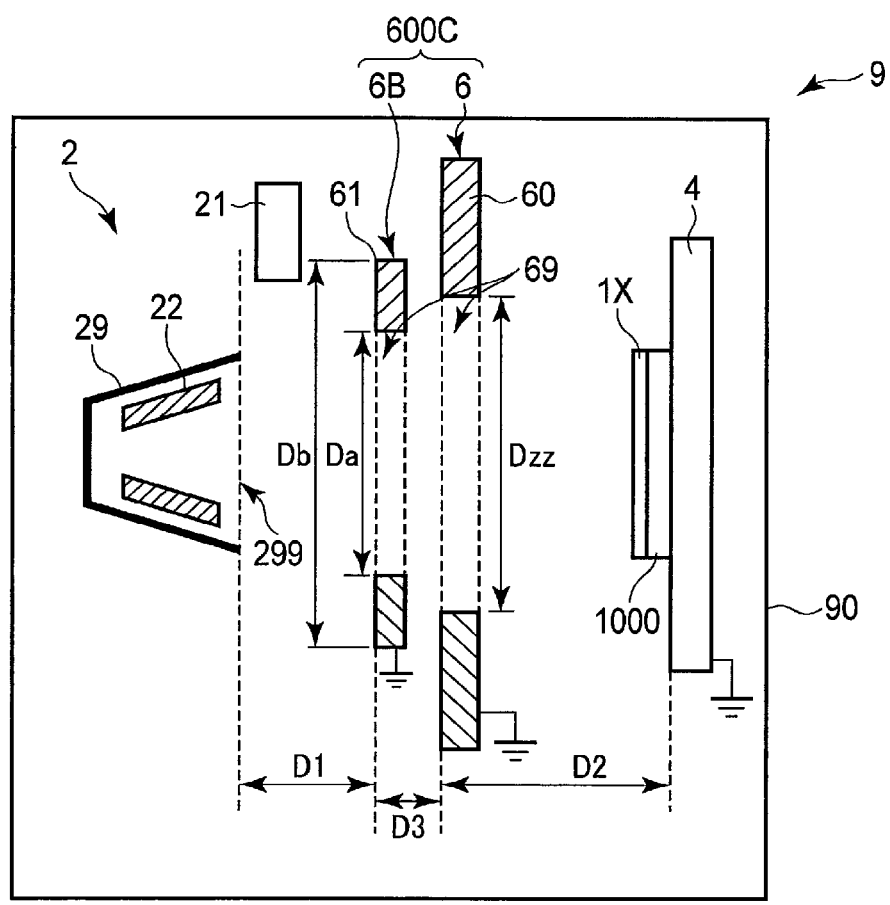
F I G. 24

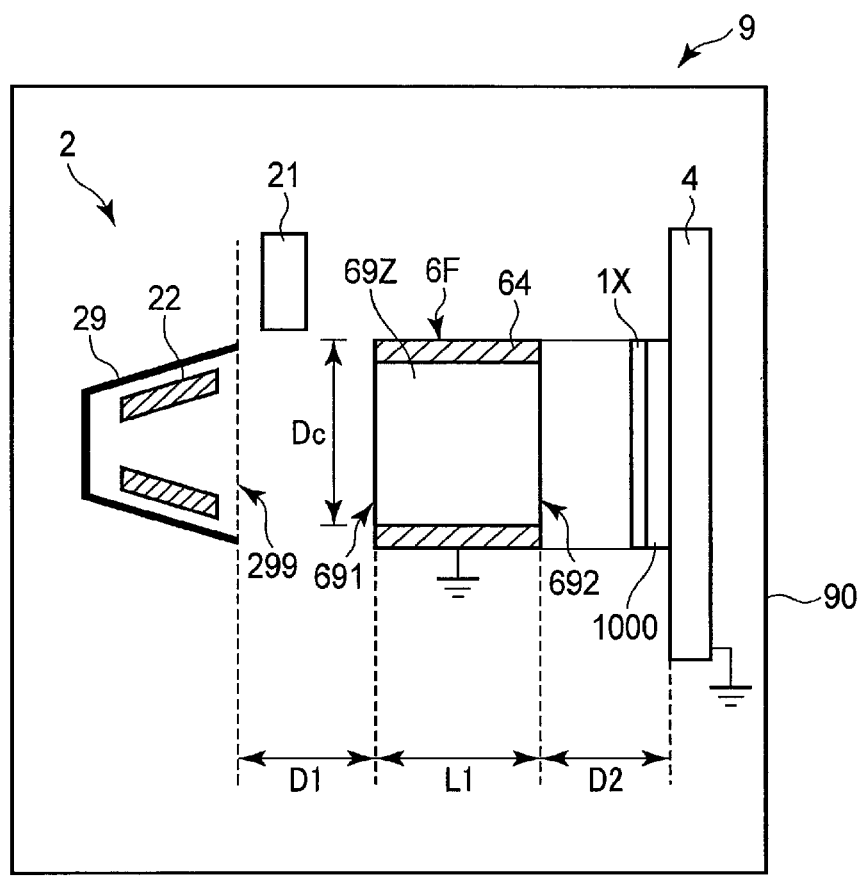
F I G. 25

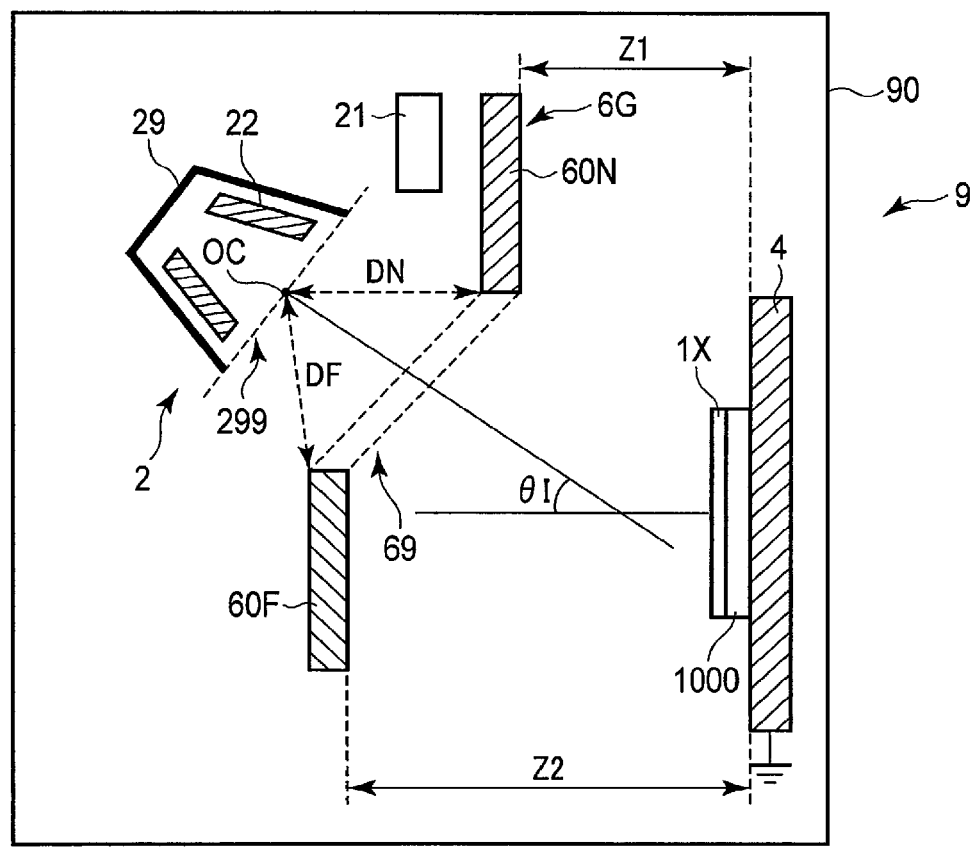
F I G. 28

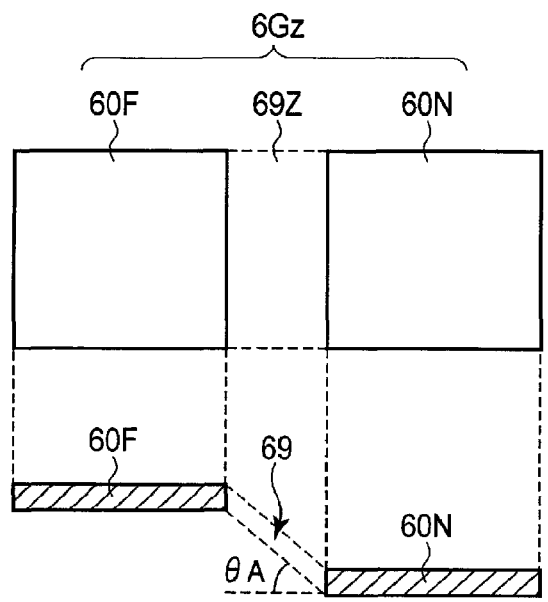
F I G. 30
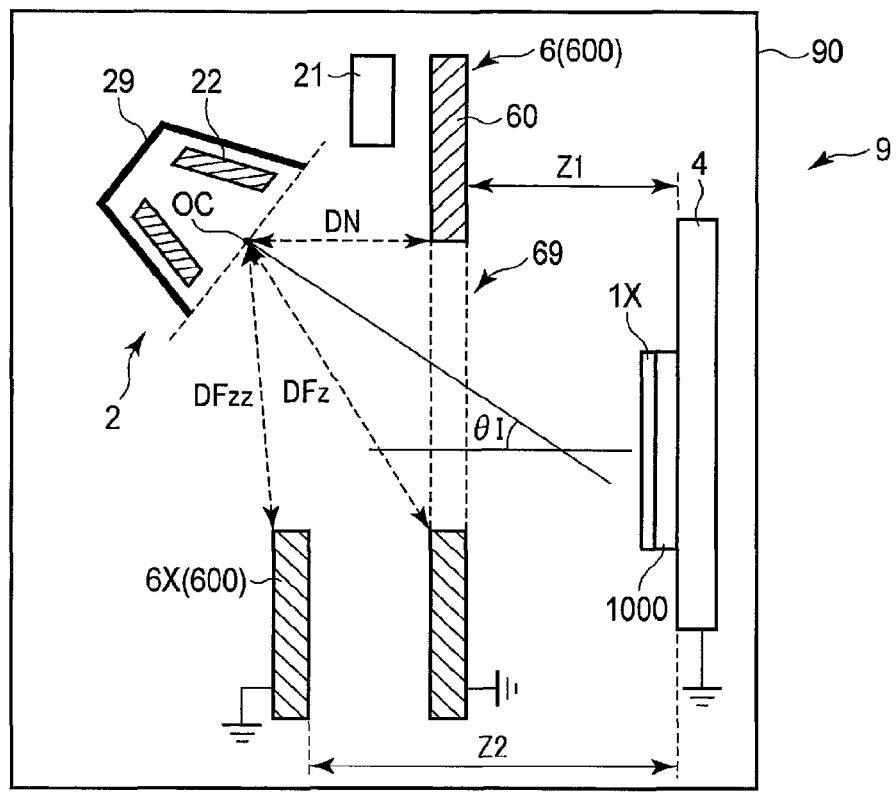
F I G. 31

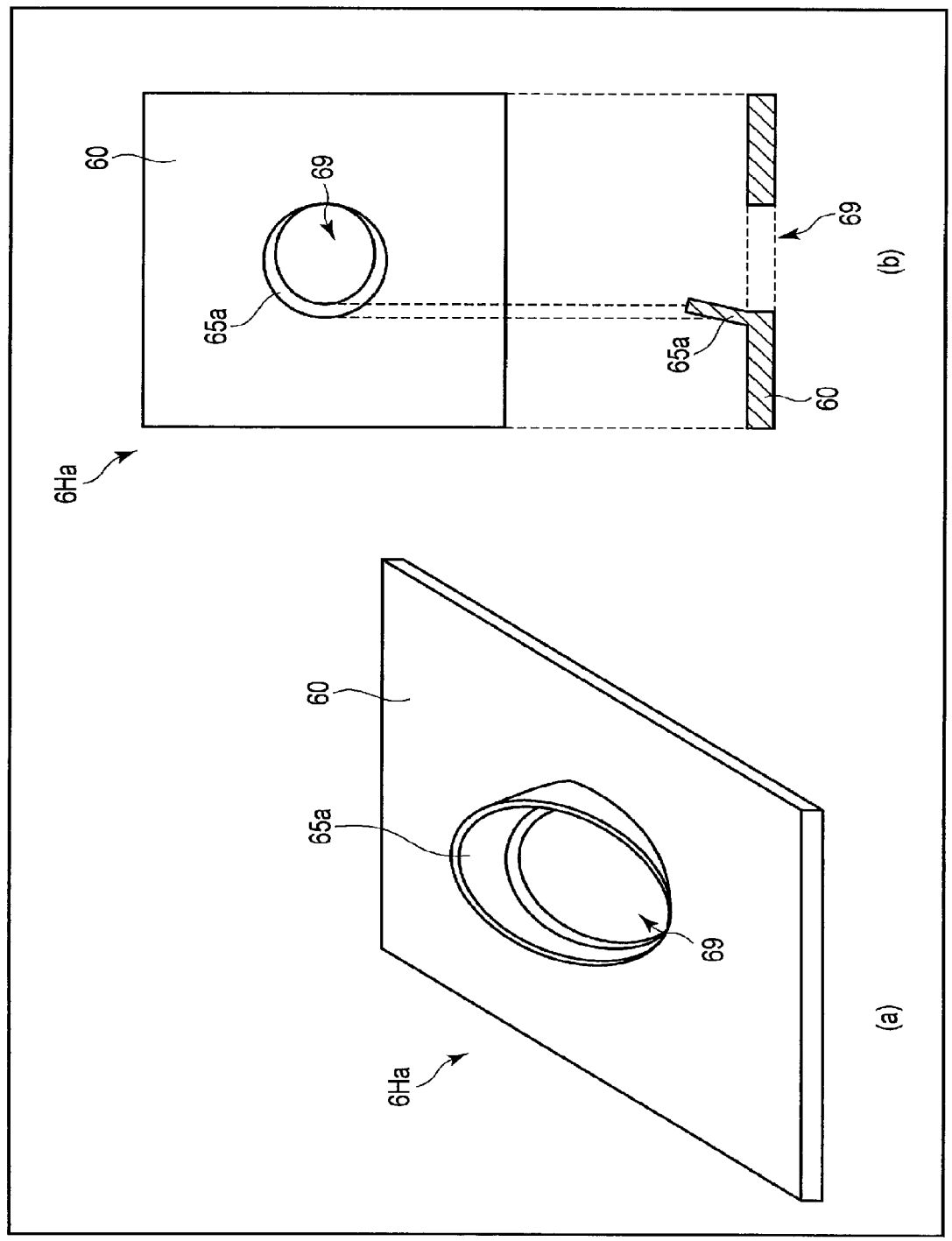
F I G. 34

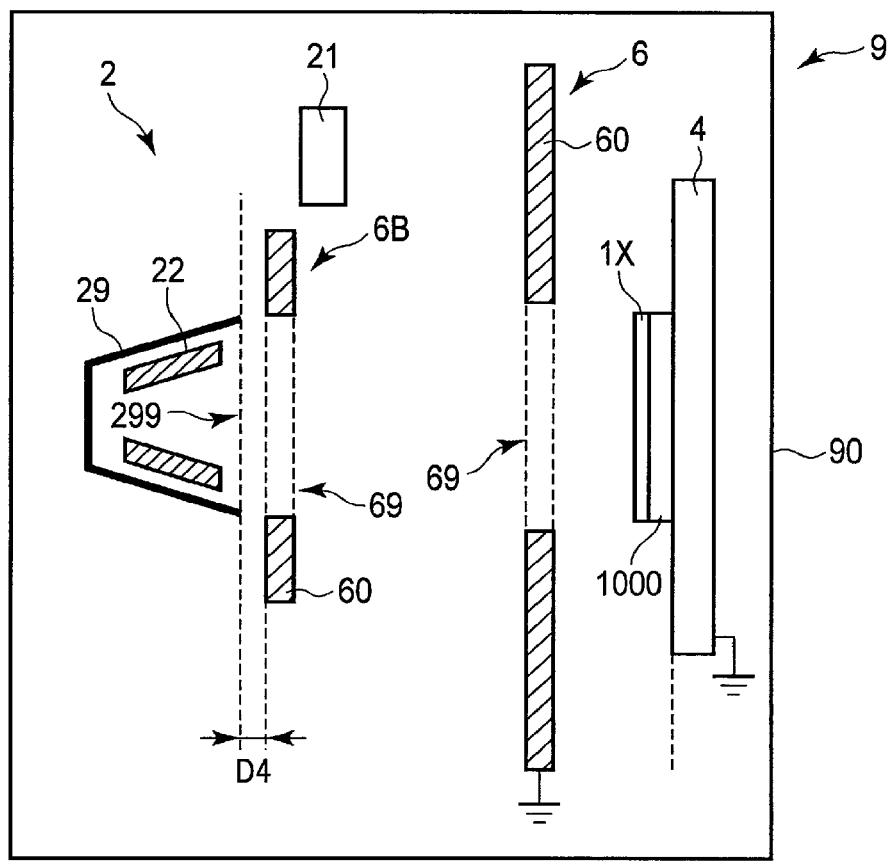
F I G. 36

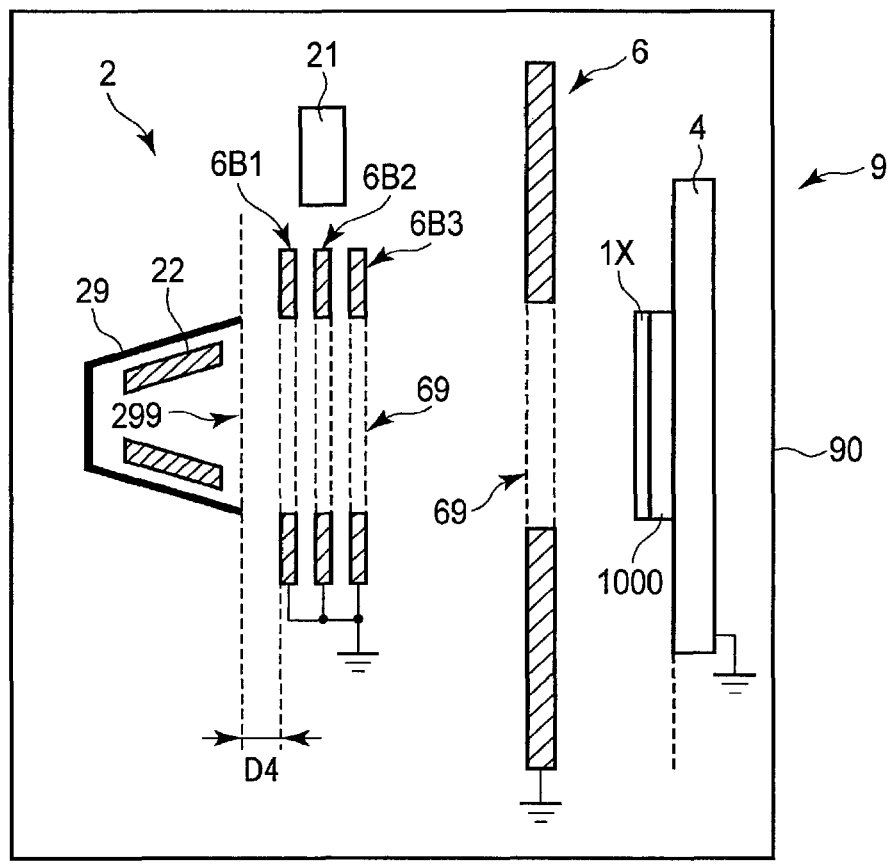
F I G. 37

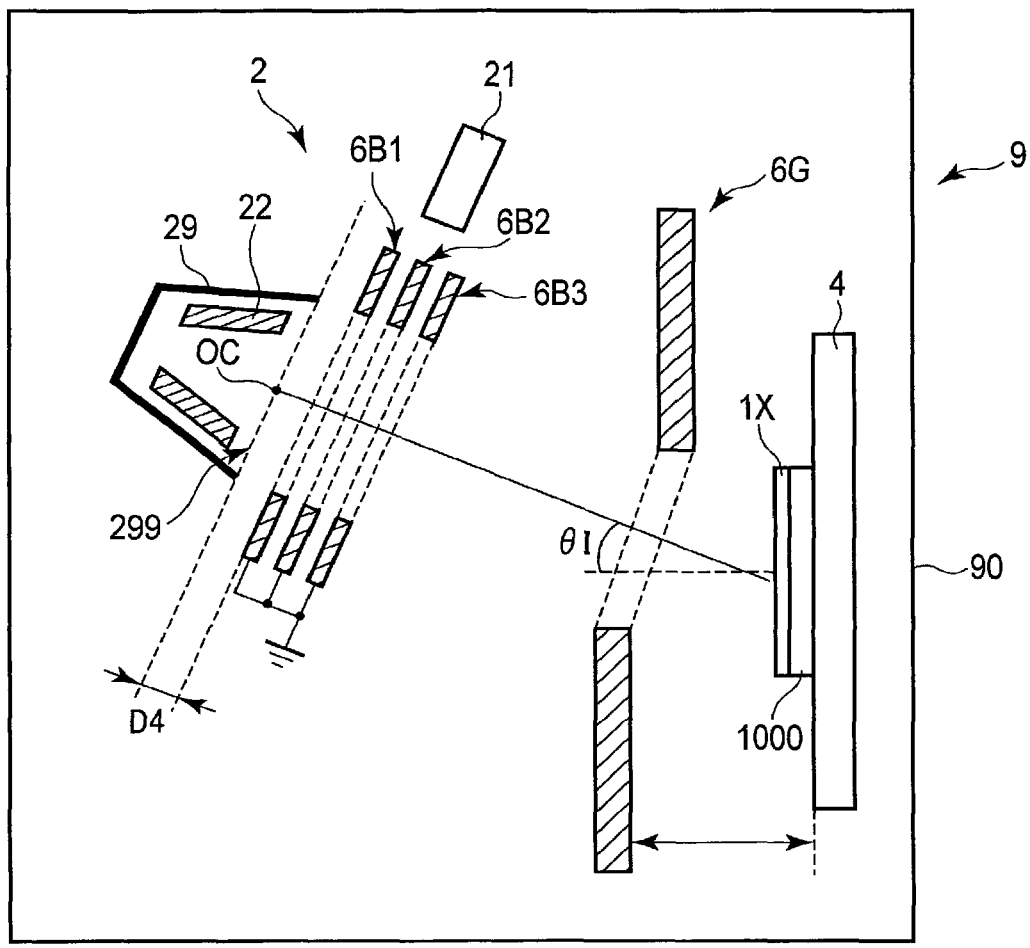
F I G. 39

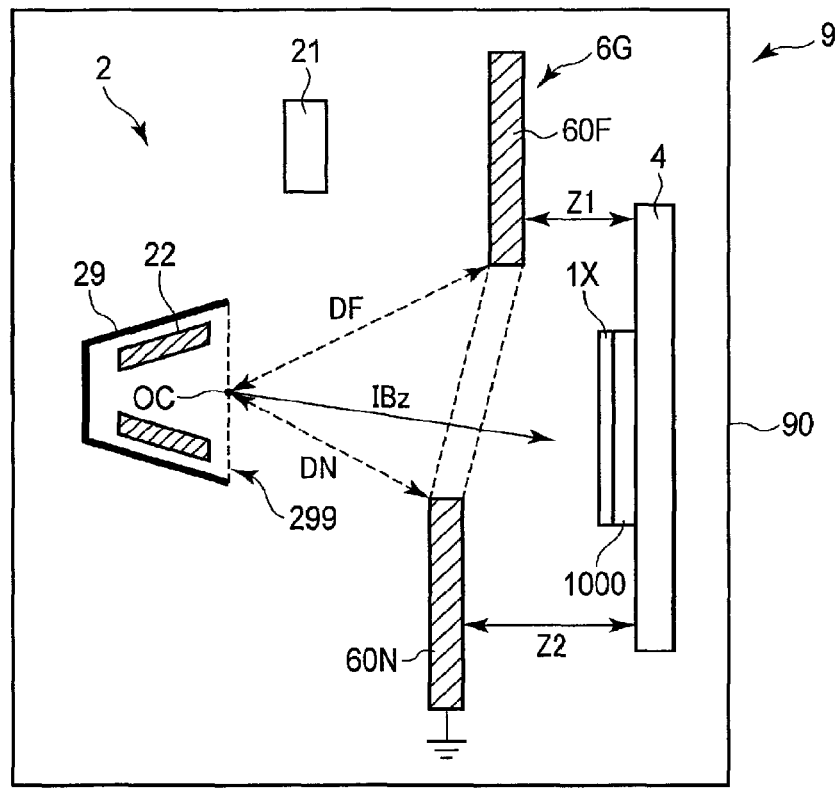
F I G. 40
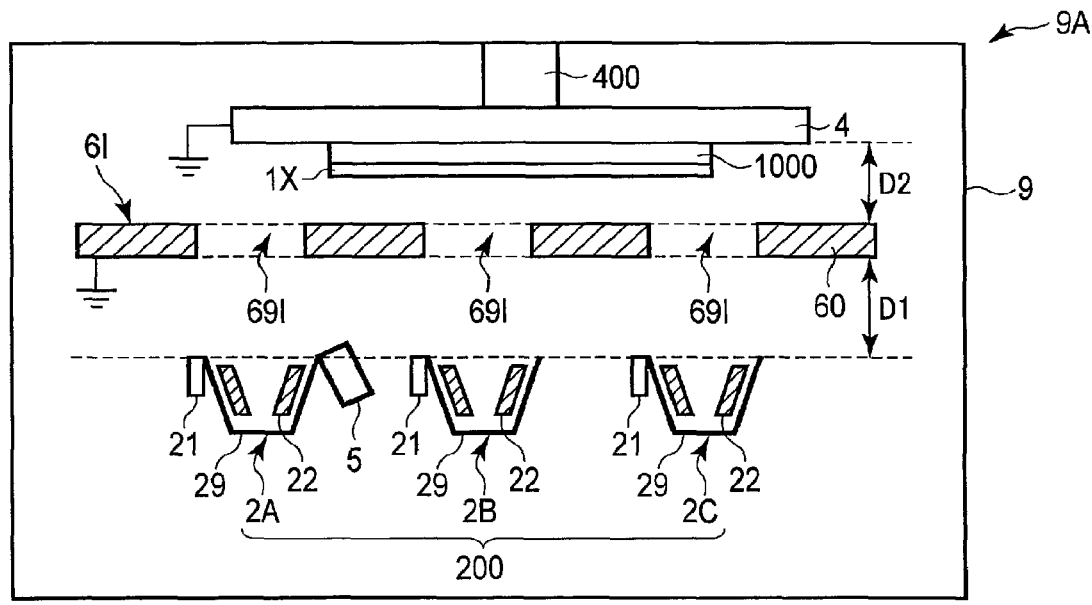
F I G. 41

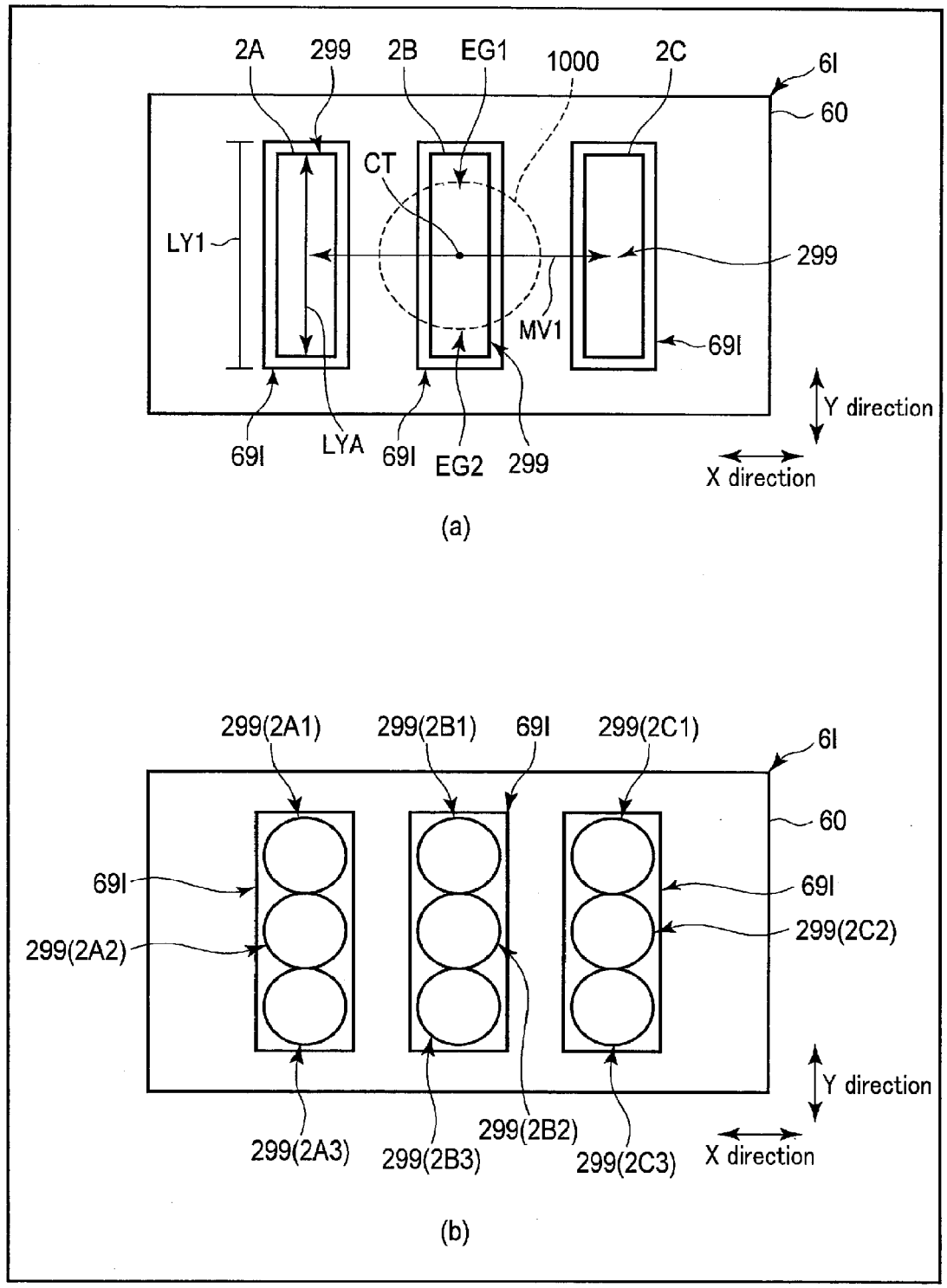
F I G. 42

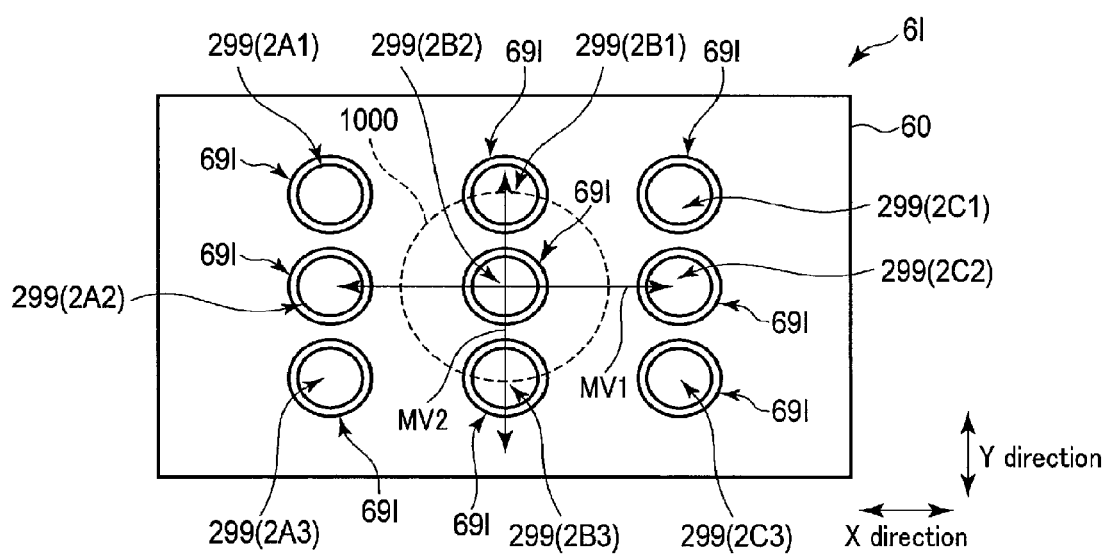
F I G. 43

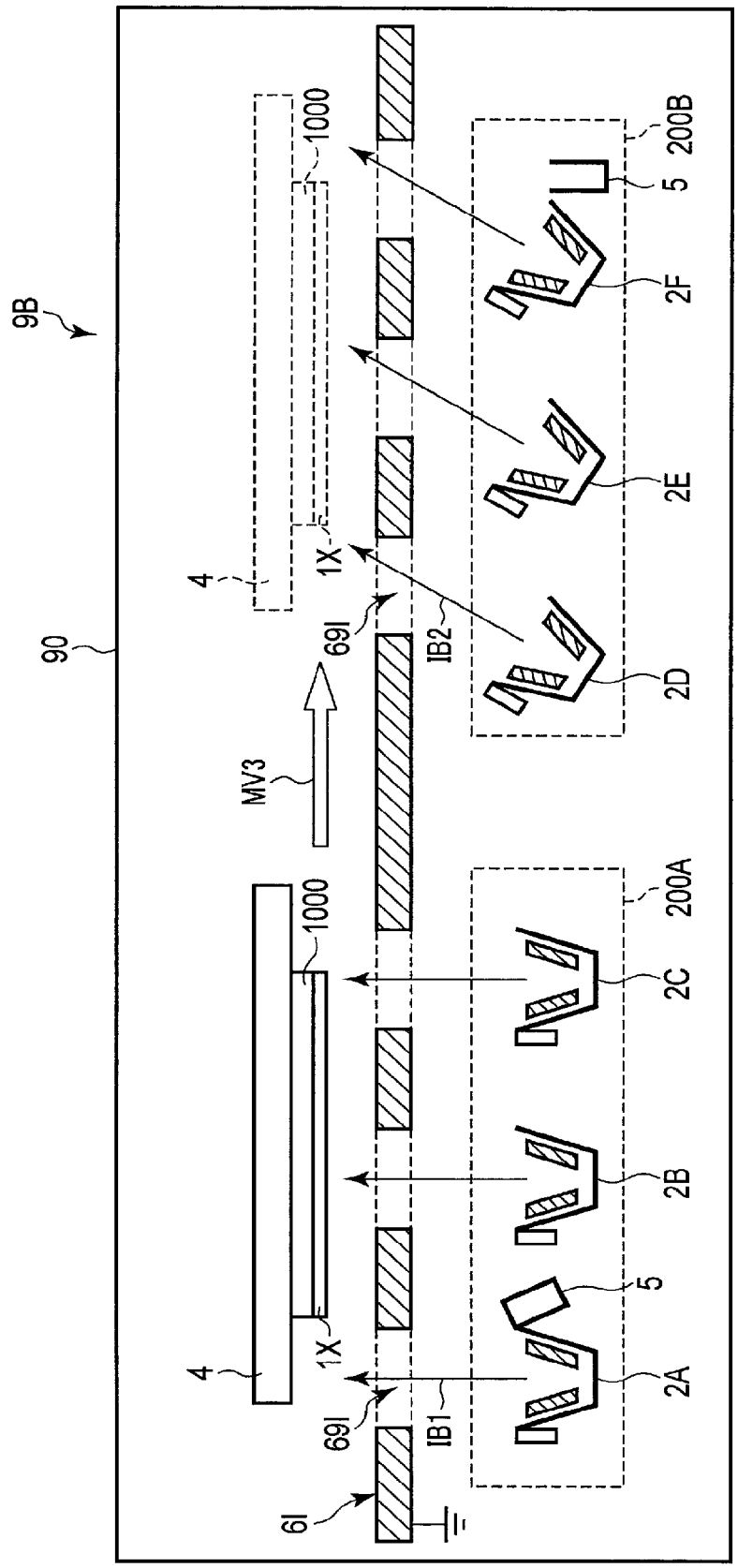
F I G. 44

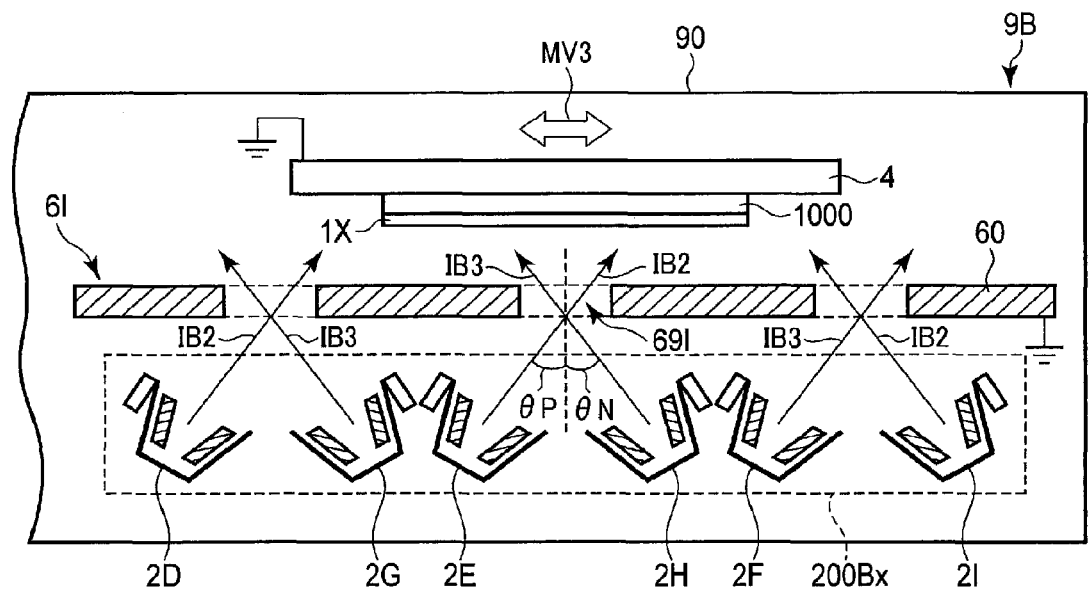
F I G. 45
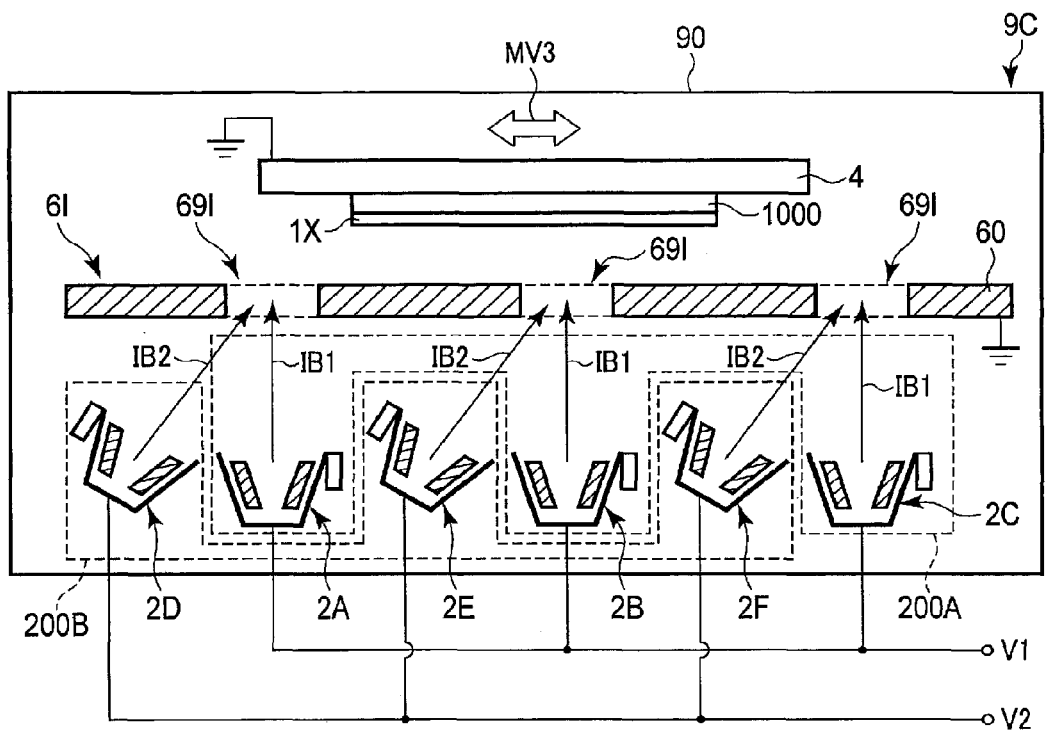
F I G. 46

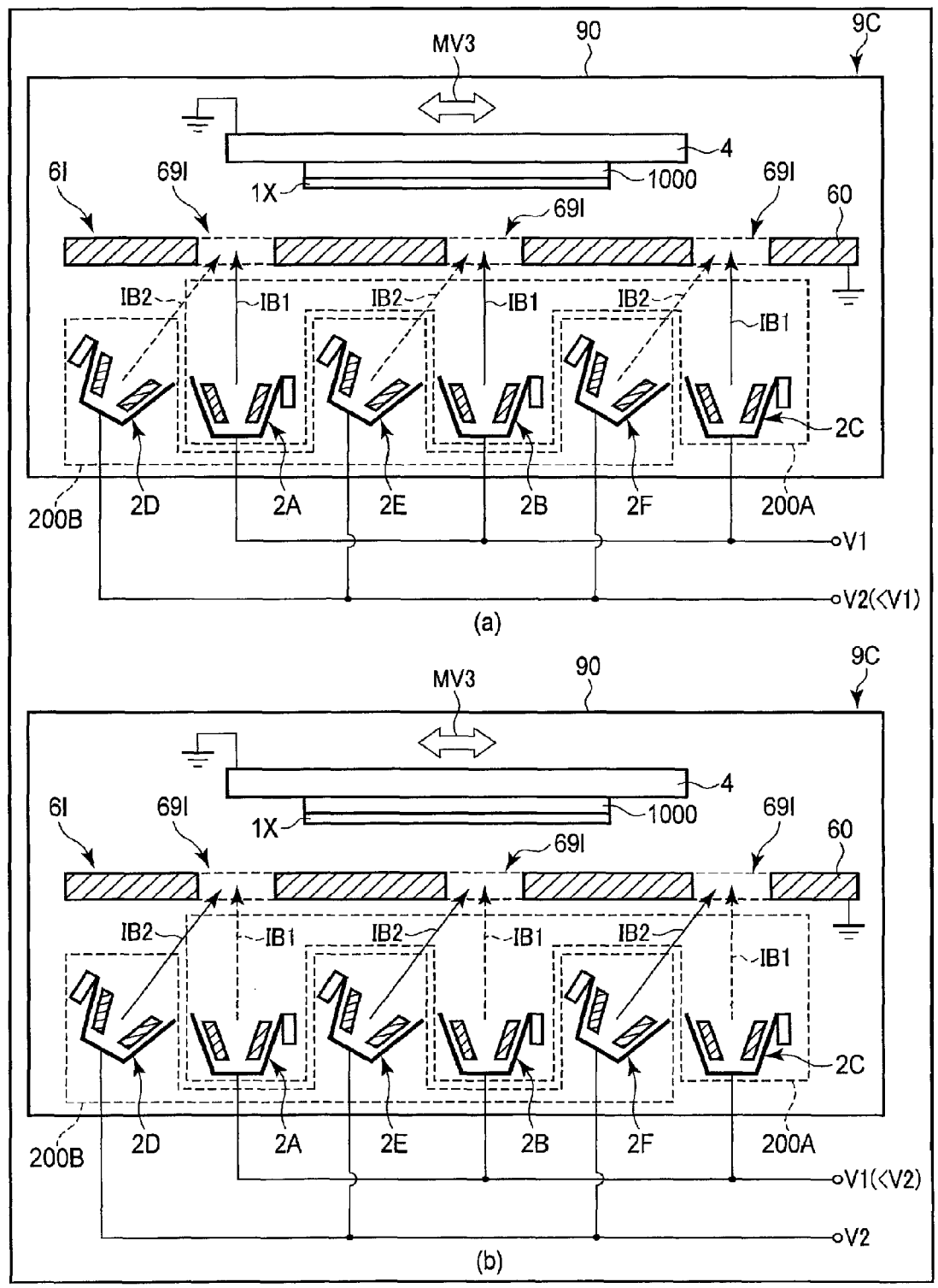
F I G. 47

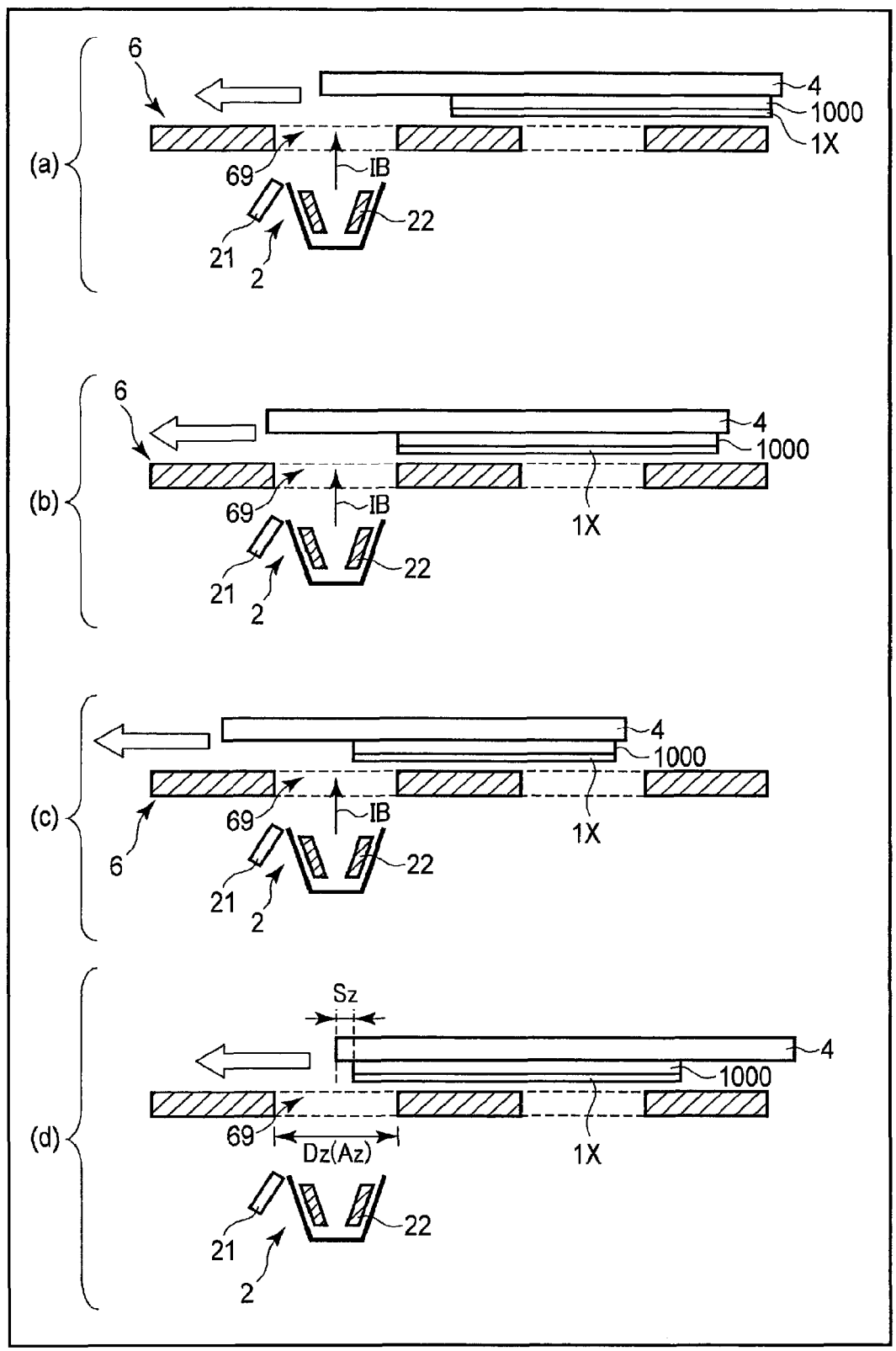
F I G. 49

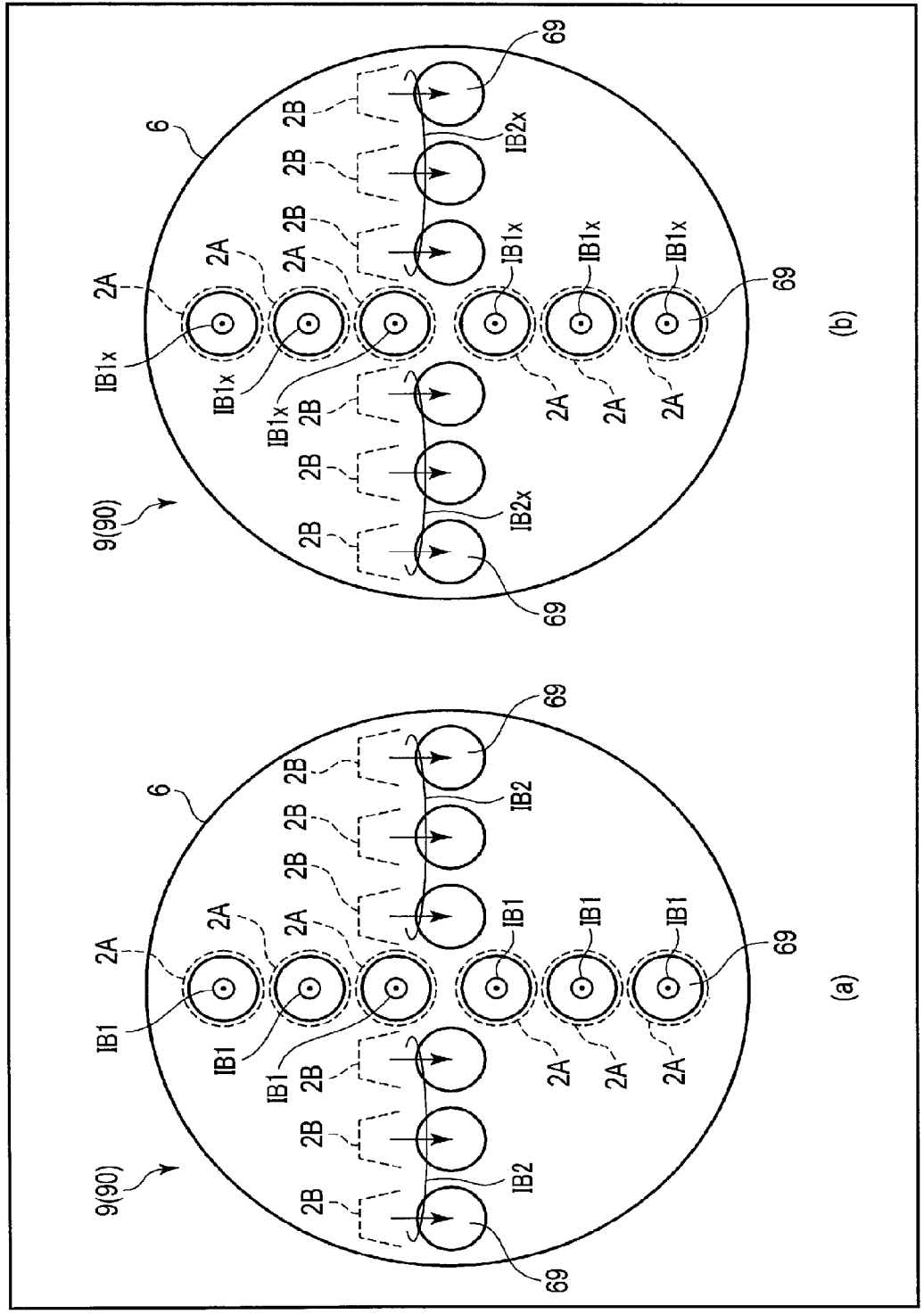
F I G. 53

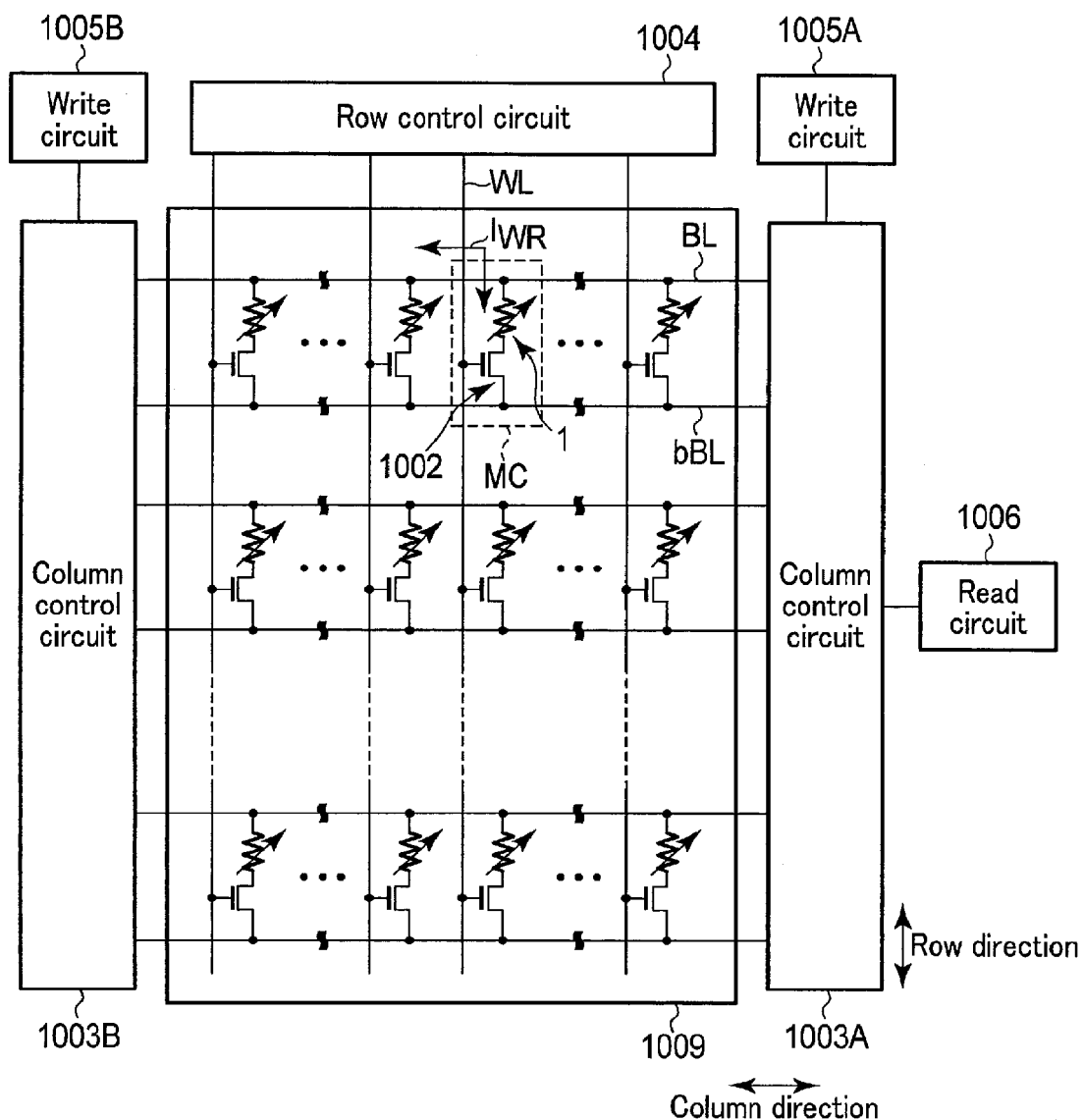
F I G. 54

DEVICE MANUFACTURING APPARATUS AND MANUFACTURING METHOD OF MAGNETIC DEVICE USING STRUCTURE TO PASS ION BEAM

CROSS-REFERENCE TO RELATED APPLICATIONS

This application is a Continuation Application of PCT Application No. PCT/JP2015/052752, filed Jan. 30, 2015 and based upon and claiming the benefit of priority from Japanese Patent Application No. 2014-017905, filed Jan. 31, 2014, the entire contents of all of which are incorporated herein by reference.

FIELD

Embodiments described herein relate generally to a device manufacturing apparatus and a manufacturing method of a magnetic device.

BACKGROUND

Memory devices using magnetism such as a hard disk drive (HDD) and a magnetoresistive RAM (MRAM) have been developed.

As a technology applied to MRAM, "spin transfer switching" that reverses the direction of magnetization of a magnetic substance by passing a current through the magnetic substance is studied as a mode of writing data to MRAM. The spin transfer switching is a technology that reverses the direction of magnetization of a magnetic substance (magnetic layer) in a magnetoresistive effect element by passing a write current into the magnetoresistive effect element and using spin-polarized electrons generated inside the magnetoresistive effect element.

A magnetization state inside a nano-scale magnetic substance can be relatively easily controlled using a local magnetic field by the spin transfer switching, as described above. Further, the value of a current to reverse the magnetization can also thereby be made smaller in accordance with fineness of the magnetic substance.

Development of MRAM of high storage density is promoted by use of the spin transfer switching. Thus, the element size of the magnetoresistive effect element as a memory element being reduced to 30 nm or less is desired.

It is generally difficult to process materials containing magnetic metal such as Co and Fe used for the magnetoresistive effect element by dry etching (for example, RIE). Thus, such materials are frequently etched physically by irradiating the materials with an ion beam using an inert gas such as Ar.

BRIEF DESCRIPTION OF THE DRAWINGS

FIG. 2 is a sectional view showing an example of a structure of a magnetoresistive effect element.

FIGS. 3, 4, 5, 6 and 7 are sectional views showing processes of a manufacturing method of the magnetoresistive effect element.

FIGS. 11, 12, 13, 14 and 15 are diagrams showing characteristics of the device manufacturing apparatus according to an embodiment.

FIG. 20 is a diagram showing modifications of the shield included in the device manufacturing apparatus according to an embodiment.

FIG. 21 is a diagram showing a first configuration example of the device manufacturing apparatus according to an embodiment.

FIG. 22 is a diagram showing modifications of the shield included in the device manufacturing apparatus according to an embodiment.

FIGS. 23, 24, 25 and 26 are diagrams showing a first configuration example of the device manufacturing apparatus according to an embodiment.

FIGS. 27 and 28 are diagrams showing a second configuration example of the device manufacturing apparatus according to an embodiment.

FIGS. 29 and 30 are diagrams showing a structural example of a shield included in the device manufacturing apparatus according to an embodiment.

FIG. 31 is diagram showing a second configuration example of the device manufacturing apparatus according to an embodiment.

FIGS. 34 and 35 are diagrams showing a structural example of shield in the device manufacturing apparatus according to an embodiment.

FIGS. 36, 37, 38, 39 and 40 are diagrams showing a third configuration example of the device manufacturing apparatus according to an embodiment.

FIG. 41 is a diagram showing a first concrete example of the device manufacturing apparatus according to an embodiment.

FIGS. 42 and 43 are diagrams showing a structural example of a shield included in the first concrete example of the device manufacturing apparatus according to an embodiment.

FIG. 44 is diagram showing a second concrete example of the device manufacturing apparatus according to an embodiment.

FIG. 45 is diagram showing a modification of the second concrete example of the device manufacturing apparatus according to an embodiment.

FIG. 46 is a diagram showing a third concrete example of the device manufacturing apparatus according to an embodiment.

FIG. 47 is a diagram showing an operation example of the third concrete example of the device manufacturing apparatus according to an embodiment.

FIG. 49 is diagrams showing a fifth concrete example of the device manufacturing apparatus according to an embodiment.

FIGS. 51, 52 and 53 are diagrams showing a modification of the sixth concrete example of the device manufacturing apparatus according to an embodiment.

FIG. 54 and FIG. 55 are diagrams showing a configuration example of a magnetic memory.

DETAILED DESCRIPTION

In general, according to one embodiment, a device manufacturing apparatus includes a substrate holding portion holding a substrate to be processed; an ion source including a housing, an anode disposed in the housing, a cathode disposed outside the housing, and a first opening disposed in a portion of the housing such that the anode is exposed to a region between the anode and the substrate holding portion, the ion source configured to generate an ion beam with which the substrate is irradiated; and at least one first structure disposed between the ion source and the substrate holding portion, and having a first through hole through which the ion beam passes. The first structure includes a conductor, and an opening dimension of the first through hole is equal to or larger than an opening dimension of the first opening.

Hereinafter, some embodiments will be described in detail with reference to the drawings.

EMBODIMENTS

Device manufacturing apparatuses in embodiments will be described with reference to FIGS. 1 to 55.

(1) Basic Configuration

A device manufacturing apparatus in the present embodiment will be described using FIG. 1.

Figure 1:
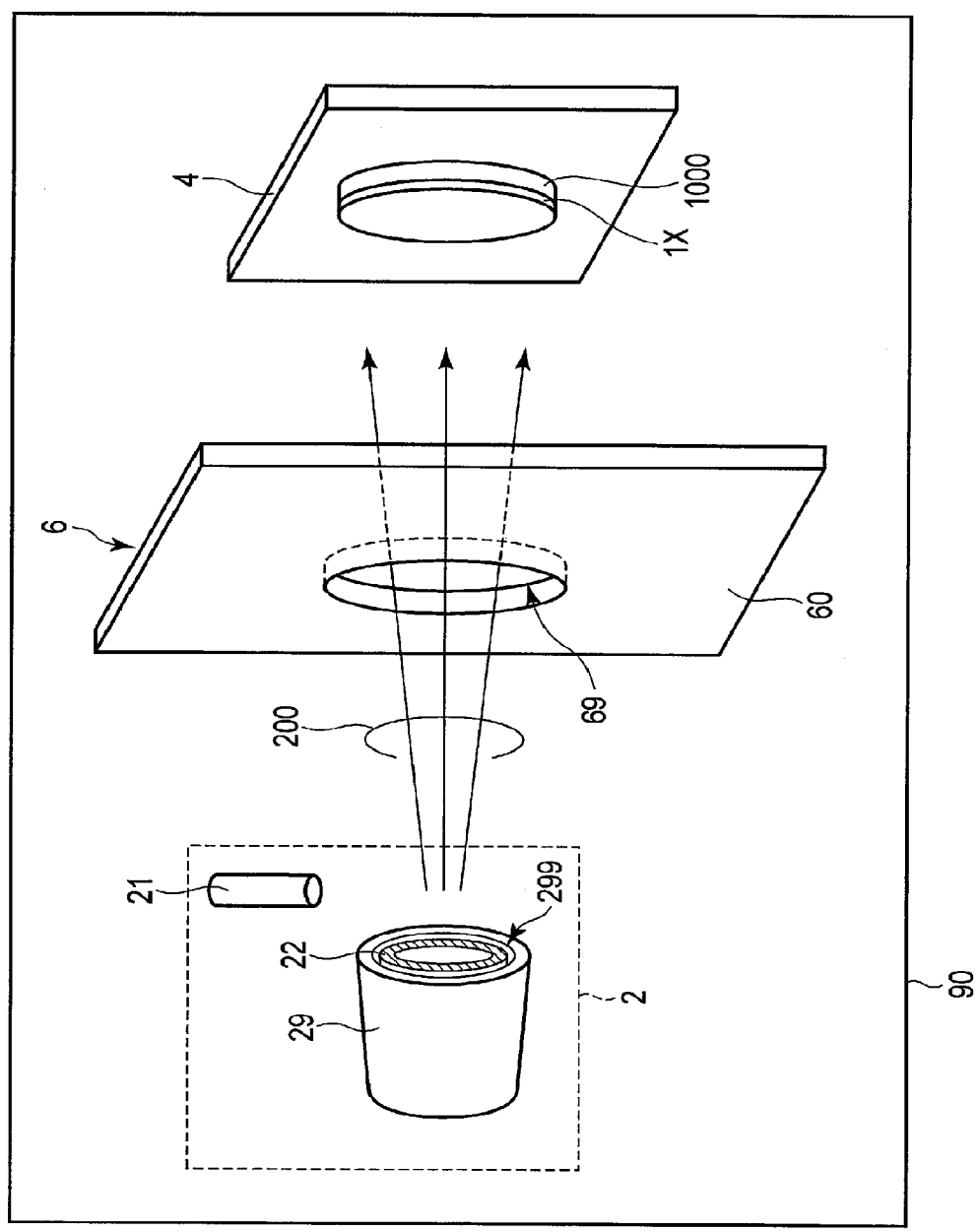
FIG. 1 is a diagram showing a basic configuration example of a device manufacturing apparatus according to an embodiment.

A device manufacturing apparatus 9 according to the present embodiment shown in FIG. 1 includes an ion source 2, a substrate holding portion 4, and at least one structure (first structure) 6 disposed between the ion source 2 and the substrate holding portion 4 inside a chamber (vacuum chamber) 90 of the apparatus 9.

The substrate holding portion 4 holds a substrate 1000 including a layer 1X to be processed (hereinafter, the layer 1X is denoted as to-be-processed layer 1X). Hereinafter, the substrate is defined as not only an object which itself is processed (for example, etched) but also an object including the other (for example, the layer) to be processed.

The ion source 2 generates an ion beam IB with which the to-be-processed layer 1X is irradiated.

The structure 6 has at least one through hole. The structure 6 is formed from a conductive material. A predetermined distance is provided between the structure 6 and the ion source 2 to separate the structure 6 from an opening 299 of the ion source 2.

The ion source 2 used for the device manufacturing apparatus in the present embodiment is an ion source having no grid (for example, an end hole type ion source). That is, the ion source 2 has no grid to physically restrict a discharge region. In the ion source 2 that does not physically restrict the discharge region, a cathode 21 as an electron supply source to generate ions is disposed outside a housing 29 of the ion source 2 and an anode 22 is disposed inside the housing 29 of the ion source 2.

The grid is a structure disposed on the opening of the housing of the ion source assumed to be in contact therewith. The grid has a plurality of through holes. For example, the grid is formed of a plurality of metallic plates in a mesh structure. In an ion source having a grid, the anode is enclosed inside the housing by the grid and the discharge region is physically restricted inside the housing. Ions are generated in the discharge region inside the housing and generated ions are extracted to the outside of the housing by the grid via through holes. The opening dimension of each through hole (diameter of the hole) in the grid is, for example, smaller than the opening dimension of the opening of the housing of the ion source on a mounting portion side of the grid (on an emission side of an ion beam). In the present embodiment, opening dimensions of a through hole and an opening show maximum dimensions (for example, the diameter of the opening) in an opening plane of the through hole and the opening.

The anode 22 of the ion source 2 can be viewed from the substrate holding portion side via the opening 290 disposed in the housing 29 such that almost an entire surface of the housing 29 opposed to the substrate is open. In an etching apparatus according to the present embodiment, a region between the ion source 2 and the structure 6 (region extending from the anode 22 of the ion source 2 to the outside of the housing 29) becomes a discharge region to generate ions/an ion beam. The anode 22 of the ion source 2 is exposed to the discharge region outside the housing 29 of the ion source 2.

When the ion source has a grid, both the cathode and the anode are disposed inside the housing of the ion source and the discharge region is restricted to inside the housing of the ion source. The grid has a plurality of through holes to extract ions from inside the housing to the outside. A potential (positive or negative potential) to extract ions inside the housing to the outside of the housing is applied to the grid.

In the present embodiment, the cathode 21 is handled as a structural element of the ion source 2, but the cathode 21 may also be handled as a structural element separate from the ion source 2.

The ion beam IB passes through a through hole 69 from the side of the ion source to the side of the substrate holding portion (to-be-processed layer) before reaching the substrate 1000. The to-be-processed layer 1X on the substrate 1000 is processed (etched) by the ion beam IB having reached the substrate 1000 by passing through the through hole 69. A component of the ion beam TB whose dispersion from an ion emission center axis of the ion source 2 is large is blocked from reaching the substrate 1000 by a portion (hereinafter, called a plate portion) 60 in which the through hole 69 is not disposed inside the structure 6 without passing through the through hole 69. The ion beam emission center axis of the ion source is an axis passing through the center of a surface of the opening 299 in a direction perpendicular to the surface (ion beam emission surface) of the opening 299 through which an ion beam of the ion source 2 is emitted.

Hereinafter, the structure 6 disposed between the ion source 2 and the substrate holding portion 4 and having the through hole 69 through which the ion beam IB passes and the portion 60 blocking the ion beam IB from reaching the substrate will be called the shield 6.

The device manufacturing apparatus 9 according to the present embodiment may further include other components such as an end point detector.

The device manufacturing apparatus 9 according to the present embodiment is the etching apparatus 9 that etches the to-be-processed layer 1X using the ion beam IB generated by the ion source 2.

The etching apparatus 9 as a device manufacturing apparatus in the present embodiment is used, for example, to manufacture magnetic devices. By the etching apparatus 9 according to the present embodiment, for example, magnetoresistive effect elements and devices (for example, MRAMs) using magnetoresistive effect elements are formed.

A basic structure of the magnetoresistive effect element will be described using FIG. 2.

FIG. 2 shows a cross section structure of a magnetoresistive effect element 1 formed by a device manufacturing apparatus (ion beam etching apparatus) according to the present embodiment.

The magnetoresistive effect element 1 has a laminated structure including an underlayer 17 containing a lower electrode, an upper electrode 13, two magnetic layers 10, 11 disposed between the upper electrode 13 and the underlayer 17, and a nonmagnetic layer (tunnel barrier layer) 12 disposed between the two magnetic layers 10, 11.

A magnetic tunnel junction is formed from the two magnetic layers 10, 11 and the tunnel barrier layer 12 sandwiched therebetween. Hereinafter, the magnetoresistive effect element will also be called an MTJ element.

The arrow in each of the magnetic layers 10, 11 in FIG. 2 shows the direction of magnetization of each of the magnetic layers 10, 11.

The direction of magnetization of the magnetic layer 10, one of the two magnetic layers, is variable and the direction of magnetization the other magnetic layer 11 is fixed (invariable). The magnetic layer 10 whose direction of magnetization is variable is called a storage layer (or a recording layer or magnetization free layer) and the magnetic layer 11 whose direction of magnetization is fixed is called a reference layer (or a fixed layer or invariable magnetization layer).

When a magnetization reversing current flowing in a direction perpendicular to a film surface of the magnetic layer 10 (lamination direction of the magnetic layer) is supplied to the storage layer 10, the direction of magnetization (or the spin) of the storage layer 10 is reversed by an angular momentum of spin-polarized electrons generated by the current being transferred to the magnetization (spin) of the storage layer 10. That is, the direction of magnetization of the storage layer 10 is variable in accordance with the direction in which a current flows.

In contrast, the direction of magnetization of the reference layer 11 is fixed and invariable. That the direction of magnetization of the reference layer 11 is "fixed" or "invariable" means that when the magnetization reversing current to reverse the direction of magnetization of the storage layer 10 flows through the reference layer 11, the direction of magnetization of the reference layer 11 does not change.

Thus, in the magnetoresistive effect element 1, the magnetic layer in which the magnetization reversing current is large is used as a reference layer and the magnetic layer whose magnetization reversing current is smaller than that of the reference layer 11 is used as the storage layer 10. Accordingly, the magnetoresistive effect element 1 including the storage layer 10 in which the direction of magnetization is variable and the reference layer 11 in which the direction of magnetization is invariable is formed.

When magnetization reversal of the magnetic layer is caused by spin-polarized electrons, the magnitude of the magnetization reversing current (magnetization reversal threshold) thereof is proportional to an attenuation constant, an isotropic magnetic field, and the volume of the magnetic layer. Thus, by adjusting these values appropriately, a difference can be created between the magnetization reversing current of the storage layer 10 and the magnetization reversing current of the reference layer 11.

When the magnetization reversing current of the storage layer 10 is supplied to the magnetoresistive effect element (MTJ element), the direction of magnetization of the magnetic layer 10 changes in accordance with the direction in which a current flows and a relative magnetization array of the storage layer 10 and the reference layer 11 changes. Accordingly, the magnetoresistive effect element 1 is in one of a high-resistance state (state in which the magnetization array is anti-parallel) and a low-resistance state (state in which the magnetization array is parallel).

As shown in FIG. 2, the storage layer 10 and the reference layer 11 have magnetic anisotropy in a direction perpendicular to the film surface of each of the magnetic layers 10, 11 (or the lamination direction of the magnetic layer). An easy magnetization direction of the storage layer 10 and the reference layer 11 is a direction perpendicular to the film surface of the magnetic layer. In the easy magnetization direction (magnetic anisotropy) of the direction perpendicular to the film surface, magnetization in the direction perpendicular to the film surface is called perpendicular magnetization.

The magnetoresistive effect element 1 according to the present embodiment is a magnetoresistive effect element of perpendicular magnetization type in which magnetization of the storage layer 10 and that of the reference layer 11 are in a direction perpendicular to the film surface.

The easy magnetization direction is a direction in which, when a ferromagnetic substance of a certain macro size is assumed, internal energy of the magnetic substance is the lowest if spontaneous magnetization is in the direction in the absence of an external magnetic field. A difficult magnetization direction is, by contrast, a direction in which, when a ferromagnetic substance of a certain macro size is assumed, internal energy of the magnetic substance is the highest if spontaneous magnetization is in the direction in the absence of an external magnetic field.

A ferromagnetic material such as FePd, FePt, CoPd, and CoPt or a soft magnetic material such as a Co—Fe based alloy and a Co—Fe based alloy to which boron (B) is added is used as the material of the storage layer 10. The storage layer 10 may also be an artificial lattice formed from a magnetic material (for example, NiFe, Fe, Co or the like) and a nonmagnetic material (Cu, Pd, Pt or the like).

For example, a ferromagnetic material having an $L1_0$ structure or an $L1_1$ structure such as FePd, FePt, CoPd, and CoPt, a soft magnetic material such as CoFeB, or a ferrimagnetic material such as TbCoFe is used as the material of the reference layer 11. Alternatively, like the storage layer 10, an artificial lattice may be used for the reference layer 11.

An insulating material such as magnesium oxide (MgO), magnesium nitride (MgN), aluminum oxide ($Al_2O_3$), aluminum nitride, or a laminated film including at least one of the above materials is used for the tunnel barrier layer 12. In addition, boron may be added to the film of the above materials.

The MTJ element 1 according to the present embodiment is a top pin type MTJ element. That is, the storage layer 10 is disposed on the underlayer (lower electrode) 17 and the reference layer 11 is stacked above the storage layer 10 via the tunnel barrier layer 12.

The underlayer 17 is disposed on an insulating film 80 on the substrate. The underlayer 17 crystal-orients the magnetic layer (here, the storage layer) 10.

For example, the underlayer 17 is a layer serving as a lower electrode of the magnetoresistive effect element and also as a leader line. The underlayer 17 includes a thick metal film as a lower electrode and a buffer layer to grow a flat magnetic layer of perpendicular magnetization. However, the underlayer and the lower electrode may be formed as separate films to form a laminated film or the underlayer and the lower electrode may be formed as one film to separately form a leader line.

The underlayer 17 has, as an example, a laminated structure including a metal layer of tantalum (Ta), copper (Cu), ruthenium (Ru), iridium (Ir) or the like.

The upper electrode 13 is disposed on the reference layer 11. The upper electrode 13 functions also as a hard mask to form a magnetoresistive effect element. For example, Ta is used for the upper electrode 13.

A sidewall insulating film 18 is disposed on the side face of the MTJ element 1. The MTJ element 1 is covered with insulating films 81, 82 via the sidewall insulating film 18.

To bring a magnetic field (shift magnetic field) from the reference layer 11 to the storage layer 10 close to zero, a magnetic film (called a shift correction layer or bias magnetic layer) to reduce the amount of magnetization of the reference layer 11 may be disposed next to the reference layer 11. The magnetization of the shift correction layer is fixed and the direction of magnetization of the shift correction layer is set to the opposite direction of magnetization of the reference layer 11.

For example, the magnetoresistive effect element 1 in FIG. 2 is used as a memory element of a magnetic memory (for example, MRAM). An MRAM has at least one memory cell. When an MRAM has a plurality of memory cells, the plurality of memory cells are arranged in a matrix form inside a memory cell array. The memory cell includes at least one magnetoresistive effect element (MTJ element) as a memory element. For example, "1" data and "0" data are allocated to a high-resistance state and a low-resistance state of the MTJ element respectively.

When, for example, the insulating film 80 is the interlayer insulating film 80, the interlayer insulating film 80 covers an element (for example, a MOS transistor) on the semiconductor substrate. A contact plug 85 connected to the lower electrode (underlayer) 17 is disposed in the interlayer insulating film 80. An interconnect (for example, a bit line) 83 is disposed on insulating films (for example, interlayer insulating films) 81, 82 and the upper electrode 13 of the MTJ element 1.

The contact plug 85 is formed from tungsten (W) and molybdenum (Mo). The interconnect 83 is formed from a film having aluminum (Al) or copper (Cu) as main components.

The manufacturing method of magnetoresistive effect elements using a device manufacturing apparatus according to an embodiment will be described with reference to FIGS. 3 to 7. FIGS. 3 to 7 are cross-sectional process drawings showing each process of the manufacturing method of magnetoresistive effect elements according to an embodiment. Here, the manufacturing method of magnetoresistive effect elements according to the present embodiment will be described using, in addition to FIGS. 3 to 7, FIGS. 1 and 2 when appropriate.

As shown in FIG. 3, a conductive layer (underlayer) 17X, a magnetic layer (here, a storage layer) 10X, the tunnel barrier layer 12X, a magnetic layer (here, a reference layer) 11X, and the hard mask (conductive layer) 13X are sequentially stacked on the insulating film 80 by, for example, a sputtering process. A laminated structure 1X to form a magnetoresistive effect element (MTJ element) is formed on the insulating film 80.

The underlayer 17X is a layer to grow the perpendicular magnetization film (storage layer) 10X having a flat film surface and is formed using Ta, Cu, Ru, Ir or the like.

For example, a ferromagnetic material having the $L1_0$ structure or the $L1_1$ structure, a soft magnetic material (for example, CoFeB), a ferrimagnetic material (for example, TbCoFe), an artificial lattice or the like is used as the material of the storage layer 10X and the reference layer 11X.

For example, magnesium oxide (MgO) is used as the material of a tunnel barrier layer 12X. For example, tantalum (Ta) is used for a hard mask 13X.

Incidentally, an interface layer including a CoFeB film may be inserted between the tunnel barrier layer 12X and the magnetic layers 10X, 11X. A shift control layer to cancel out a leaked magnetic field from the reference layer may be formed inside the laminated structure 1X. In addition, the underlayer 17X may include the shift correction layer.

When the insulating film 80 on the substrate is an interlayer insulating film, the underlayer 17X of the laminated structure 1X is formed on the interlayer insulating film 80 so as to be connected to a contact plug (not shown) in the interlayer insulating film as the insulating film 80. The insulating film 80 may be an insulating substrate.

Next, etching of the laminated structure 1X is performed using lithography and etching to form a plurality of MTJ elements that are independent of each other. More specifically, MTJ elements are formed from a laminated structure as described below.

A mask (not shown) made of a resist film is formed on the hard mask 13X. The formed resist mask has been patterned by using, for example, RIE or ion milling (ion beam processing) so as to correspond to a predetermined element shape (planar shape) and a predetermined element size.

As shown in FIG. 4, the pattern of the resist mask is transferred to the hard mask 13. For example, processing of the resist mask and the hard mask is performed by an ion beam of high directivity.

As shown in FIG. 5, the patterned hard mask 13 is used as a mask to process (etch) the reference layer 11, the tunnel barrier layer 12, and the storage layer 10 in order from the hard mask side using the ion beam IB generated by the etching apparatus (for example, the apparatus in FIG. 1) 9 according to the present embodiment. The ion beam IB with which the laminated structure (MTJ elements) is irradiated is generated by the ion source 2 and the shield 6 in the ion beam etching apparatus 9 according to the present embodiment so as to have a relatively large incident dispersion angle (solid angle), for example, an incident dispersion angle of about 5° to 10°.

The incident dispersion angle (solid angle) of an ion beam corresponds to variations in directivity (straightness) of the ion beam and the incident dispersion angle of the ion beam shows the magnitude of dispersion of the incident angle of the ion beam with respect to a to-be-processed layer (here, the laminated structure). The incident dispersion angle of an ion beam corresponds to an angle relative to a preset incident angle (0°) of the ion beam. An ion beam having an incident dispersion angle is irradiated over an entire substrate on which the laminated structure is formed and thus, the magnitude of the solid angle of the ion beam may be regarded, for example, as the magnitude of the incident angle in the center of the substrate.

The ion beam IB passes through the through hole 69 inside the shield 6 before the laminated structure 1X as a to-be-processed layer being irradiated therewith. For example, the directivity of the ion beam IB with which the laminated structure 1X is irradiated to process the magnetic layers 10, 11 is lower than the directivity of an ion beam used to process a resist mask (or a hard mask). A component included in the ion beam TB and having an excessive incident dispersion angle is blocked from entering the to-be-processed layer 1X by a portion (conductor portion) other than a through hole of the shield 6.

As shown in FIG. 6, a thin insulating film (sidewall insulating film) 18X is stacked on the surface of the processed laminated structure 1 including the underlayer 17, the storage layer 10, the tunnel barrier layer 12, the reference layer 11, and the hard mask (upper electrode) 13.

For example, the sidewall insulating film 18X covering the laminated structure is desirably dense and conformal silicon nitride (SiN) or aluminum oxide formed by the ALD (Atomic Layer Deposition) method. With a conformal film formed on the laminated structure as described above, no gap is formed between the processed laminated structure (MTJ element) 1 and the insulating film 18X. After the insulating film 18X is formed, for example, an interlayer insulating film 81 made of silicon oxide ($SiO_2$) or SiN is stacked on the insulating film 80 by, for example, the chemical vapor deposition method like covering the laminated structure 1.

When a plurality of MTJ elements are formed on the insulating film 80, for example, a mask (not shown) made of a photoresist is formed on the top surface of the interlayer insulating film 81 to electrically isolate the plurality of laminated structures 1 adjacent to each other. Then, the resist mask is used to pattern the interlayer insulating film 81, the insulating film 18X, and the underlayer 17X by using anisotropic etching (for example, RIE) and the underlayer 17X is divided into each MTJ element. Accordingly, laminated structures (MTJ elements) independent of each other are formed on the insulating film 80 on the substrate.

Then, as shown in FIG. 7, an interlayer insulating film 82 is stacked on the interlayer insulating film 81 and the sidewall insulating film 18 by, for example, the chemical vapor deposition method so as to cover the processed laminated structure 1.

Planarization of the interlayer insulating film layer 82 is performed by CMP. The interlayer insulating film 82, the interlayer insulating film 81, and the insulating film 18 are removed from above the hard mask (upper electrode) 13 by CMP so that the top surface of the hard mask 13 in the MTJ element 1 is exposed.

As shown in FIG. 2, the interconnect 83 is formed on the MTJ element 1 and the interlayer insulating films 81, 82 so as to be electrically connected to the upper electrode 13.

In this manner, a magnetoresistive effect element or a magnetic device (for example, MRAM) including a plurality of magnetoresistive effect elements can be formed.

In the present embodiment, as described above, the ion beam etching apparatus 9 to form magnetoresistive effect elements is provided with the shield 6 having the through hole 69 between the ion source (for example, an end hole type ion source) 2 having no grid and the substrate holder 4 on which a to-be-processed layer (laminated structure including a magnetic layer) is mounted.

The shield 6 inhibits a component (ion) of an excessive incident dispersion angle in the ion beam from reaching the substrate and also converges the ion beam into the through hole 69 of the shield 6.

Accordingly, etching of a to-be-processed layer can be accelerated and also variations of etching of the to-be-processed layer can be inhibited in an ion beam etching apparatus using a gridless ion source.

By forming magnetoresistive effect elements using a device manufacturing apparatus according to the present embodiment as described above, defects of magnetoresistive effect elements can be inhibited from arising and element characteristics of magnetoresistive effect elements can be improved.

(2) Structure and Characteristics of a Device Manufacturing Apparatus

The structure and characteristics of a device manufacturing apparatus according to the present embodiment will be described with reference to FIGS. 8 to 15.

Figure 8:
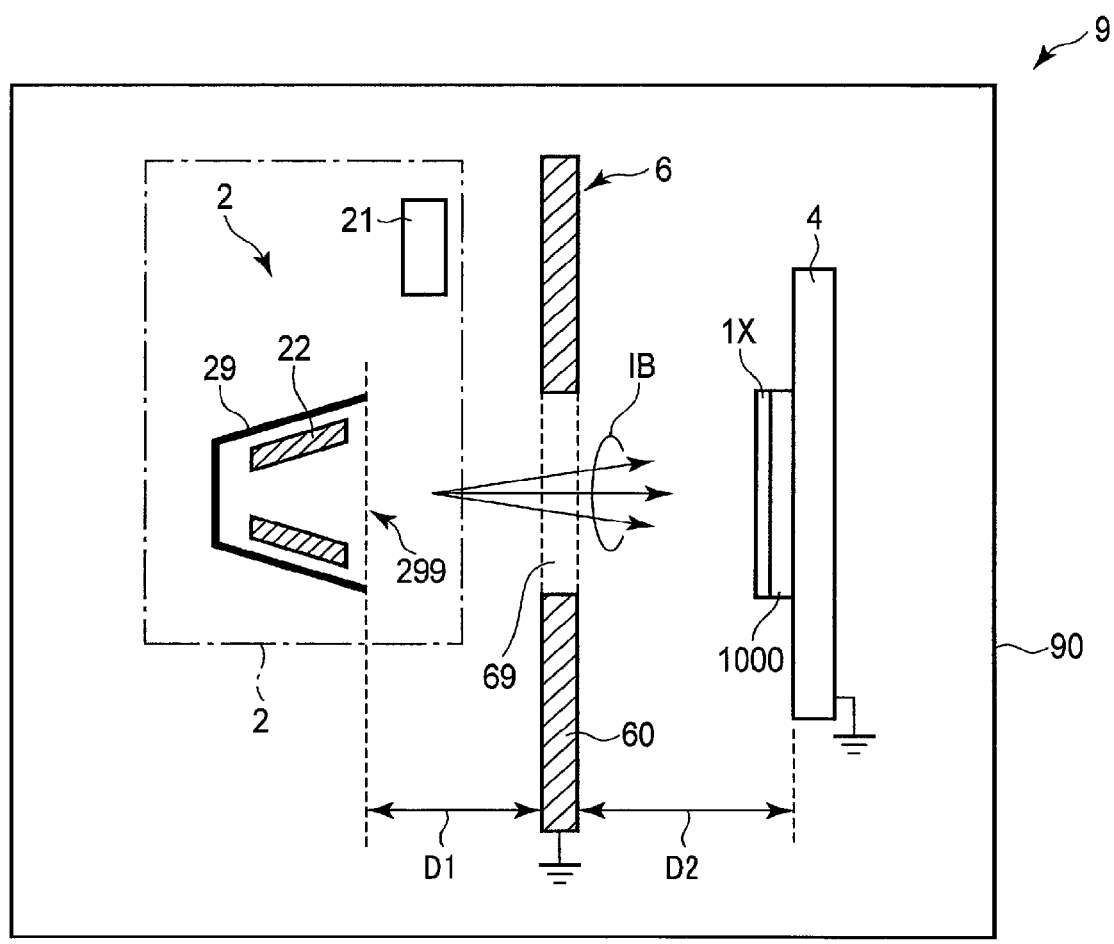
FIG. 8 is a diagram showing a configuration example of the device manufacturing apparatus according to an embodiment.

FIG. 8 is a schematic diagram illustrating the structure of an etching apparatus as a device manufacturing apparatus according to the present embodiment.

As shown in FIG. 8, the etching apparatus (ion beam etching apparatus) according to the present embodiment includes the ion source 2 having no grid, the substrate holding portion 4 holding the substrate 1000 including the to-be-processed layer 1X, and the conductive structure (shield) 6 having a through hole inside the housing (vacuum chamber) 90. The housing 90 is connected to a vacuum pump (not shown) and the inside of the housing 90 is made a high vacuum state while the etching apparatus is driven.

In the present embodiment, the ion source 2 having no grid like an end hole type ion source is used to generate ions and an ion beam for processing of a laminated structure to form a magnetoresistive effect element. In the ion source 2 having no grid, a cathode (electron supply source) is disposed outside the housing 29 including the anode 22. The anode 22 is exposed to a region outside the housing 29, and the cathode 21 and the substrate holding portion 4 outside the housing 29, via the opening (ion beam emission port) 299 of the housing.

The structure of an ion source included in an etching apparatus according to the present embodiment will be described using FIG. 9.

Figure 9:
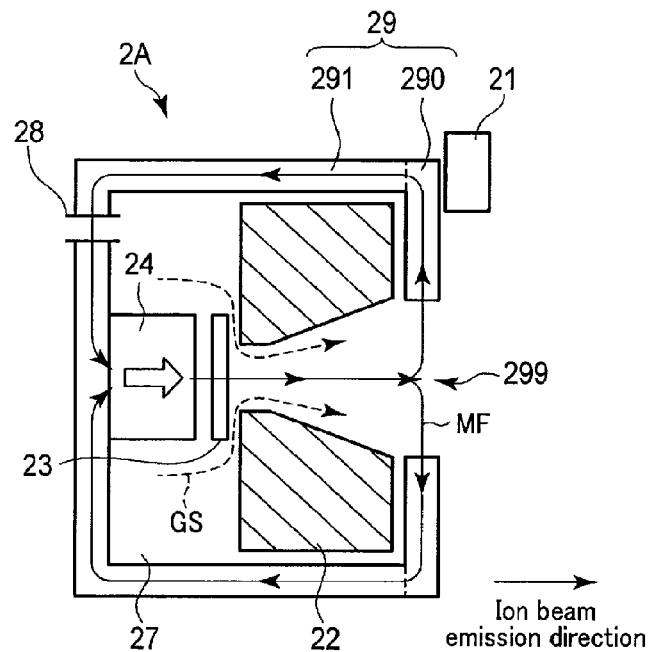
FIG. 9 is a diagram showing a configuration example of an ion source.

FIG. 9 is a schematic sectional view showing a structure example of the ion source according to the present embodiment.

The ion source used for the etching apparatus according to the present embodiment is, for example, an end hole type ion source.

The end hole type ion source 2 includes the anode 22 and the cathode 21 functioning as an ion generator and an ion irradiator.

In the end hole type ion source 2, for example, a hollow cathode type electron supply source is used for the cathode 21.

In the end hole type ion source 2, the anode 22 has a truncated conical shape. The anode 22 in the truncated conical shape has an opening on one end side through which a gas passes and an opening on the other end side to allow an ion beam to be emitted. A through hole from the ion beam emission port (ion discharge port) 299 toward a supply port of a gas is formed inside the anode 22. The dimension of the opening 299 on the side allowing an ion beam to be emitted is larger than that of the opening through which a gas passes and the inner wall of the anode 22 is inclined. A potential from a power supply (not shown) is applied to the anode 22.

The end hole type ion source 2 has, for example, the housing 29 in a tubular shape. A region surrounded by the inner wall of the anode 22 (for example, a hollow region in a truncated conical shape) becomes a discharge region inside the ion source 2 and the anode 22 substantially functions as a plasma generation container inside the ion source 2. For example, to efficiently generate plasma (ions), the inside of the housing 29 of the ion source 2 is maintained in a vacuum state by a vacuum pump (not shown).

A gas (a monomer gas such as Ar or Xe, a polymer gas, or a gas cluster) GS supplied from a gas introduction hole 28 into a gas pressure chamber 27 is supplied from the gas pressure chamber 27 to the discharge region on the anode 22 side via a gas distributor 23. The discharge of the gas GS is started by electrons supplied from the cathode 21. The gas GS supplied to the discharge region of the anode 22 (for example, the center region of the anode 22) is thereby ionized and an ion beam is formed.

A magnetic substance (for example, a permanent magnet) 24 is installed near the opening to supply a gas to the discharge region of the anode 22, for example, on the opposite side of the opening of the anode 22 across the gas distributor 23. In FIG. 9, the direction of the arrow in the magnet 24 shows the direction of the magnetization of the magnet 24. A magnetic field MF is formed by the magnet 24 in the discharge region surrounded by the anode 22. Instead of the permanent magnet 24, an electromagnet may also be used.

For example, the housing 29 surrounding the anode 22 includes yokes (ferromagnetic substance) 290, 291. The yoke 290 disposed on the side of the ion beam emission port of the anode 22 has, for example, a disc planar shape. The opening 299 to be an ion beam emission port is formed in a position corresponding to the emission port of the anode 22 inside the yoke 290 in a disc shape (ring shape).

The yoke 291 in a tubular shape is disposed so as to cover the side face and the bottom of the anode 22. The gas distributor board 23 and the permanent magnet 24 are disposed, together with the anode 22, inside the yoke 291 in a tubular shape. The permanent magnet 24 is preferably disposed on the center axis of the plasma generation container in a tubular shape. The permanent magnet 24 is, for example, in contact with the yoke 291 in a tubular shape. The anode 22 and the yokes 290, 291 as a whole may be called the plasma generation container.

A magnetic flux (magnetic field) MF generated by the permanent magnet 24 returns to the permanent magnet 24 after going through the through hole of the anode 22 and the yokes 290, 291.

The magnetic field MF has a first magnetic field component (ion beam parallel component) along an emission direction of an ion beam from the ion source side toward the substrate side and a second magnetic field component (ion beam perpendicular component) in a direction perpendicular to the emission direction of the ion beam. The emission direction of an ion beam having an incident dispersion angle (solid angle) is defined as a direction obtained by averaging directions in which ions forming the ion beam are emitted. For example, the emission direction of an ion beam is approximately parallel to an extending direction of an ion bean emission center axis of the ion source.

The first magnetic field component along the emission direction of an ion beam has the strongest magnetic field strength on the center axis of the plasma generation container (anode, discharge region). The magnetic field strength of the first magnetic field component decreases in the emission direction of an ion beam from a region surrounded by the anode toward the emission port side of the ion beam.

In the distribution of the first magnetic field component along the emission direction of an ion beam, the magnetic field strength of the first magnetic field component on the emission port side of the ion beam of the ion source 2 is weaker than the magnetic field strength of the first magnetic field component in the region surrounded by the anode 22 (inside the plasma generation container).

The second magnetic field strength along a direction perpendicular to the emission direction of an ion beam (for example, a plane direction of the emission port of an ion beam or a diameter direction of the opening) has a weak magnetic field strength (for example, takes on the minimum value) on the center axis of the plasma generation container. The magnetic field strength of the second magnetic field component increases from the center of the opening of the plasma generation container to the edge side (outer circumference of the plasma generation region) along a direction perpendicular to the emission direction of an ion beam on the opening of the emission port 299 of the ion beam.

In the distribution of the second magnetic field component in a direction perpendicular to the emission direction of an ion beam, the magnetic field strength of the second magnetic field component on the edge side in a direction perpendicular to the emission direction of the ion beam of the plasma generation container is stronger than the magnetic field strength of the second magnetic field component in the center of the opening 299 of the plasma generation container (discharge region).

Electrons supplied from the cathode 21 are bent in a trajectory by a Lorentz force near the opening 299 of the anode 22 and the yoke 290. Accordingly, the moving distance of electrons from the cathode 21 to reach the anode 22 increases. With an increased moving distance of electrons, a collision cross section of electrons and a gas increases. As a result, high-density plasma is formed in a region between the anode 22 and the shield 6, particularly near the opening of the anode 22 (region between the anode 22 and the cathode 21) and inside the region surrounded by the anode.

Ions are extracted from the formed high-density plasma by the cathode (for example, a hollow cathode) 21. An ion current formed from the extracted ions is discharged from the emission port 299 of the anode 22 as an ion beam.

To form a preferable incident dispersion angle (solid angle) of an ion beam, it is desirable to decrease the gas pressure in a region through which an ion beam travels toward the substrate. With a decreased gas pressure, scattering of ions caused by collision of a gas (gas molecules) and accelerated ions can be inhibited. To decrease the gas pressure, it is desirable to increase the strength of the magnetic field MF inside the through hole (discharge region) of the anode 22.

When MTJ elements are formed by an ion beam, the substrate on which laminated structures (MTJ elements) are formed is disposed inside a vacuum chamber to which the ion source 2 is connected or inside a vacuum chamber surrounding the ion source 2.

Figure 10:
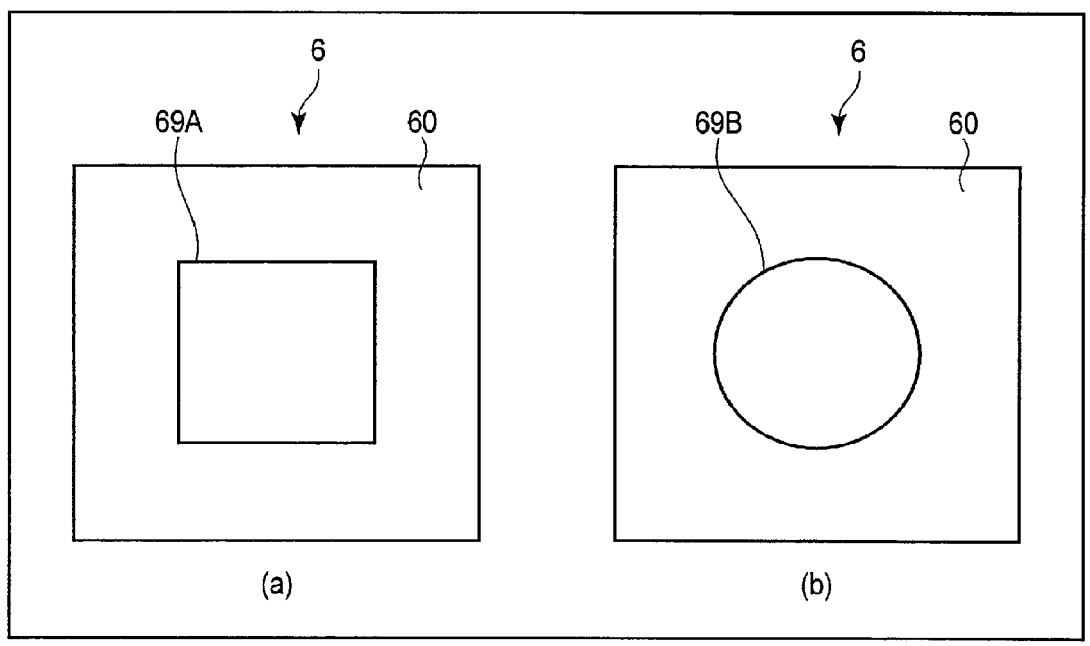
FIG. 10 is a diagram showing configuration example of a shield.

FIG. 10 is a schematic plan view showing the structure of a shield contained in an etching apparatus according to the present embodiment.

As shown in (a) and (b) of FIG. 10, the shield (structure) 6 contains, for example, a quadrangular plate portion. The shield 6 contains a conductive plate portion 60. For example, a metal (for example, stainless steel) is used for the plate portion 60.

As shown in (a) of FIG. 10, a rectangular through hole 69A through which an ion beam passes is disposed inside the conductive plate portion 60. The planar shape of a through hole 69B inside the shield 60 may be, as shown in (b) of FIG. 10, circular (or elliptic). The through hole 69 (69A, 69B) of the shield 6 may also be called an opening or a window.

The opening dimension of the through hole 69 (maximum dimension of the through hole 69 in an opening plane) of the shield 6 is preferably equal to or larger than the opening dimension of the ion beam emission port 299 (maximum dimension of the housing 29 in the opening plane) of the ion source 2.

An interval (distance) D1 is set to between the shield 6 and the ion source 2.

A predetermined potential is applied to the shield 6. For example, the shield 6 is grounded and a ground potential is applied to the shield 6. However, a positive potential or a negative potential may be applied to the shield 6 in accordance with potentials set to the substrate holding portion 4 and the ion source 2 inside the etching apparatus.

The substrate holding portion 4 holds the substrate 1000 including the to-be-processed layer 1X intended to be processed by an ion beam. The substrate holding portion 4 includes a moving mechanism (not shown) to move the substrate 1000 to a predetermined position and a drive mechanism (not shown) that performs motion of at least one of rotational motion and reciprocation (reciprocating motion) with respect to the substrate 1000.

An interval (distance) D2 is set to between the substrate holding portion 4 and the shield 6.

For example, a predetermined potential is applied to the substrate holding portion 4. For example, the substrate holding portion 4 is grounded and the ground potential is applied to the substrate holding portion 4. For example, the potential of the substrate holding portion 4 is set to the same potential as that of the shield 6.

Hereinafter, the substrate holding portion 4 is also called a substrate holder (or simply a holder) or a sample table (or simply a table).

When, for example, as shown in FIG. 8, an opening surface (ion beam emission surface) of the ion source 2 and the surface of the substrate holder 4 (and the substrate 1000) are approximately parallel, the ion beam emission direction is approximately perpendicular to the substrate surface. In addition, the surface of the shield 6 (surface of the plate portion 60) and the surface of the substrate 1000, and the surface of the shield 6 and the opening surface of the ion source 2 each maintain a mutually parallel relationship. In the description that follows, the surface of the shield 6 (plate portion 60) indicates the surface on the substrate side (surface opposed to the substrate) or the surface on the ion source side (surface opposed to the ion source). The surface of the substrate 1000 indicates the surface disposed with a to-be-processed layer.

The ion beam etching apparatus 9 according to the present embodiment is provided with the shield 6 having the through hole 69 between the ion source 2 and the substrate holder 4. The ion beam IB from the ion source 2 passes through the through hole 69 of the shield before the to-be-processed layer 1X on the substrate 1000 held by the substrate holder 4 being irradiated therewith.

With the insertion of the shield 6 between the ion source 2 and the substrate holder 4, an etching apparatus according to the present embodiment can make etching of the to-be-processed layer on the substrate faster and also improve uniformity of the etching of the to-be-processed layer.

In the generation of an ion beam by an etching apparatus according to the present embodiment, an end hole type ion source as the ion source is used and the discharge of the ion source is maintained by electrons supplied from a hollow cathode type electron supply source.

The incident dispersion angle (solid angle) of an ion beam intrinsic to the end hole type ion source is reported to be about 50°.

With the insertion of the shield 6 having the through hole 69 between the ion source 2 and the to-be-processed layer/substrate 1X, 1000, ions dispersed from the ion source 2 are converged into the through hole 69. Converged ions are collected in front of the ion source 2 (region between the ion source 2 and the shield 6).

As a result, a high-density ion current is generated in front of the ion source 2 and an etching apparatus according to the present embodiment can increase an etching rate by an ion beam of the to-be-processed layer 1X opposed to the front surface of the ion source 2.

An ion beam of an excessive incident dispersion angle (for example, a ion beam of the incident dispersion angle of 20° or more) that is not converged into the through hole 69 is blocked from reaching the substrate 1000 and the to-be-processed layer 1X by the plate portion 60 of the shield 6.

FIG. 11 shows measurement results of the etching distribution on the to-be-processed layer depending on the presence/absence of the shield between the ion source and the substrate holding portion.

The configuration of each element inside the ion beam etching apparatus used for measurement in FIG. 11 is as described below. The diameter of the ion beam emission port (ion emission port) 299 of the ion source 2 is set to 6 cm. The diameter of the through hole 69 of the shield 6 is set to 9 cm. The thickness of the shield 6 is set to 0.25 mm. The ion source-substrate distance is set to 15 cm. The ion source-shield distance D1 is set to 12 cm. The shield-substrate distance D2 is set to 3 cm.

In the description that follows, if not specifically mentioned, the diameter of the ion emission port of the ion source is assumed to be 6 cm.

In FIG. 11, the horizontal axis of the graph represents the position (unit: cm) on the substrate in a direction parallel to the substrate surface. The center of the opening (ion beam emission port) of the ion source is used as a reference point of the horizontal axis of the graph in FIG. 11 and the position (coordinate) on the substrate opposed to (directly facing) the center of the opening of the ion source is shown as a 0 (zero) position on the substrate. The position of the center of the ion beam emission port of the ion source and the position 0 on the substrate are present on the same straight line. Hereinafter, the numeric value of the horizontal axis of the graph will be described as a relative value indicating the position from the center of the opening of the ion source on the substrate.

In FIG. 11, the vertical axis of the graph represents the etching rate (arbitrary unit) of the to-be-processed layer.

As shown in the graph of FIG. 11, the etching rate of the to-be-processed layer increases with an increasing distance from the position of the center of the opening of the ion source (position zero on the substrate) when no shield is disposed between the ion source and the to-be-processed layer (substrate). In this case, the etching rate (depth of etching) decreases after reaching the peak near the position of 6 cm on the substrate from the center of the opening of the ion source.

When the shield is disposed between the ion source and the to-be-processed layer like in the present embodiment, the etching rate of the to-be-processed layer increases in a region on the substrate (region on the substrate shown by 0 to 3 cm on the horizontal axis) opposed to the ion beam emission port 299 of the ion source. Then, the etching rate of the to-be-processed layer when the shield is disposed drops to almost 0 (zero) in the position of about 6 cm on the substrate with respect to the center of the opening of the ion source.

When, as shown in FIG. 11, no shield is disposed between the ion source and the substrate (to-be-processed layer), a wide region of the to-be-processed layer on the substrate is etched.

On the other hand, when the shield is disposed between the ion source and the substrate (to-be-processed layer), the effect of the shield shown below is indicated from measurement results shown in FIG. 11. That is, when the shield is disposed between the ion source and the substrate (to-be-processed layer), an ion beam is physically cut off by the shield and also the ion beam that should be broadened is converged into the through hole 69 of the shield 6.

FIG. 12 is a diagram showing the relationship between the etching rate of the to-be-processed layer and the distance between the shield and the substrate.

In FIG. 12, the distribution of normalized etching rate of the to-be-processed layer when the distance between the sheet and substrate is changed is shown. In FIG. 12, the distance between the ion source and shield is set to 10.5 cm.

In FIG. 12, the horizontal axis of the graph represents, like in FIG. 11, the position (unit: cm) on the substrate relative to the position of the center of the opening of the ion source. In FIG. 12, the vertical axis of the graph represents the normalized etching rate (arbitrary unit) of the to-be-processed layer. In FIG. 12, the normalized etching rate of the to-be-processed layer when the distance between the shield and substrate is set to each of 5 mm, 20 mm, 33 mm, 60 mm, and 90 mm is shown.

In FIG. 12, a region in which the etching rate of the to-be-processed layer is approximately constant (region in which the normalized etching rate is about 1) is present and thus, according to an etching apparatus in the present embodiment, it can be seen that a highly uniform etching of the to-be-processed layer can be obtained.

This shows that etching generated by an ion beam of an etching apparatus according to the present embodiment can be etching in which the to-be-processed layer is uniform due to an electric field interaction between the shield and substrate disposed inside the etching apparatus according to the present embodiment and an electric field interaction between the shield and the anode of the ion source.

FIG. 13 is a diagram showing the relationship between the shield-substrate distance and the etching rate of the to-be-processed layer.

In FIG. 13, the horizontal axis of the graph represents the distance (unit: cm) between the shield and substrate. The vertical axis of the graph represents the etching rate (unit: nm/min) of the to-be-processed layer in a region in which the normalized etching rate is 1 in FIG. 12. The to-be-processed layer used for the experiment in FIG. 13 is silicon (Si).

As shown in measurement results in FIG. 13, the etching rate of the to-be-processed layer in the region in which uniform etching rate is obtained increases with a decreasing distance between the shield and substrate.

It is evident from measurement results in FIGS. 11 to 13 that with the insertion of the shield between the ion source and the substrate (substrate holding portion) including the to-be-processed layer, it becomes possible to improve uniformity of processing (etching) inside the to-be-processed layer and also control the processing rate (etching rate).

Figure 14:
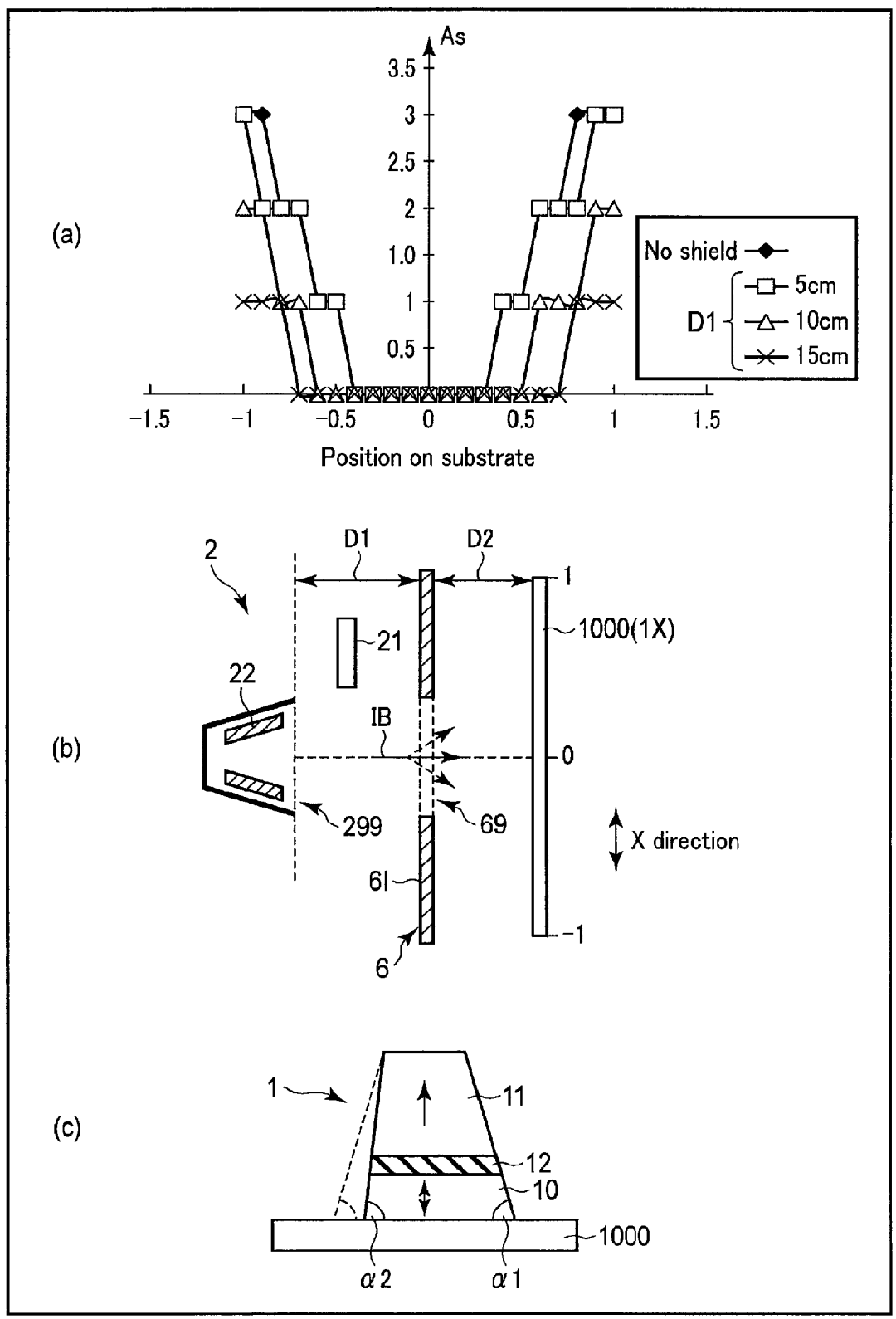

FIGS. 14 and 15 are diagrams illustrating the relationship between characteristics of an MTJ element and the shield-substrate distance.

(a) of FIG. 14 shows the relationship between the position of the MTJ element on the substrate and the magnitude of nonuniformity of a taper angle of the MTJ element.

Experimental results in (a) of FIG. 14 are obtained from measurement results of the cross section of the MTJ element formed by ion beam etching performed by the etching apparatus shown in (b) of FIG. 14.

(b) of FIG. 14 shows a configuration example of the etching apparatus. Etching to form an MTJ element having a fine dot pattern is performed by the etching apparatus in (b) of FIG. 14. As shown in (b) of FIG. 14, the shield 6 having a through hole is disposed at the distance D1 from the end hole type ion source 2. The substrate (to-be-processed layer) 1000 held by the substrate holding portion is installed at the distance D2 from the installation position of the shield 6. The distance from the ion source 2 to the substrate 1000 is set to 20 cm.

In the example shown in (b) of FIG. 14, the substrate 1000 is reciprocated (scanned) in a direction parallel to the substrate surface (surface of the shield 6 on the substrate side) while the end hole type ion source 2 is discharged such that the etching rate (etching depth) of the MTJ element becomes approximately uniform. In (b) of FIG. 14, the moving direction of the substrate 1000 during etching is denoted as an X direction. An MTJ element whose diameter is about 20 nm is formed by the etching apparatus configured as described above. In the MTJ element formed here, a Co/Pt multilayer film is used for the reference layer and a CoFeB film of perpendicular magnetization is used for the storage layer.

(c) of FIG. 14 schematically shows a cross sectional shape of the MTJ element along a direction perpendicular to the substrate surface. The absolute value of a difference between a taper angle $\alpha 1$ at one end near the storage layer in a cross section on the same straight line of the MTJ element and a taper angle $\alpha 2$ at the other end is denoted as an index "As" indicating taper asymmetry. If the cross sectional shape of the MTJ element is approximately symmetric, the taper angle $\alpha 1$ and the taper angle $\alpha 2$ have almost the same magnitude and the taper asymmetry As becomes 0°. If the cross sectional shape of the MTJ element is asymmetric, the taper angle $\alpha 1$ and the taper angle $\alpha 2$ have different magnitudes and the taper asymmetry As shows a value (absolute value) larger than 0° in accordance with the degree of asymmetry of the shape of the MTJ element.

The graph in (a) of FIG. 14 shows position dependence of the taper asymmetry As of the MTJ element on the substrate. The horizontal axis of the graph in (a) of FIG. 14 shows the position of the MTJ element on the substrate 1000. The center of the substrate 1000 is indicated by "0" of the horizontal axis of the graph and an end of the substrate 1000 is indicated by "1". The vertical axis of the graph in (a) of FIG. 14 represents the magnitude (unit: °) of the taper asymmetry As of the MTJ element. In (a) of FIG. 14, for comparison of experimental results, the taper asymmetry As of an MTJ element formed using an etching apparatus in which no shield is disposed is shown.

If the shield 6 is not disposed between the ion source 2 and the substrate 1000, the asymmetry As of the taper angle of the MTJ element starts to appear near a position (position indicated by 0.5) between the center and the end of the substrate 1000. A difference of about 3° arises between the position of the MTJ element on the substrate 1000 near 0.7 and the end of the substrate 1000 as the asymmetry As of the taper angle of the MTJ element when no shield is disposed.

As shown in (a) of FIG. 14, the taper asymmetry As of the MTJ element is improved by the shield 6 being disposed between the substrate 1000 and the ion source 2.

If the interval D1 between the ion source 2 and the shield 6 is 5 cm, the asymmetry As of the taper angle of the MTJ element is improved to 2° in the position near 0.7 on the substrate.

The asymmetry As of the taper angle of the MTJ element is improved by the shield 6 being arranged near the substrate 1000 with the further increased interval D1 between the ion source 2 and the shield 6. If the interval D1 between the ion source 2 and the shield 6 is 10 cm (in this case, the interval D2 between the substrate 1000 and the shield 6 is equal to the interval D1=10 cm), the asymmetry As of the taper angle of the MTJ element is significantly improved when compared with a case when the shield 6 is not disposed.

If the interval D1 between the ion source 2 and the shield 6 is 15 cm (if the interval D2 between the substrate 1000 and the shield 6 is 5 cm), the taper angle $\alpha 1$ of the side face on one side of the MTJ element 1 is approximately equal to the taper angle $\alpha 2$ of the side face on the other side of the MTJ element. Thus, asymmetry of the taper shape of the MTJ element 1 is eliminated.

The asymmetry of the taper angles $\alpha 1$, $\alpha 2$ of the side faces of the MTJ element 1 affects nonuniformity of a leaking magnetic field applied from the reference layer to the storage layer. For example, with increasing asymmetry (nonuniformity) of the cross sectional shape of some MTJ element, a coercive force Hc of the storage layer of the MTJ element decreases.

FIG. 15 is a diagram illustrating the relationship between characteristics of an MTJ element and the shield-substrate distance. Here, (b) and (c) of FIG. 14 are also referred to when appropriate.

FIG. 15 is a graph showing the dependence of the coercive force Hc of the reference layer inside an MTJ element on the shield-substrate distance. In FIG. 15, the horizontal axis of the graph represents the position on the substrate 1000 and the vertical axis of the graph represents the coercive force Hc of the reference layer of the MTJ element. In FIG. 15, the coercive forces of the reference layer of the MTJ element when the interval between the shield 6 and the substrate 1000 is set to 5 cm, 10 cm, and 15 cm are shown. Also in FIG. 15, for comparison of experimental results, the coercive force of the storage layer of an MTJ element formed by using an ion beam etching apparatus in which no shield is disposed is also shown.

When no shield is disposed between the ion source 2 and the substrate 1000, as shown in FIG. 15, a decrease of the coercive force Hc of the storage layer of the MTJ element occurs near the position on the substrate indicated by 0.7.

On the other hand, a decrease and variations of coercive forces of the storage layer of a plurality of MTJ elements inside the substrate are improved by, like in the present embodiment, the shield 6 being disposed between the ion source 2 and the substrate 1000. If, for example, the interval D1 between the ion source 2 and the shield 6 is 5 cm, improvements of the coercive force of the storage layer are observed in an MTJ element present at the position on the substrate indicated by 0.7.

Further, if the interval D1 between the ion source 2 and the shield 6 is 10 cm, that is, if the shield 6 is disposed in the intermediate position between the ion source 2 and the substrate 1000, a decrease and variations of coercive forces of the storage layer of a plurality of MTJ elements inside the substrate are significantly improved.

If the interval D1 between the ion source 2 and the shield 6 is 15 cm, the coercive force Hc of the storage layer concerning a plurality of MTJ elements inside the substrate becomes approximately uniform without being dependent on the position of the MTJ element (distance from the ion source) inside the substrate as a result of elimination of the asymmetry of the cross sectional shape of the MTJ element.

Also, as in the experimental results shown in FIG. 13, the etching rate increases rapidly when the substrate-shield distance is near 20 mm or shorter. This is because, if based on calculation results of the potential/electric field between the substrate and shield, no electric field enters a region between the shield and substrate if the substrate-shield distance is around 25 mm or less. Therefore, it is more likely that only a region on the substrate opposed to the through hole of the shield will be irradiated with ions. As a result, the etching rate of the to-be-processed layer on the substrate increases. Therefore, that the substrate-shield distance is set to 25 mm or less is effective in terms of increasing the processing rate of the to-be-processed layer.

Further, from correlations with FIGS. 14 and 15, if the asymmetry As of the taper angle of the MTJ element falls to about 2 degrees or less with the insertion of the shield 6, a decrease of the coercive force Hc of the magnetic layer (storage layer) of the MTJ element is inhibited and variations of the coercive force Hc of the magnetic layer inside the substrate are improved.

From experimental results shown in FIGS. 14 and 15, it is preferable to dispose the shield 6 in the intermediate position between the ion source 2 and the substrate 1000 or on the substrate side.

To form an MTJ element having stable characteristics in the formation of a fine MTJ element of 20 nm or less, it is preferable to inhibit asymmetry of the taper angle of an MTJ element (asymmetry of the cross sectional shape of an MTJ element).

A gridless ion source (for example, an end hole type ion source) in which the cathode 21 as an electron supply source is outside the housing 29 of the ion source 2 and the anode 22 is directly visible from the substrate 1000 is used for the ion beam etching apparatus 9 in the present embodiment. When the to-be-processed layer is etched by an etching apparatus using such an ion source having an ion beam of intrinsically wide dispersion, the installation of the shield 6 between the gridless (open) ion source 2 and the substrate 1000 like in the ion beam etching apparatus 9 according to the present embodiment described above is effective in controlling variations in the taper angle of the cross sectional shape of an MTJ element.

On the other hand, when a grid type ion source is used to process semiconductor devices and electronic devices such as common magnetic heads in an ion beam etching apparatus, the influence of variations of characteristics between elements is small. Thus, the installation of metal such as a shield between the grid type ion source and substrate in the etching apparatus has no useful effect on the distribution of an ion beam and the dispersion of an ion beam.

According to the ion beam etching apparatus as a device manufacturing apparatus in the present embodiment, as described above, processing of magnetic devices can be made faster and uniformity of processing of magnetic devices can be improved.

(3) First Configuration Example of the Shield

A first configuration example of the shield included in a device manufacturing apparatus (ion beam etching apparatus) according to the present embodiment will be described with reference to FIGS. 16 to 26. While principal units of the apparatus are illustrated in diagrams below illustrating the present configuration example, the apparatus in the present configuration example may also include other components than the illustrated components.

Figure 16:
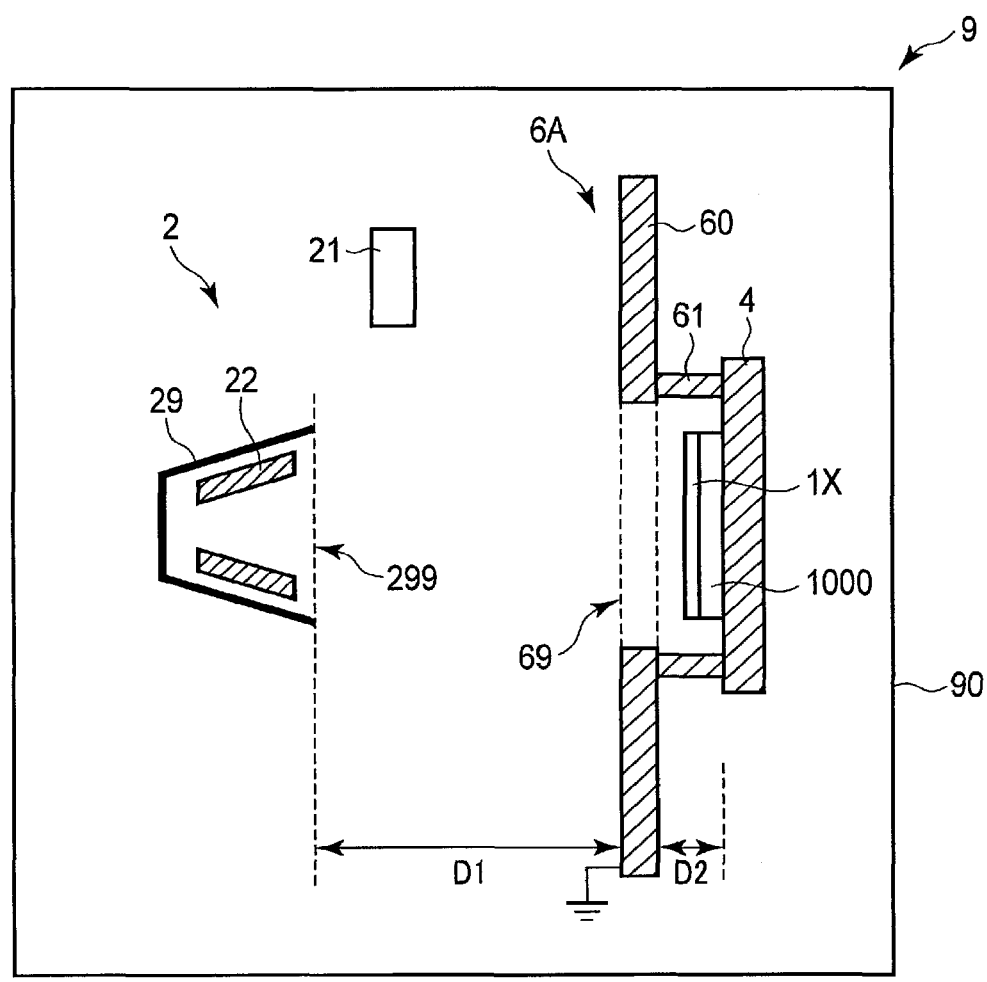
FIGS. 16, 17, 18 and FIG. 19 are diagrams showing a first configuration example of the device manufacturing apparatus according to an embodiment.

FIG. 16 is a schematic diagram showing a structure example of the shield disposed in an etching apparatus according to the present embodiment.

As shown in FIG. 16, a shield 6A is connected to the substrate holder 4. In FIG. 16, the shield 6A and the substrate holder 4 are integrated.

One open end of a conductive material (hereinafter, called a connection portion or a tubular portion) 61 in a tubular shape is connected to the plate portion 60 of the shield 6A. A cavity of the connection portion 61 in a tubular shape is connected to the through hole 69 of the shield 6. The other open end of the connection portion 61 is in contact with or joined to the substrate holder 4. The interval D2 between the plate portion 60 of the shield 6A and the substrate holder 4 is controlled by the length (extending direction of the cylinder) of the connection portion 61. Incidentally, the shield 6A may also be connected to the substrate holder 4 by a plurality of columnar connection portions.

The structure made of the shield 6A and the substrate holder 4 integrated by the connection portion 61 in a tubular shape has a cross sectional structure in an ashtray shape (or a hat shape).

If, for example, the substrate holder 4 is connected to the shield 6A by the connection portion 61, the substrate holder 4 is formed from a conductive material (for example, a metal like stainless steel). Accordingly, a common potential (for example, the ground potential) is applied to the substrate holder 4 and the shield 6A.

An ion beam dispersed excessively can be blocked from reaching the substrate by the plate portion 60 in a flat plate shape of the shield 6A and also an electric field between the ion source 2 and the substrate 1000 is adjusted so that an ion beam can be converged toward the through hole 69 of the shield 6. In addition, an ion beam can be adjusted to a uniform distribution in the cavity inside the connection portion 61 by the connection portion 61 in a tubular shape of the shield 6A.

Thus, even when a structure in which the shield 6A is connected to the substrate holder 4 is used for the etching apparatus 9, like the shield in a flat plate shape separated from the substrate holder 4 as shown in FIG. 1 or FIG. 8, high-speed and uniform etching of the to-be-processed layer (for example, a constituent member of the MTJ element) can be performed.

Figure 17:
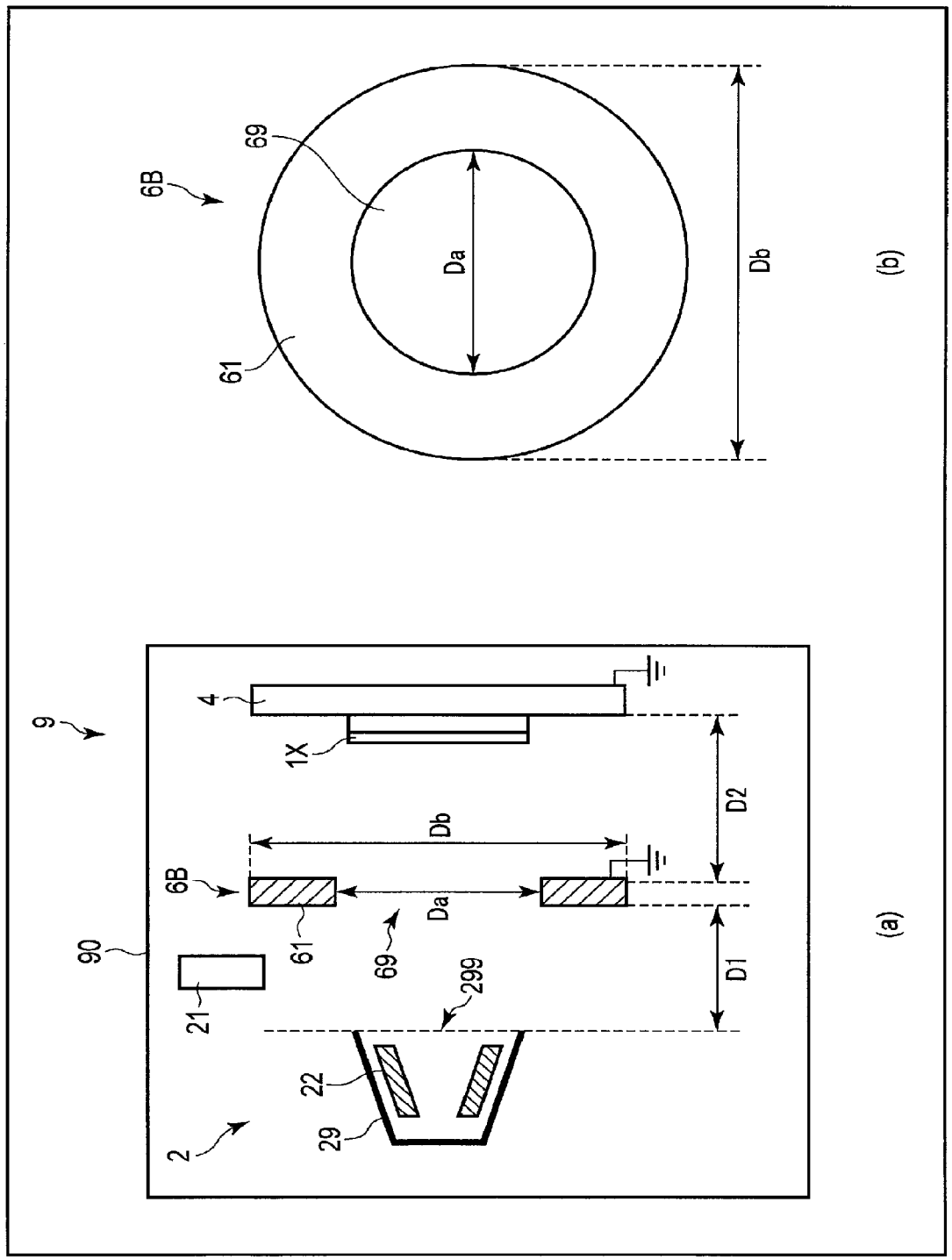

FIG. 17 is schematic diagrams showing a structure example of the shield disposed in the etching apparatus according to the present embodiment.

(a) of FIG. 17 is a schematic sectional view of the etching apparatus including the shield in the present example. (b) of FIG. 17 is a plan view schematically showing a planar structure of the shield in the present example.

In the above example, the shield has a structure in which a through hole is formed inside a flat plate.

However, as shown in FIG. 17, a shield 6B may also have a ring shape.

For example, the shield 63 in a ring shape has a thickness (or the diameter) of 0.25 mm, an inside diameter Da of 9 cm, and an outside diameter Db of 15 cm.

Even if, as shown in FIG. 17, a shield in a ring shape is disposed between the ion source 2 and the substrate holder 4, the opening dimension (inside diameter) of the through hole 69 of the shield 6B in a ring shape is preferably equal to or larger than the opening dimension of the ion beam emission port (opening of the housing) of the ion source.

Even if the shield 6B in a ring shape as described above is inserted between the ion source 2 and the substrate, almost the same effect as that of the shield of the above structure example can be obtained.

When a positive potential or a negative potential is applied to the shield between the ion source and substrate holder, the same effect as that when the shield is grounded can be obtained.

Figure 18:
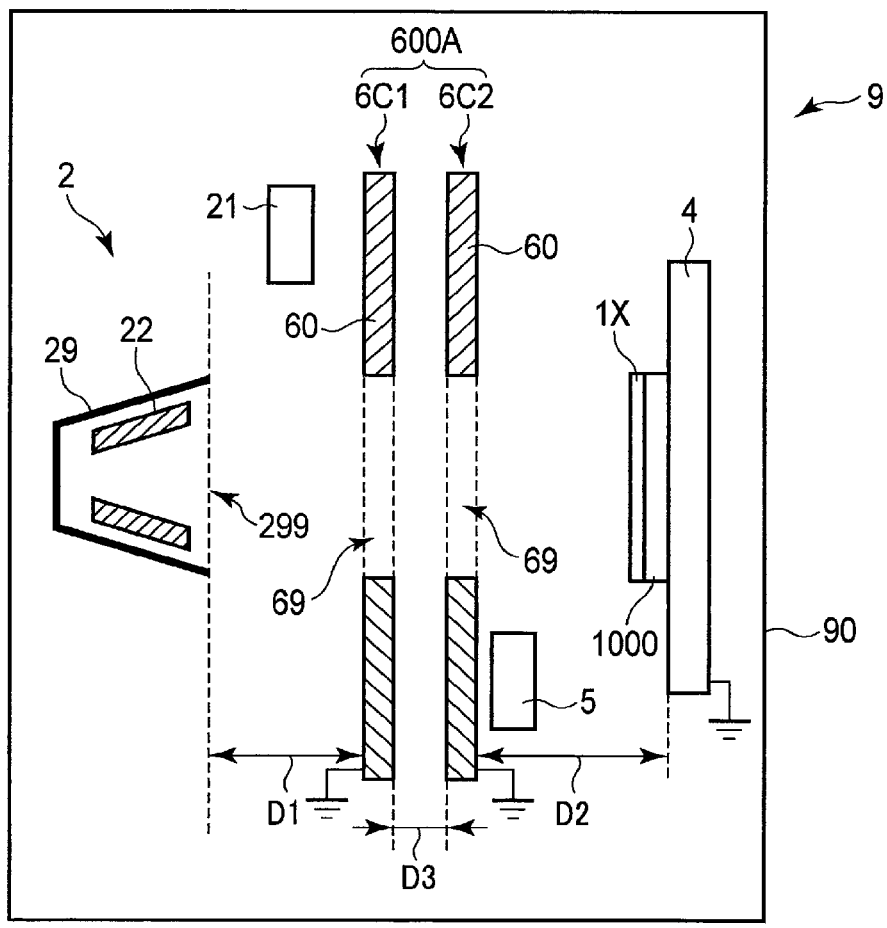

FIG. 18 is a schematic diagram showing a configuration example of the shield disposed inside the etching apparatus according to the present embodiment.

As shown in FIG. 18, a plurality of shields 6C1, 6C2 may be disposed between the ion source 2 and the substrate holder 4. Hereinafter, the configuration made of the plurality of shields 6C1, 6C2 will be called a shield unit.

In FIG. 18, a shield unit 600A contains the two shields 6C1, 6C2. Each of the shields 6C1, 6C2 has, for example, the structure shown in (a) of FIG. 10. The shield shown in (b) of FIG. 10 or FIG. 17 may also be used for the shield unit 600A.

The plurality of shields 6C1, 6C2 inside the shield unit 600A are arrayed in a direction from the ion source 2 toward the substrate holder 4 such that a space ranging from the ion source 2 to the substrate holder 4 is connected via the through hole 69.

In the shield unit 600A containing the two shields 6C1, 6C2, the first shield 6C1 is disposed at a predetermined distance (for example, 8 cm) D1 from the ion source 2 and the second shield 6C2 is disposed at a predetermined distance (for example, 5 cm) D2 from the substrate holder 4. In the shield unit 600A, a distance (interval) D3 between the two shields 6C1, 6C2 is set to, for example, 2 cm. The distance D3 between the neighboring shields 6C1, 6C2 is preferably set to a magnitude such that an electric field from the ion source toward the substrate does not enter a space between the neighboring shields to maintain uniformity of an ion beam.

When the plurality of shields 6C1, 6C2 is disposed between the ion source 2 and the substrate holder 4, a high etching rate and a uniform etching distribution of the to-be-processed layer are obtained just like when one shield is disposed between the ion source 2 and the substrate holder 4.

When, for example, an end point detector 5 like a Secondary Ion Mass Spectroscope (SIMS) is installed inside the etching apparatus 9, the interval D2 between the shield and the substrate holder 4 is preferably wide to secure the installation space of the end point detector 5 and also to secure ease of the installation.

With the insertion of the plurality of shields 6C1, 6C2 between the ion source 2 and the substrate holder (the substrate and the to-be-processed layer) 4 like in the present example, the distance D2 between the shields 6C1, 6C2 and the substrate holder 4 can be broadened without loss of high speed and uniformity of etching by an ion beam.

While an example in which the two shields 6C1, 6C2 are disposed in the etching apparatus 9 is shown in FIG. 18, the same effect as that described above can also be obtained when three or more shields are disposed in the etching apparatus 9.

Figure 19:
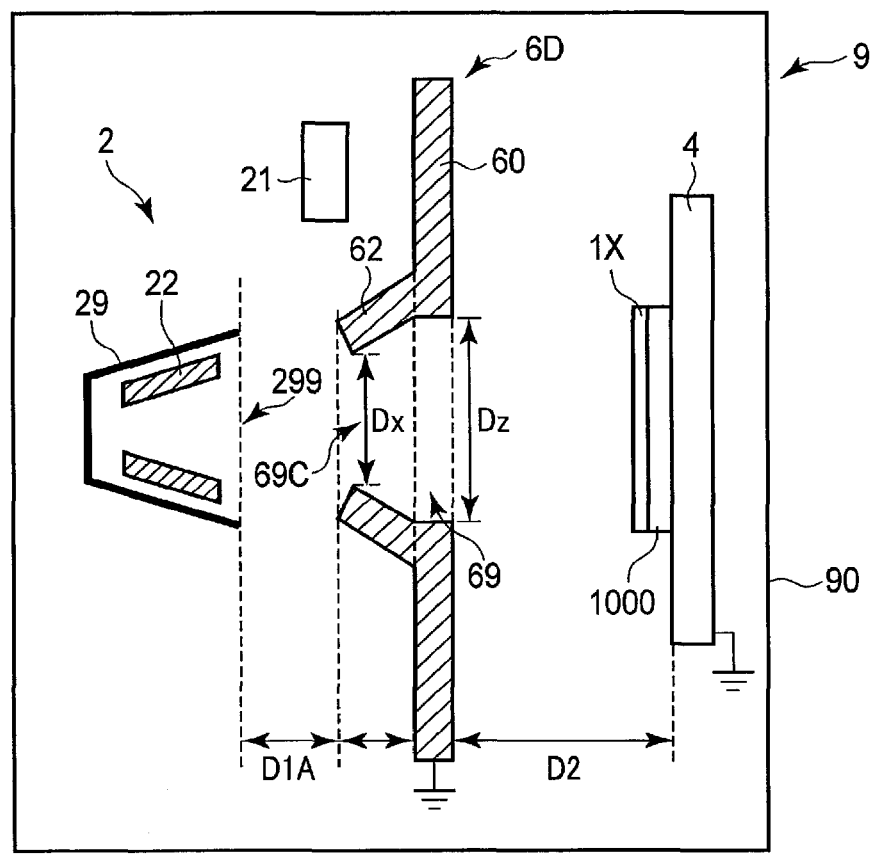

FIG. 19 is a schematic diagram showing a configuration example of the shield disposed inside the etching apparatus according to the present embodiment.

As shown in FIG. 19, a shield 6D may have a portion (protruding portion) 62 protruding to the ion source side.

An opening 69C is formed inside a shield 6E by the protruding portion 62 formed along an edge (outer edge) of the through hole 69.

If the shield 6D has the protruding portion 62, an electric field is concentrated by the protruding portion 62 of the shield 6D and the distribution of ions from the ion source 2 to the shield 6D is converged into the through hole 69A formed by the protruding portion 62 of the shield 6D. The plate portion 60 of the shield 6D acts as a cover to prevent ions that could not be converged by the protruding portion 62 from entering into the to-be-processed layer 1X as an ion beam of an excessive incident dispersion angle for etching of the to-be-processed layer.

In FIG. 19, a distance D1A between the ion source 2 and the protruding portion 62 of the shield 6D is set to, for example, 10 cm and the distance D2 between the plate portion 60 of the shield 6D and the substrate holder 4 is set to, for example, 3 cm. The interval between the tip of the protruding portion 62 on the ion source side and the plate portion 60 (height of the protruding portion 62, protruding portion) is set to, for example, 2 cm.

With the protruding portion 62 inclined toward the center side of the opening (through hole) 69C of the shield 6D, the opening dimension of the opening 69C of the shield 6D becomes narrower from the holder side toward the ion source side (becomes wider toward the substrate side). The protruding portion 62 is connected to the shield 6D such that an opening dimension Dx on the ion source side of the opening 69C of the shield 6D becomes smaller than an opening dimension Dz on the substrate holder side of the opening 69C of the shield 6D. Accordingly, the shield 6D in FIG. 19 can reduce the area of the shield 6D irradiated with an ion beam based on consideration of the dispersion of the ion beam. As a result, an etching apparatus using the shield in FIG. 19 can reduce contamination of the to-be-processed layer 1X caused by the shield 6D being etched.

FIG. 20 is schematic sectional views showing modifications of the shield having a protruding portion.

As shown in (a) of FIG. 20, a protruding portion (also called a perpendicular portion) 62A in a cylindrical shape may be connected to the plate portion 60 such that the protruding portion 62A of a shield 6Da protrudes almost perpendicularly to the surface of the plate portion 60.

As shown in (b) of FIG. 20, a portion 62B inclined toward the center side of the opening of a shield 6Db may be connected to the tip of the perpendicular portion 62A on the ion source side.

As shown in (c) of FIG. 20, a protruding portion 62C has a cross sectional shape in which the opening dimension gradually broadens from the ion source side toward the substrate holder side and the protruding portion 62C having the cross sectional shape may be connected to the plate portion 60.

FIG. 21 is a schematic diagram showing a configuration example of the shield disposed in the etching apparatus according to the present embodiment.

As shown in FIG. 21, the protruding portion of the shield may be disposed in the shield so as to protrude to the substrate holder side, instead of the ion source side.

An opening 69D is formed inside the shield 6D by a protruding portion 63 formed along an outer edge of the through hole 69.

When the shield 6E having the protruding portion 63 protruding to the substrate holder side is used for the etching apparatus 9, the protruding portion 63 comes close to the neighborhood of the substrate 1000. Thus, the dispersion of an ion beam parallel to the substrate surface is inhibited and the efficiency of irradiation of the to-be-processed layer 1X with an ion beam rises.

For example, the protruding portion 63 of the shield 6E has a shape in which the opening dimension of the protruding portion 63 (the diameter of the tube, the interval between constituent members) increases from the ion source side toward the substrate holder side. Due to the shape, etching of the protruding portion (shield) 63 by an ion beam is reduced. An opening dimension Dxx on the substrate holder side of the shield 6E having the protruding portion 63 is larger than the opening dimension (aperture of the through hole) Dz of the shield 6E on the ion source side.

Further, the shield 6E in FIG. 21 can direct the end point detector 5 toward the substrate 1000 via a through hole 68 disposed inside the protruding portion 63. Accordingly, sensitivity of detection of an etching end point of the to-be-processed layer 1X by an ion beam can be improved.

Also, the shield 6E in FIG. 21 can protect components disposed in a region between the substrate holder 4 and the shield 6 such as the end point detector 5 from irradiation of an ion beam by the protruding portion 63 protruding to the substrate holder side. Thus, the shield 6E can inhibit contamination of the to-be-processed layer caused by etching of structural elements in a region between the substrate holder 4 and the shield 6.

FIG. 22 is a diagram showing an application example of the shield having a protruding portion.

In the application example of the shield shown in FIG. 22, a shield unit 600B includes the shield 6D having the protruding portion 62C on the ion source side and the shield 6E having the protruding portion 63 on the substrate holder side.

The shield unit 600B made of the shields 6D, 6E having protruding portions protruding in mutually opposite directions as described above may be disposed between the ion source and substrate holder inside the etching apparatus.

Incidentally, one shield may have both of a protruding portion protruding to the ion source side and a protruding portion protruding to the substrate holder side.

FIG. 23 is a schematic diagram showing a configuration example of the shield disposed in the etching apparatus according to the present embodiment.

As shown in FIG. 23, instead of a protruding portion being disposed in the shield, a shield unit combining a shield in a ring shape and a shield in a flat plate shape may be used for the etching apparatus 9.

As shown in FIG. 23, a shield unit 600C includes the shield 6B in a ring shape and the shield 6 in a flat plate shape. The shield 6B in a ring shape is disposed between the ion source 2 and the shield 6 in a flat plate shape.

The inside diameter Da of the shield 6B in a ring shape is set to, for example, 9 cm and the outside diameter Db of the shield 6B is set to, for example, 11 cm. The thickness of the shield 6B is set to, for example, 0.5 mm.

The opening dimension Dz of the shield 6 in a flat plate shape has, for example, approximately the same dimension (here, 9 cm) as the inside diameter Da of the shield 6B in a ring shape. The distance D2 between the shield 6 and the substrate holder 4 is set to, for example, 4 cm.

The interval D3 between the shield 6B in a ring shape and the shield 6 in a flat plate shape is set to, for example, 4 cm.

An electric field from the anode 22 of the ion source 2 is concentrated on the shield 6B in a ring shape by the shield 6B in a ring shape to which the ground potential is applied, inhibiting the dispersion of an ion beam. Like the shield 6B in a ring shape, the shield 6 in a flat plate shape to which the ground potential is applied contributes to the concentration of the electric field from the ion source 2.

As a result, the amount of an ion beam passing through the shield 6B in a ring shape and the through holes 69 of the shield 6 in a flat plate shape is increased.

The shield 6 in a flat plate shape functions as a cover for an ion beam leaked to the outside from the outside diameter of the shield 6B in a ring shape. That is, the shield 6 in a flat plate shape prevents the substrate 1000 from being irradiated with an ion beam of excessive dispersion that is not converged into the through holes 69 of the shield 6B and the shield 6.

FIG. 24 is a schematic diagram showing a modification of the etching apparatus in FIG. 23.

In FIG. 24, the opening dimension Dzz of the through hole of the shield 6 in a flat plate shape is larger than the inside diameter Da of the shield 6B in a ring shape. For example, the inside diameter Da of the shield 6B in a ring shape is set to 9 cm and the opening dimension Dzz of the through hole of the shield 6 is set to 10.5 cm.

With the opening dimension (aperture) of the shield 6 disposed on the substrate holder side being made larger than the opening dimension (aperture) of the shield 6B disposed on the ion source side in the plurality of shields 6, 6B arrayed between the ion source 2 and the substrate holder 4 as described above, the etching apparatus in FIG. 24 can supply an ion beam uniformly to a wide area of the substrate 1000.

As a result, the etching apparatus in the present example can improve uniformity of etching.

Also, etching of the inner wall inside the through hole 69 of the shield 6 by an ion beam can be reduced as a result of the opening dimension of the shield 6B disposed on the ion source side being made larger and the etching apparatus in the present example can reduce contamination of the to-be-processed layer caused by etching of the shield.

FIG. 25 is a schematic diagram showing a configuration example of the shield disposed in the etching apparatus according to the present embodiment.

As shown in FIG. 25, the shield used for the etching apparatus 9 may have a tubular shape.

A shield 6F shown in FIG. 25 is formed from a conductor 64 in a tubular shape. The shield 6F in a tubular shape extends from the ion source 2 toward the substrate holder 4 and has a cavity 69Z along the extending direction of the shield 6F inside the conductor 64. A predetermined potential (for example, the ground potential) is applied to the shield 6F. The opening shape of the shield 6F in a tubular shape may be a circular shape (or an elliptic shape) or a rectangular shape.

A length L1 of the tubular shield 6F is set to 2 cm and the opening dimension (inside diameter) of the shield 6F in a tubular shape is set to 9 cm.

When the distance between the ion source and substrate is set to 15 cm, the interval D1 between the ion source 2 and one open end 691 of the tubular shield 6F is set to 8 cm and the interval D2 between another open end 692 of the tubular shield 6F and the substrate holder 4 is set to 5 cm. If the distance between the end of the tubular shield 6F and the substrate holder 4 is set as described above, a configuration that is practically the same as the configuration in which the tubular shield 6F is arranged on the substrate side from the intermediate position between the ion source 2 and the substrate holder 4 is obtained.

Compared with a shield in a flat plate shape, a shield in a tubular structure has improved stiffness. Thus, the tubular shield 6F in the etching apparatus 9 in FIG. 25 has small thermal deformation of the shield (conductor 64) and the shield 6F can also be replaced easily and thus, the maintenance time of the apparatus can be shortened. As a result, an etching apparatus using the tubular shield can, in addition to improved etching characteristics due to the above shield, reduce the cost of the etching apparatus and also reduce the cost of devices manufactured by the apparatus. Like the case when a plurality of shields are disposed in FIGS. 23 and 24, the shield 6F in a tubular shape and the shield 6 in a flat plate shape may be combined. In this case, in a shield unit including the plane shield and the tubular shield 6F, it is preferable to dispose the tubular shield at the position of the shield 6B in a ring shape in FIG. 24, that is, the position on the ion source side.

Figure 26:
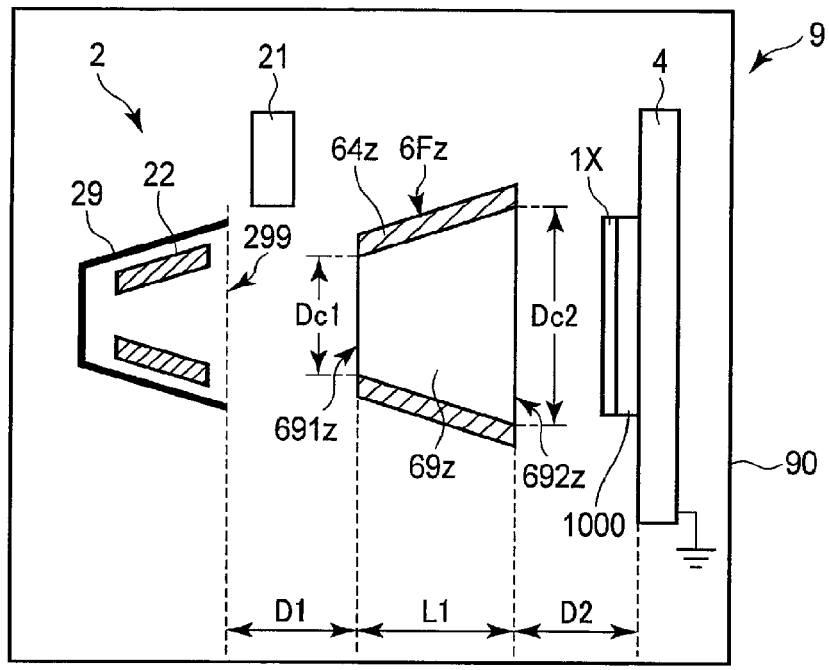

FIG. 26 is a schematic diagram showing a modification of the etching apparatus having the tubular shield.

In FIG. 26, an opening dimension Dc1 of one end 691z of a shield 6Fz and an opening dimension Dc2 of another end 692z of the shield 6Fz are mutually different in the shield 6Fz in a tubular shape.

The opening dimension (inside diameter of the tube) of the tubular shield 6Fz in FIG. 26 gradually broadens from the ion source side toward the substrate holder side.

For example, the diameter Dc1 of the tubular shield 6Fz on the ion source side (ion beam incidence side) is set to 7 cm and the diameter Dc2 of the tubular shield 6Fz on the substrate holder side (ion beam emission side) is set to 9 cm.

With the tubular shield 6Fz having a truncated conical shape in which the opening dimension increases from the ion source side toward the substrate holder side as described above, contamination caused by the inner wall of the shield 6Fz being etched by an ion beam can be reduced.

When an MTJ element is formed by an etching apparatus according to the present embodiment, even if iron as a main component of stainless steel forming a shield adheres to the holder or substrate (to-be-processed layer), elements constituting the MTJ element are basically magnetic substances such as iron (Fe) and cobalt (Co) and impurities adhering to the MTJ element (to-be-processed layer) are subsequently etched and removed by irradiation of an ion beam from the etching apparatus.

Therefore, even if a constituent member of the shield in the etching apparatus used to form an MTJ element is scattered to the substrate and to-be-processed layer as impurities, when compared with devices formed by processing other semiconductors or insulators, characteristics of devices using magnetic substance are hardly significantly affected adversely by impurities originating from the shield.

(4) Second Configuration Example of the Shield

A second configuration example of the shield included in a device manufacturing apparatus (ion beam etching apparatus) according to the present embodiment will be described with reference to FIGS. 27 to 35. While principal units of the apparatus are illustrated in diagrams below illustrating the present configuration example, the apparatus in the present configuration example may also include other components than the illustrated components.

Figure 27:
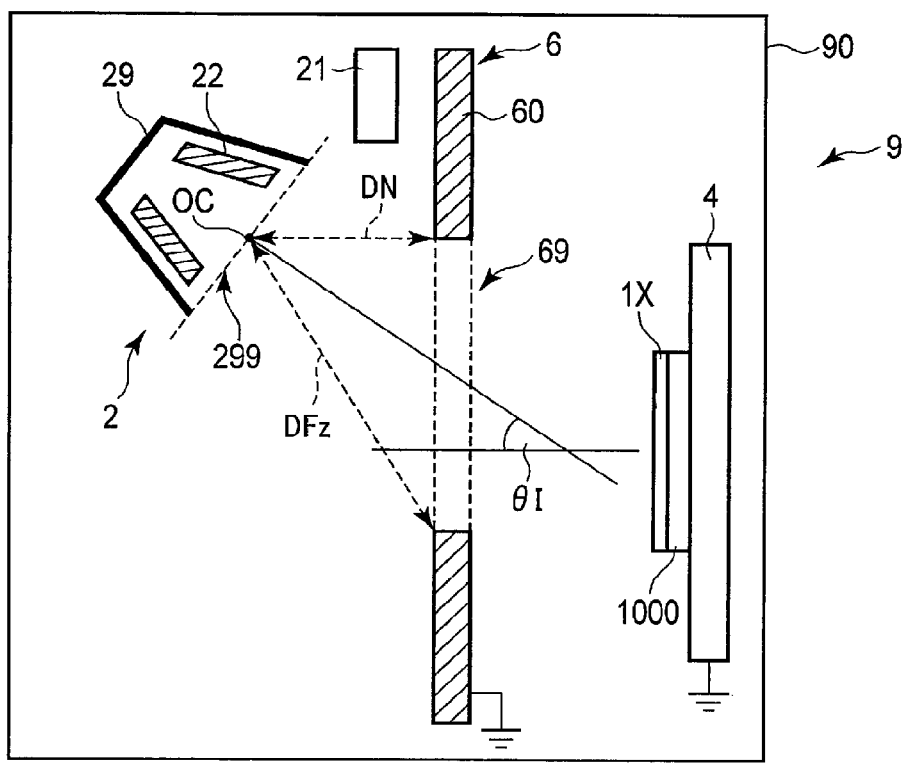

FIG. 27 is a diagram showing a configuration example of the shield disposed in an ion beam etching apparatus.

As shown in FIG. 27, when a device (for example, a magnetoresistive effect element) is formed by an ion beam etching apparatus according to an embodiment, the to-be-processed layer may be irradiated with an ion beam from a slanting direction.

When the substrate 1000 is irradiated with an ion beam from a slanting direction with respect to the substrate surface, the ion source 2 is inclined to the shield side from the position directly facing the substrate holder 4 (to the shield side from a direction perpendicular to the substrate surface) in accordance with the magnitude of an incident angle θI of an ion beam with respect to the substrate 1000 so that the opening surface of the ion source 2 is inclined with respect to the substrate surface. Hereinafter, the side on which the angle formed by an ion beam emission center axis of the ion source and a straight line parallel to the substrate surface is an acute angle will be called a side to which the ion source is inclined (a side to which the ion source is tilted) or a side to which the ion beam emission center axis is inclined.

When the substrate 1000 is irradiated with an ion beam from a slanting direction with respect to the substrate surface, the surface (surface on the substrate side) of the plate portion of the shield 6 has a relation parallel to the surface of the substrate holder/substrate 4, 1000.

The incident angle θI of an ion beam with respect to the substrate (to-be-processed layer) when the to-be-processed layer is irradiated with the ion beam from a slanting direction with respect to the substrate surface is formed by a straight line (ion beam emission center axis) passing through a center OC of the opening surface of the opening 299 of the ion source 2 and perpendicular to the opening surface and a straight line perpendicular to the substrate surface.

The irradiation of the to-be-processed layer with an ion beam from a slanting direction with respect to the substrate surface can obtain substantially the same effect as, like the above example, the irradiation of an ion beam from a direction perpendicular to the substrate surface.

Also, when the incident angle θI of an ion beam with respect to the substrate (to-be-processed layer) is set to a predetermined angle and the to-be-processed layer 1X is irradiated with the ion beam from a slanting direction with respect to the substrate surface in the etching apparatus 9 in which the shield 6 is arranged between the ion source 2 and the substrate holder 4 as shown in FIG. 27, compared with an etching apparatus in which the shield 6 is not arranged between the ion source 2 and the substrate holder 4, variations of etching of the to-be-processed layer 1X in the etching apparatus 9 in FIG. 27 are improved.

FIG. 28 is a diagram showing a configuration example of the shield disposed in an etching apparatus that irradiates the substrate with an ion beam at some tilt angle.

When, as shown in FIG. 27 described above, the incident angle θI of an ion beam with respect to the substrate 1000 is set to a predetermined angle by the ion source 2 being inclined from the position directly facing the substrate holder 4, a portion in which the distance between the ion source 2 and the shield 6 is long and a portion in which the distance between the ion source 2 and the shield 6 is short arise between the ion source and the shield.

For example, in FIG. 27, the ion source 2 approaches the shield 6 on the side on which the ion source 2 is tilted to the shield 6 and thus, a distance DFz between the center OC of the ion source and the shield 6 on the side opposite to the side to which the position of the ion source 2 is tilted becomes longer than a distance DN between the center OC of the ion source 2 and the shield 6 on the side to which the position of the ion source 2 is tilted.

As a result of regions arising in which intervals between the anode 22 of the ion source 2 and the shield 6 are different, the distribution of electric field strength between the anode 22 and the shield 6 could become nonuniform.

As shown in FIG. 28, the shape of a shield 6G is adjusted such that a portion of the shield farther from the ion source 2 is brought closer to the ion source side.

The ion source 2 is tilted to the side of some portion (plate portion) 60N of the shield 6G. The shield 6G includes a portion (plate portion) 60F other than the portion 60N on the side to which the ion source 2 is tilted. The plate portion 60F is positioned on the opposite side of the plate portion 60N on the side to which the ion source 2 is tilted across the through hole 69.

The plate portion 60F positioned on the opposite side of the side to which the ion source 2 is tilted is arranged on the opposite side of the substrate/substrate holder side in a direction perpendicular to the substrate surface more directly than the plate portion 60N positioned on the side to which the ion source 2 is tilted. Accordingly, an interval Z1 between the plate portion 60N and the substrate holder (to-be-processed layer/substrate) 4 becomes smaller than an interval Z2 between the plate portion 60F and the substrate holder (to-be-processed layer/substrate) 4. More specifically, the interval Z1 between the open end of the through hole 69 in the plate portion 60N and the center of the substrate holder 4 is smaller than the interval Z2 between the open end of the through hole 69 in the plate portion 60F and the center of the substrate holder 4. The ion source 2 irradiates the to-be-processed layer from an open end side of the plate portion 60N with an ion beam from a direction inclined from the direction perpendicular to the substrate surface.

As a result, a distance DF between the plate portion 60F other than the portion 60N on the side to which the ion source is tilted and the ion source 2 is set to a value close to the distance DN between the plate portion 60N positioned on the side to which the ion source 2 is tilted and the ion source 2, for example, substantially the same distance. Thus, regarding two distances DF, DN arising between the shield 6G and the ion source 2, the difference between the distance DF and the distance DN is made smaller.

Therefore, the intervals DF, DN between the ion source 2 and the portions 60F, 60N in the shield 6 are adjusted such that the strength of an electric field from the anode 22 of the ion source 2 to the shield 6 becomes uniform.

In etching by an ion beam set to a certain incident angle with respect to the substrate surface, variations of etching of the to-be-processed layer can be inhibited by adjusting the shape of the shield.

Figure 29:
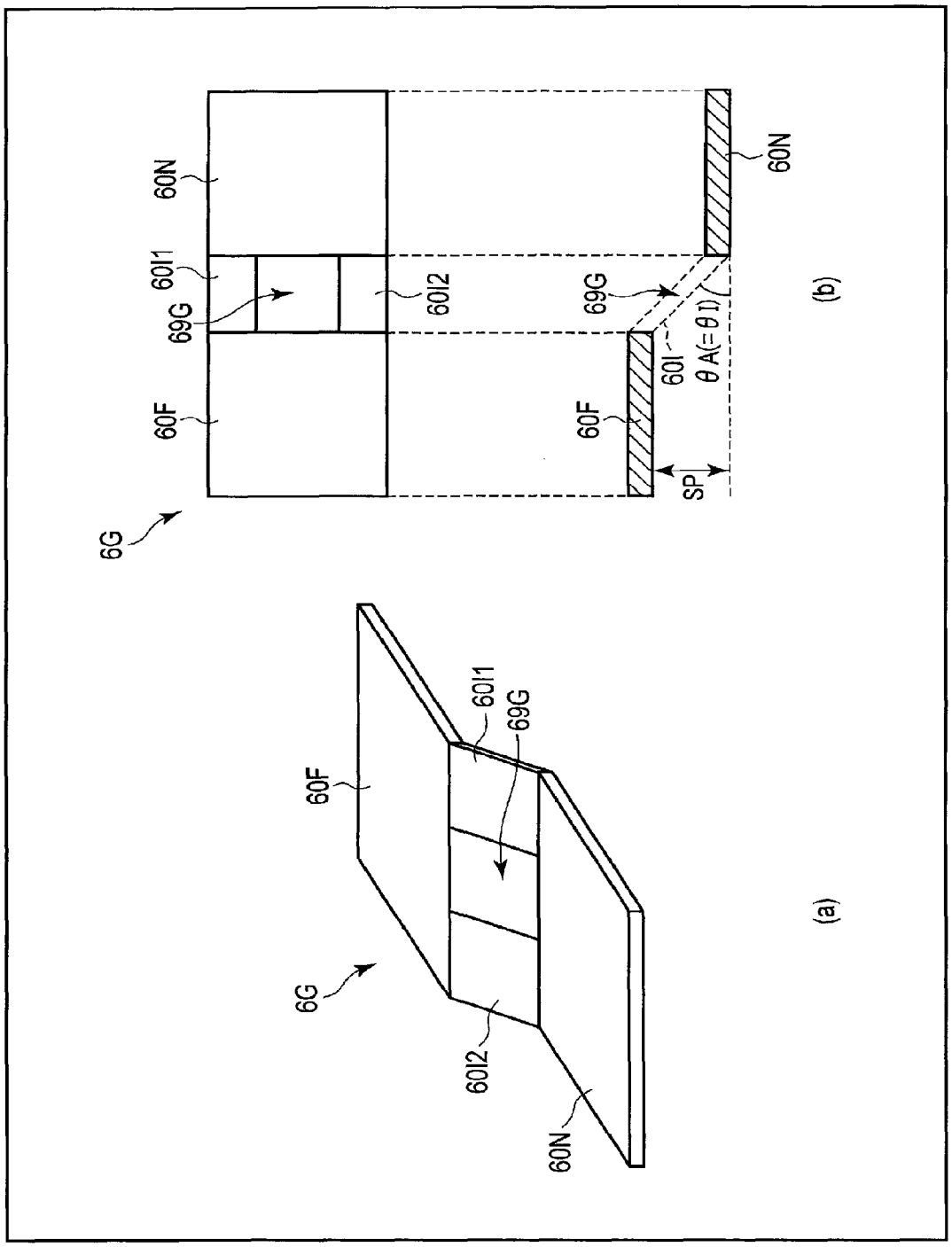

FIG. 29 is diagram illustrating the structure of the shield inside the etching apparatus in FIG. 28.

(a) of FIG. 29 shows a bird's-eye view of the shield and (b) of FIG. 29 shows a cross section and a plan view of the shield.

As shown in (a) and (b) of FIG. 29, the shield 6G has a step in a conductive plate.

The shield 6G includes the plate portion 60N, the plate portion 60F, and portions 60I1, 60I2 disposed between the two plate portions 60N, 60F. The plate portion 60N is positioned on the side to which the position of the ion source 2 is inclined to set a predetermined incident angle of an ion beam. The plate portion 60F is positioned on the opposite side of the side to which the position of the ion source 2 is inclined. The portions 60I1, 60I2 are tilted with respect to the surface of the plate portions 60N, 60F (surface of the substrate) such that a step arises in the shield 6G. Hereinafter, the tilted portions 60I1, 60I2 in the shield 60G are also called tilted portions 60I to distinguish members. The plate portion 60N on the side to which the position of the ion source 2 is inclined and the plate portion 60F on the opposite side of the side to which the position of the ion source 2 is tilted are adjacent to each other across the tilted portions 60I and the through hole 69.

For example, a through hole 69G of the shield 6G is formed inside the tilted portions 60I1, 60I2. The through hole 69G may also be formed by extending over the tilted portions 60I1, 60I2 and the plate portions 60F, 60N. The planar shape of the through hole 69G formed in the shield 6G having a step may be a rectangular shape or a circular shape (or an elliptic shape).

An angle (tilt angle of the tilted portion) θA formed by a straight line connecting the two plate portions 60F, 60N having a step and a straight line parallel to the surface of the plate portion is set to the magnitude equal to the incident angle (angle from a direction perpendicular to the substrate surface) θI of an ion beam. The magnitude of a step (interval between the plate portion 60F and the plate portion 60N in a direction perpendicular to the substrate surface) SP disposed in the shield 6G is adjusted in accordance with the tilt angle of the ion source 2 from the position directly facing the substrate 1000, that is, the magnitude of the tilt angle of an ion beam.

Accordingly, the distance (shortest distance) DN from the center OC of the ion beam emission port 299 of the ion source 2 on the side to which the ion source 2 is inclined to the plate portion 60N and the distance (shortest distance) DN from the center OC of the ion beam emission port 299 of the ion source 2 on the opposite side of the side to which the ion source 2 is inclined to the plate portion 60F are set to approximately the same magnitude.

Thus, a uniform etching distribution of the to-be-processed layer is obtained by the angle θA of the plate portions 60F, 60N, in other words, the step SP in the shield 6G being set.

Even if the distance (shortest distance) DN from the center OC of the ion beam emission port 299 of the ion source 2 to the one plate portion 60N does not have perfectly the same magnitude as the distance (shortest distance) DF from the center OC of the ion beam emission port 299 of the ion source 2 to the other plate portion 60F, a uniform etching distribution can be obtained by the difference of the distances DN, DF from the center OC of the ion beam emission port 299 to each plate portion being reduced.

FIG. 30 is a diagram showing a modification of the shield shown in FIG. 29.

As shown in FIG. 30, the step in a shield 6Gz (tilt angle θA of the shield) and the through hole 69 in the shield 6G may be formed by the two plate portions 60F, 60N separated from each other without disposing a tilted portion in the shield. A gap of the two plate portions 60F, 60N separated from each other functions as a through hole.

When one shield 6Gz is formed from the two plate portions 60F, 60N separated from each other, a predetermined potential (for example, the ground potential) is applied to each of the plate portions 60F, 60N independently.

Even when the shield 6Gz in FIG. 30 is used for the etching apparatus 9, substantially the same effect as that of the etching apparatus including the shield 6G in FIG. 29 is obtained.

Figure 32:
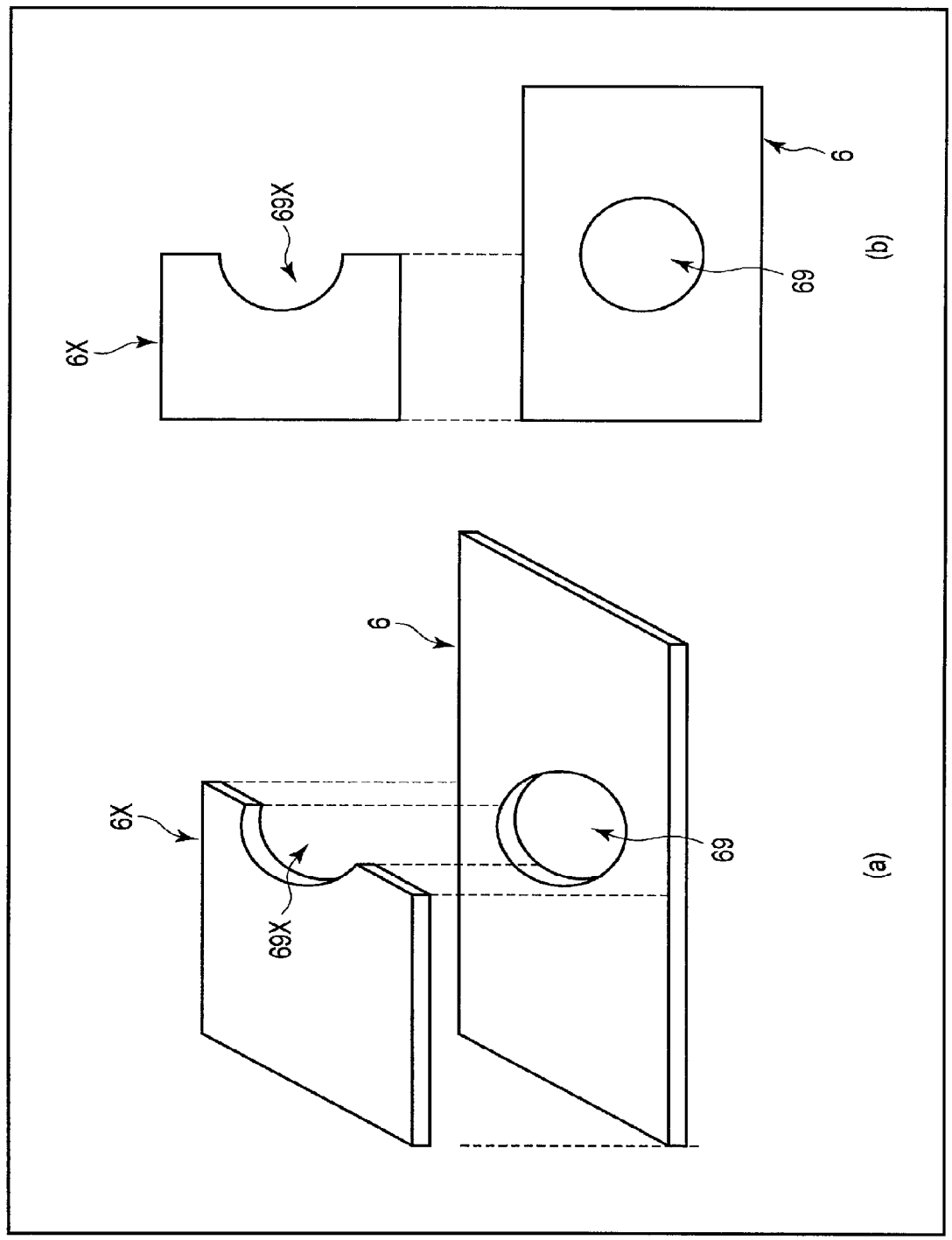
FIG. 32 is diagram showing a structural example of a shield included in the device manufacturing apparatus according to an embodiment.

FIGS. 31 and 32 are diagrams showing a configuration example of the shield disposed in the etching apparatus that irradiates the substrate with an ion beam at some tilt angle.

FIG. 31 is a schematic sectional view showing a configuration example of the shield in the etching apparatus. (a) of FIG. 32 shows a bird's-eye view of the shield in FIG. 31 and (b) of FIG. 32 shows a schematic plan view of the shield in FIG. 31.

As shown in FIGS. 31 and 32, the interval between the ion source and shield may be controlled by a plurality of shields 6, 6X being disposed between the ion source 2 and the substrate holder 4.

As shown in FIGS. 31 and 32, the etching apparatus can make the etching distribution of the to-be-processed layer 1X uniform by the two shields 6, 6X being stacked in a direction from the ion source side toward the substrate holder side.

As shown in FIGS. 31 and 32, the shield 6 in a flat plate shape having an opening and the shield (hereinafter, called also as an adjustment plate) 6X in which a through hole (notch) 69X in a semicircular shape is formed are disposed between the ion source 2 and the substrate holder 4.

The shield 6X as an adjustment plate is installed between the shield 6 in a flat plate shape and the ion source 2. The adjustment plate 6X is installed on the ion source side rather than the shield 6 side such that the semicircular through hole 69X of the adjustment plate 6X overlaps with the through hole 69 of the shield 6.

The potential (for example, the ground potential) of some magnitude is applied to the adjustment plate 6X.

The adjustment plate 6X is disposed on the ion source side in a region on the side farther from the ion source 2 of the shield 6 to adjust the distance between the shield 6 and the ion source 2.

Even if the distance DFz is present between the ion source 2 and the shield 6, as shown in FIG. 31, the adjustment plate 6X is installed such as to overlap with the shield 6 on the side on which the distance DFz is present between the ion source 2 and the shield 6. Accordingly, a distance DFzz (<DFz) between the adjustment plate 6X and the ion source acts as an effective distance between the shield and the ion source.

As a result, an ion beam etching apparatus including a plurality of stacked shields (shield unit) in FIGS. 31 and 32 can improve variations in the etching distribution on the to-be-processed layer on the substrate.

Figure 33:
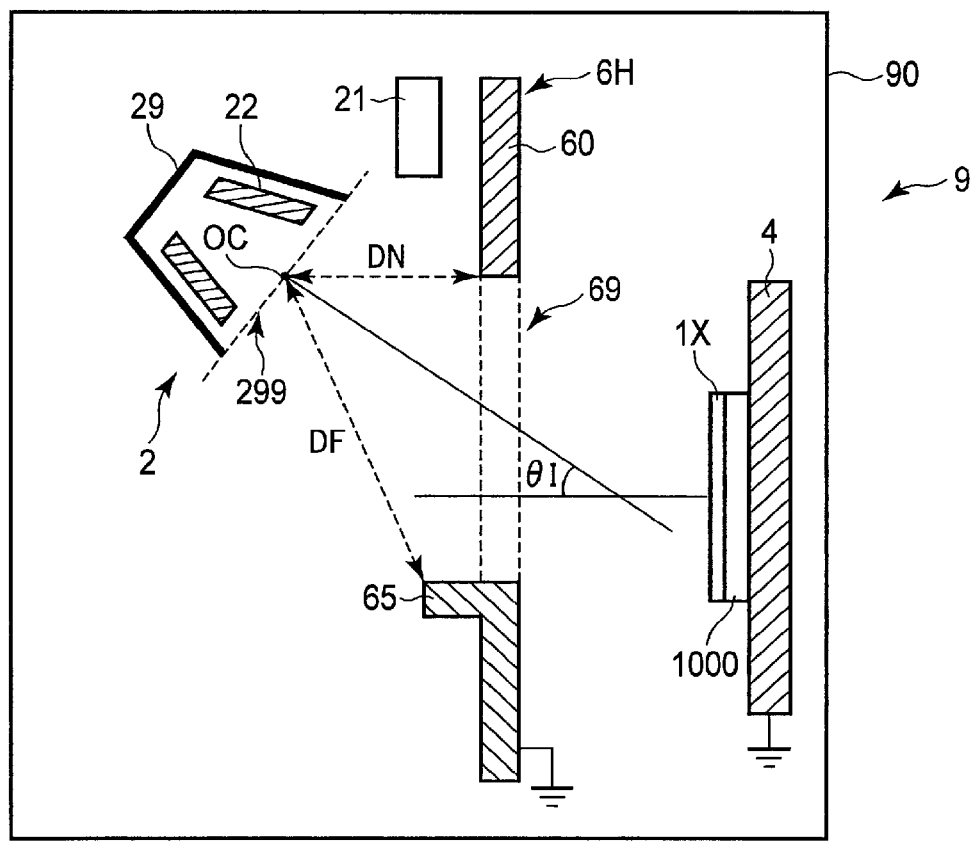
FIG. 33 is a diagram showing a second configuration example of the device manufacturing apparatus according to an embodiment.

FIG. 33 is a diagram showing a configuration example of the shield disposed in the etching apparatus that irradiates the substrate with an ion beam at some tilt angle.

As shown in FIG. 33, the interval between the ion source and shield may be controlled by a shield having a protruding portion being disposed.

As shown in FIG. 33, a shield 6H has a protruding portion 65 protruding to the ion source side.

In the etching apparatus 9 that irradiates the substrate surface with an ion beam from a slanting direction, the protruding portion 65 is disposed near the through hole 69 of the shield 6H on the side farther from the center OC of the opening of the ion source 2 (opposite side of the side to which the ion source is inclined). The protruding portion 65 is not disposed in the neighborhood of the through hole 69 on the side nearer to the center OC of the opening of the ion source 2.

Figure 35:
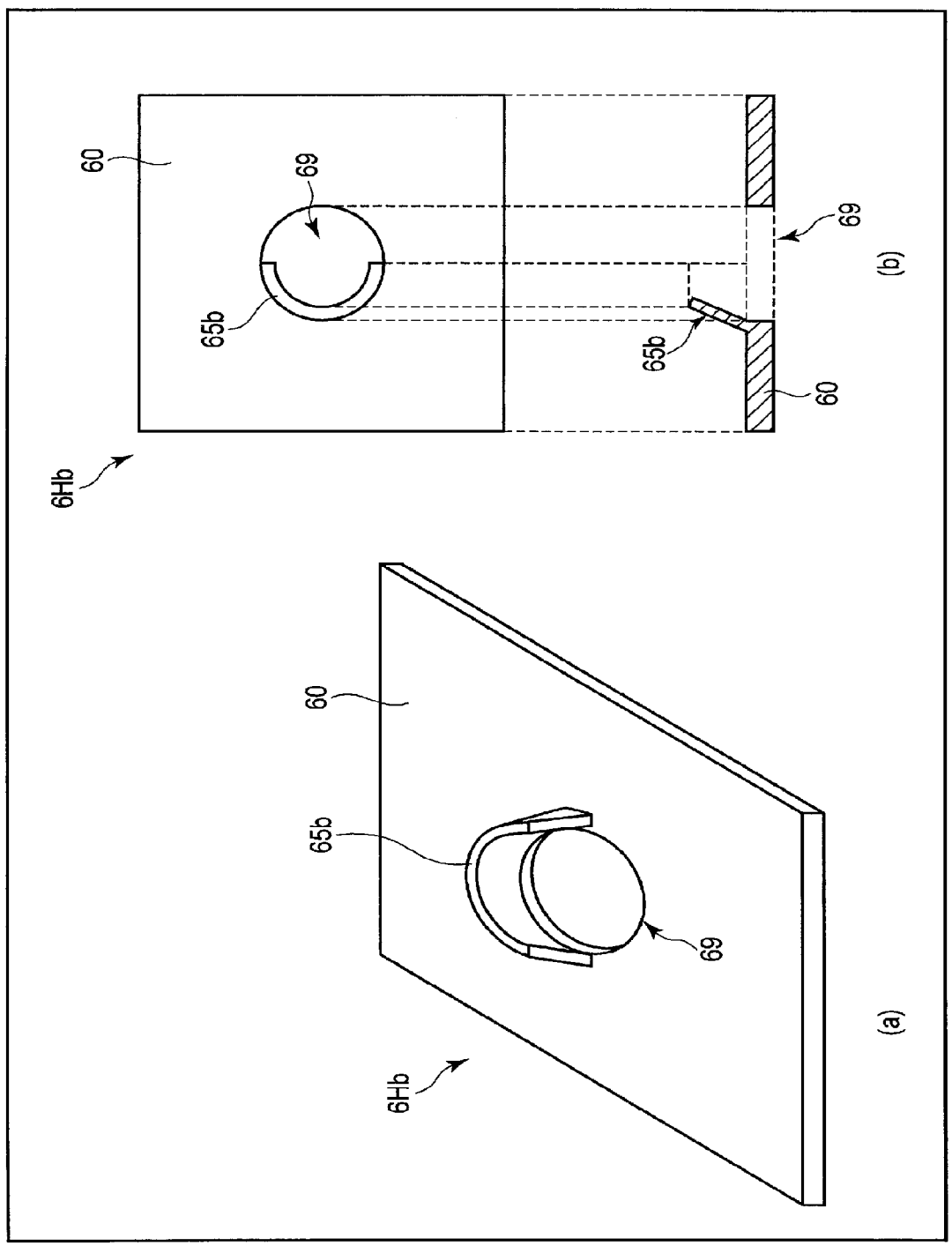

FIGS. 34 and 35 are schematic diagrams showing structure examples of the shield having a protruding portion.

(a) of FIG. 34 is a bird's-eye view showing a structure example of the shield having a protruding portion. (b) of FIG. 34 is a schematic plan view and sectional view of the shield in (a) of FIG. 34.

As shown in (a) and (b) of FIG. 34, a protruding portion 65*a* protruding to the ion source side is connected to the plate portion 60 of a shield 6Ha in a portion farther from the center of the ion source.

The height of the protruding portion 65*a* of the shield 6G becomes gradually lower from a portion farther from the center of the ion source toward a portion nearer to the center of the ion source.

The height of the protruding portion 65*a* is almost zero in a portion where the distance DN between the shield 6 and the ion source 2 is the smallest.

The shield 6Ha is disposed inside the chamber 90 such that the protruding portion 65*a* shown in FIG. 34 is positioned on the opposite side of the side to which the ion source is tilted.

(a) of FIG. 35 is a bird's-eye view showing a structure example of the shield having a protruding portion. (b) of FIG. 35 is a schematic plan view and sectional view of the shield in (a) of FIG. 35.

As shown in (a) and (b) of FIG. 35, a protruding portion 65*b* may be disposed only in half a portion of the outer edge of the through hole 69 of a shield 6Hb on the opposite side of the side to which the ion source is inclined (side farther from the ion source).

As shown in FIGS. 33 to 35, the distance DF between the tip of the protruding portions 65, 65*a*, 65*b* and the center OC of the emission port of the ion source 2 becomes close to the value of the distance DN between a portion without the protruding portions 65, 65*a*, 65*b* (end of the through hole 69) and the center OC of the emission port of the ion source 2 by the protruding portions 65, 65*a*, 65*b* being disposed in a portion of the neighborhood of the through hole 69 of the shields 6H, 6Ha, 6Hb.

As a result, variations of etching of the to-be-processed layer by an etching apparatus using one of the shields 6H, 6Ha, 6Hb in FIGS. 33 to 35 can be inhibited.

(5) Third Configuration Example of the Shield

A third configuration example of the shield included in a device manufacturing apparatus according to the present embodiment will be described with reference to FIGS. 36 to 40. While principal units of the apparatus are illustrated in diagrams below illustrating the present configuration example, the apparatus in the present configuration example may also include other components than the illustrated components.

A device manufacturing apparatus according to the present configuration example can further improve uniformity of etching of the to-be-processed layer and the dispersion of an ion beam by a shield being installed near the ion source.

FIG. 36 is a diagram showing a configuration example of the shield disposed near the ion source inside the etching apparatus.

As shown in FIG. 36, a plurality of shields (one shield unit) 6, 6B is disposed inside the etching apparatus.

One shield 6B of the plurality of shields is disposed near the ion source 2, for example, between the ion source 2 and a supply source of electrons (emission port of electrons of the cathode 21). A predetermined potential (for example, the ground potential) is applied to the shield 6B disposed near the ion source 2.

For example, the shield 6B in a ring shape is disposed between the shield 6 in a flat plate shape and the ion source 2. The shield 6B in a ring shape is positioned near the ion source 2. The shield 6B in a ring shape has the thickness of 3 mm, the inside diameter of 7 cm, and the outside diameter of 9 cm. The diameter of the ion emission port (opening) 299 of the ion source 2 is set to, for example, 6 cm. An interval D4 between the shield 6B in a ring shape and the ion source 2 is set to, for example, 2 cm.

If no shield is disposed near the ion beam emission port 299 of the ion source 2, the incident dispersion angle of an ion beam with respect to the substrate surface is about 10°.

The incident dispersion angle (solid angle) of an ion beam with respect to the substrate surface is changed to about 8° by the shield 6B being disposed near the ion emission port 299 of the ion source 2 like the etching apparatus 9 in FIG. 36.

Thus, the convergence of ions is enhanced by an electric field between the shield 6B disposed near the ion source 2B and the ion source 2 and an excessive incident dispersion angle of an ion beam with respect to the substrate (to-be-processed layer) can be inhibited.

FIG. 37 is a diagram showing a configuration example of the shield disposed near the ion source inside the etching apparatus.

As shown in FIG. 37, a plurality of shields 6B1, 6B2, 6B3 may be disposed near the opening 299 of the ion source 2.

In the example of FIG. 37, the three shields 6B1, 6B2, 6B3 are arrayed from the ion source side toward the holder side. The three shields 6B1, 6B2, 6B3 near the opening 299 of the ion source 2 are arrayed at predetermined intervals (for example, 1 cm). A predetermined potential (for example, the ground potential) is applied to each of the shields 6B1, 6B2, 6B3.

Incidentally, the plurality of shields 6B1, 6B2, 6B3 near the ion source may be connected to each other or separated from each other. Also, mutually different potentials may be applied to each of the shields 6B1, 6B2, 6B3.

The etching apparatus in FIG. 37 can set the incident dispersion angle of an ion beam to about 7° by the plurality of shields 6B1 to 6B3 being disposed near the opening 299 of the ion source 2 in such a manner that the plurality of shields 6B1 to 6B3 on the ion source side extend from the ion source side toward the substrate side.

Thus, the etching apparatus can not only control an excessive incident dispersion angle of an ion beam, but also improve uniformity of etching by the shields 6B1, 6B2, 6133 being disposed near the ion source 2.

Figure 38:
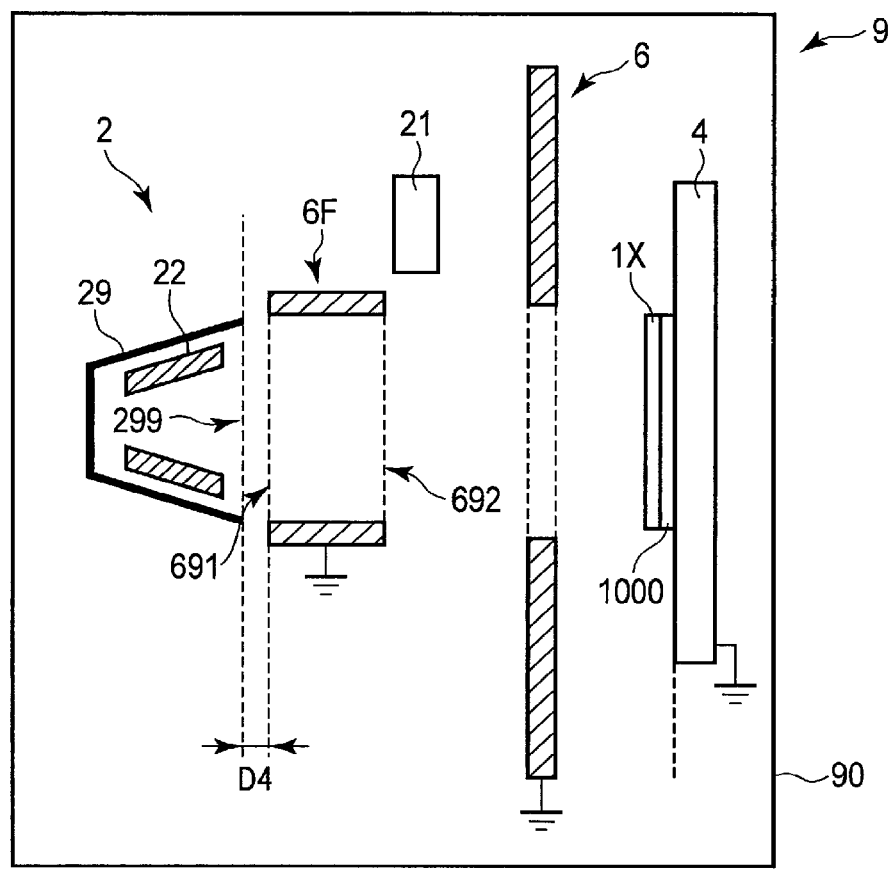

FIG. 38 is a diagram showing a modification of the etching apparatus in FIG. 37.

As shown in FIG. 38, instead of the plurality of shields arrayed in a direction from the ion source side toward the substrate side being disposed near the ion source, the shield 6F in a tubular shape may be disposed near the emission port 299 of the ion source 2.

Also when the shield 6F in a tubular shape is disposed near the emission port 299 of the ion source 2, ions are converged by the shield near the ion source 2. Accordingly, the etching apparatus in FIG. 38 can limit the excessive incident dispersion angle of an ion beam and improve uniformity of etching of the to-be-processed layer.

FIG. 39 is a diagram showing a configuration example of the shield disposed near the ion source inside the etching apparatus.

As shown in FIG. 39, a shield may be disposed near the ion source configured to irradiate the substrate surface with an ion beam from a slanting direction.

In the example shown in FIG. 39, the plurality of shields 6B1, 6B2, 6B3 arrayed in a direction from the ion source 2 toward the substrate holder 4 between the ion source 2 and the shield 6G having a tilted portion are disposed near the ion source 2. However, a shield configured otherwise shown in the above examples may be disposed near the ion source 2 configured to irradiate the substrate surface with an ion beam from a slanting direction.

The etching apparatus can make the dispersion of an ion beam still smaller by a shield being disposed near the ion source 2 configured to irradiate the substrate 1000 with an ion beam from a slanting direction with respect to the surface of the substrate 1000. As a result, the etching apparatus in FIG. 39 can form an MTJ element in a state in which the level of uniformity of etching of the to-be-processed layer is high.

FIG. 40 is a diagram showing a configuration example of the etching apparatus according to the present embodiment.

The etching apparatus in FIG. 40 can irradiate the substrate surface with an ion beam in a slanting direction from the ion source arranged so as to be opposed to the substrate holder in a direction perpendicular to the substrate surface by controlling an electric field distribution between the shield and ion source.

As shown in FIG. 40, the ion source 2 and the substrate holder 4 are disposed inside the chamber 90 such that the ion source 2 is opposed to (directly facing) the substrate holder 4 in a direction perpendicular to the surface of the substrate 1000.

For example, the shield 6G in FIG. 29 is disposed between the ion source 2 and the substrate holder 4. The shield 6G has the plate portion 60N positioned on the side nearer to the ion source 2 and the plate portion 60F positioned on the side farther from the ion source 2.

The distance DF between the center OC of the opening 299 of the ion source 2 and the end of the through hole 69 on the plate portion 60F side is different from the distance DN between the center OC of the opening 299 of the ion source 2 and the end of the through hole 69 on the plate portion 60N side.

An electric field from the anode 22 of the ion source 2 to the shield 6 is concentrated on the portion 60N of the shield on the side nearer to the center OC of the opening 299 of the ion source 2 rather than the portion 60F of the shield on the side farther from the center OC of the opening 299 of the ion source 2 due to the shield 6G having the portions 60F, 60N positioned at asymmetrical distances DF, DN from the ion source 2. Due to nonuniformity of the distribution of the electric field in a region between the ion source 2 and the shield 6G, among ions present between the ion source 2 and the shield 6G, the amount of ions supplied to the portion 60N on the side nearer to the ion source 2 increases.

As a result, the distribution of an ion beam IBz on the surface of the substrate 1000 becomes an equivalent distribution of incidence of the ion beam IBz from a slanting direction, on average.

Thus, an etching apparatus including the ion source 2 and the substrate holder 4 directly facing each other can allow an ion beam to enter from a slanting direction with respect to the substrate surface by using asymmetry of the shape of the shield.

In an ion beam etching apparatus in the present example, instead of the shield shown in FIG. 29, any of the shields shown in FIGS. 30 to 35 may also be used.

(6) Concrete Examples

Concrete examples of the device manufacturing apparatus according to the present embodiment will be described with reference to FIGS. 41 to 53. While principal units of the apparatus are illustrated in diagrams below illustrating each concrete example, the apparatus in the concrete example may also include other components than the illustrated components.

(6-1) First Concrete Example

A concrete example of the device manufacturing apparatus (ion beam etching apparatus) according to an embodiment will be described using FIGS. 41 to 43.

FIG. 41 is a schematic sectional view illustrating a concrete example of the ion beam etching apparatus according to an embodiment.

An etching apparatus 9A shown in FIG. 41 includes a plurality of ion sources 2A, 2B, 2C.

Each of the ion sources 2A, 2B, 2C is an ion source without grid, for example, an end hole type ion source.

Each of the ion sources 2A, 2B, 2C includes a hollow cathode type electron supply source (cathode) 21. Incidentally, one cathode may be provided in common for the plurality of ion sources 2A, 2B, 2C so that electrons from one cathode are shared among a plurality of the anodes 22. In addition, by applying a drive sequence in which each of a plurality of cathodes is sequentially used to the etching apparatus, each of the cathodes can be caused to function as a spare.

Hereinafter, the plurality of ion sources 2A, 2B, 2C in the etching apparatus will be called an ion source group 200. Also hereinafter, when the plurality of ion sources (in FIG. 41, the ion sources 2A, 2B, 2C) in the etching apparatus are not distinguished, these ion sources are denoted as the ion sources 2.

The one substrate holder 4 is provided for the plurality of ion sources 2A, 2B, 2C.

One shield 6I is disposed between the plurality of ion sources 2A, 2B, 2C and the one substrate holder 4.

The shield 6I has one or more through holes 691 and the shield 6I is formed from a conductive material. A predetermined potential (for example, the ground potential) is applied to the shield 6I.

A predetermined interval D2 is secured between the substrate holder 4 and the shield 6I. The interval D2 (≤D1) between the substrate holder 4 and the shield 6I is set to about 3 cm.

The end point detector 5 is installed in a position where the state of the substrate (to-be-processed layer) can be observed via the through hole 69I of the shield 6I near, for example, the one ion source 2A of the plurality of ion sources 2A, 2B, 2C.

The substrate holder 4 includes a substrate moving/rotating mechanism 400.

The layout of the through holes 691 in the shield 6I such as the formation position of the plurality of through holes 69, the interval between the plurality of through holes 69, and the shape of each through hole is set so that the plurality of through holes 691 of the shield 6I correspond to the plurality of ion sources 2A, 2B, 2C of the ion source group 200 respectively. There is a one-to-one correspondence between the ion source 2 and the through hole 69I.

A configuration example of the shield used for an ion beam etching apparatus including a plurality of ion sources will be described using FIGS. 42 and 43.

FIGS. 42 and 43 are plan views schematically showing the structure of the shield in the etching apparatus including the plurality of ion sources in the present concrete example.

(a) of FIG. 42 shows a planar structure of the shield when an ion source in which the planar shape of the ion beam emission port is linear (rectangular) is used as an ion source having no grid for an etching apparatus.

Hereinafter, a gridless ion source in which the planar shape of the ion beam emission port is linear (rectangular) will be called a linear ion source.

As shown in (a) of FIG. 42, the through hole 69I formed inside the shield 6I also has a linearly rectangular shape so as to correspond to the shape of the ion beam emission port 299 of the linear ion source 2. For example, the opening dimension of the through hole 69I is equal to or more than the opening dimension of the ion source 2.

The plurality of through holes 691 are disposed in the shield 6I so as to correspond to the layout of the plurality of ion sources in the etching apparatus 9A.

As shown in (b) of FIG. 42, ion sources 2A1 to 2A3, 2B1 to 2B3, 2C1 to 2C3 having the ion beam emission port like a point source (circular ion beam emission port) may linearly be arrayed along the length direction of the through hole 69I in a rectangular shape in the shield 6I. A plurality of ion sources of point source are disposed for the one through hole 69I. Accordingly, the substrate (to-be-processed layer) is irradiated with an equivalently linear ion beam from the ion source 2 of a plurality of point sources via the through hole 69I in a rectangular shape of the shield 6I.

The etching apparatus shown in FIG. 42 performs processing of the to-be-processed layer using an ion beam of a linear irradiation surface while the substrate 1000 performs reciprocation MV1 in one direction (X direction in FIG. 42) along the array direction of the through holes 691 under the control of the substrate holder. Accordingly, the etching apparatus can improve uniformity of etching. Thus, controllability of motion of the substrate (control of the position) in the chamber by reciprocation in one direction enables an etching apparatus using the shield in FIG. 42 to have a simple internal structure. Therefore, the etching apparatus using the shield in FIG. 42 can be provided as a low-cost etching apparatus.

In the etching apparatus 9 including a plurality of ion sources like in FIG. 41, interference between the ion sources can be reduced by insertion of the shield 6I between the ion source group 200 and the substrate holder (and the substrate including the to-be-processed layer) 4. As a result, compared with MTJ elements formed by an etching apparatus having no shield, variations in the shape of a plurality of MTJ elements in the substrate 1000 (for example, variations in the angle of the sidewall of MTJ elements) are improved by an etching apparatus in which the shield 6 is disposed between the ion source group 200 and the substrate holder 4 like in the present concrete example.

For example, in an etching apparatus including the shield 6I structured as shown in FIG. 42, the substrate holder may not be driven along the longitudinal direction (Y direction in FIG. 42) of the opening of the linear ion source to inhibit the dispersion of an ion beam.

However, if a shifting motion (reciprocating motion) of the substrate holder in the Y direction is not performed, there may arise a difference in the distribution of the incident angle of an ion beam with respect to the to-be-processed layer between an end in the Y direction of the substrate 1000 and a center portion of the substrate.

For clarification of description, a portion at one end in the Y direction of the substrate 1000 in a direction parallel to the substrate surface is denoted as "EG1" and a portion at the other end facing the end EG1 of the substrate 1000 in the diameter of the substrate 1000 is denoted as "EG2". A portion near the center (center portion) of the substrate 1000 is denoted as "CT".

If, for example, a length LYA in the Y direction of the ion beam emission port 299 of the linear ion source 2 is approximately the same as the diameter of the substrate 1000, the to-be-processed layer on the substrate 1000 is irradiated with a combined beam of an ion beam from immediately below a center portion CT of the substrate 1000 and an ion beam from immediately below the end EG1 of the substrate 1000 near the end EG1 in the Y direction of the substrate 1000.

Near the center portion CT of the substrate 1000, on the other hand, the to-be-processed layer is irradiated with a combined beam of ion beams from three directions including an ion beam from the end EG1 side of the substrate 1000, an ion beam from the end EG2 side of the substrate 1000, and an ion beam from immediately below the center portion CT of the substrate 1000.

Thus, there may arise a difference in the incidence distribution of an ion beam (irradiation amount/intensity of an ion beam) with respect to the substrate 1000 between the ends EG1, EG2 of the substrate 1000 and the center portion CT of the substrate 1000. Such variations in the incidence distribution of an ion beam in the substrate may cause variations in the shape of a plurality of MTJ elements (for example, the magnitude of the taper angle of MTJ elements) formed on the substrate 1000.

Thus, at the ends EG1, EG2 of the substrate 1000 along the Y direction of the ion beam emission port 299 of the linear ion source 2, an ion beam is desirably incident from the direction outside the ends EG1, EG2 of the substrate 1000 toward the substrate side.

Therefore, the length LYA in the Y direction of the ion beam emission port 299 of the ion source 2 and a length LY1 in the Y direction of the through hole 69I of the shield 6 are desirably larger than the diameter of the substrate 1000.

It is desirable that such a relation between the dimensions LY1, LYA of the ion beam emission port 299 of the ion source 2 and the through hole 69I of the shield 6I and the size (diameter) of the substrate 1000 be satisfied also when a plurality of point source ion sources like in (b) of FIG. 42 are arrayed in the Y direction from the viewpoint of inhibiting variations of etching of the to-be-processed layer.

FIG. 43 is a plan view schematically showing the structure of the shield in the etching apparatus including the plurality of ion sources in the present concrete example.

As shown in FIG. 43, each of the circular ion sources 2 has the ion beam emission port 299 in a circular shape.

A plurality (for example, nine) of circular ion sources 2A1, 2A2, 2A3, 2B1, 2B2, 2B3, 2C1, 2C2, 2C3 are arranged in a matrix shape inside a chamber of the ion beam etching apparatus such that the circular ion sources 2 adjacent to each other have a predetermined interval.

A plurality of the through holes 691 in a circular shape are disposed inside the conductor 60 of the shield 6I so as to correspond to the layout of the circular ion source 2 in the etching apparatus. The through holes 691 adjacent to each other in the shield 6I have a predetermined interval. The through holes 691 in a circular shape are arranged in the shield 6I in a layout in which the layout of the plurality of circular ion sources 2 is reflected.

In the etching apparatus including the plurality of circular ion sources 2, an excessive dispersion of an ion beam in both of the X direction and the Y direction of the substrate 1000 is limited by the substrate 1000 being irradiated with an ion beam via the shield 6I including the plurality of through holes 69I in a circular shape. As a result, variations in the shape of MTJ elements (for example, the taper angle on the side face of MTJ elements) in the substrate 1000 are reduced.

To make the distribution of the etching rate (etching depth) of the to-be-processed layer in the substrate 1000 uniform, it is desirable to perform both of shifting motion (reciprocating motion) MV1 of the substrate 1000 along the X direction and shifting motion (reciprocating motion) MV2 of the substrate 1000 along the Y direction by controlling the substrate holder during irradiation of an ion beam (during etching of the to-be-processed layer).

(6-2) Second Concrete Example

A concrete example of the device manufacturing apparatus (ion beam etching apparatus) according to an embodiment will be described using FIGS. 44 and 45.

FIG. 44 is a schematic sectional view illustrating a concrete example of the ion beam etching apparatus according to an embodiment.

As shown in FIG. 44, an etching apparatus 9B includes a first ion source group 200A and a second ion source group 200B. The two ion source groups 200A, 200B are disposed in the one vacuum chamber 90. The first and second ion source groups 200A, 200B are adjacent to each other in a direction parallel to the substrate surface (the X direction or the Y direction) in the same vacuum chamber 90.

A plurality of ion sources 2A, 2B, 2C in the first ion source group 200A output an ion beam (hereinafter, also called a perpendicular ion beam) IB1 incident on the substrate 1000 from a direction approximately perpendicular to the substrate surface. A plurality of ion sources 2D, 2E, 2F in the second ion source group 200B output an ion beam (hereinafter, also called a tilted ion beam) IB2 incident on the substrate 1000 from a slanting direction with respect to the substrate surface. The internal configuration of each of the ion sources 2A, 2B, 2C, 2D, 2E, 2F is substantially the same.

Hereinafter, a region irradiated with an ion beam from the first ion source group 200A or a region in which the first ion source group 200A is arranged will be called a perpendicular beam region. A region irradiated with an ion beam from the second ion source group 200B or a region in which the second ion source group 200B is arranged will be called a tilted beam region. For example, to efficiently irradiate the substrate with each ion beam without a perpendicular ion beam and a tilted ion beam interfering with each other, the center of the perpendicular beam region (first ion source group) 200A and the center of the tilted beam region (second ion source group) 200B are away from each other by the size (diameter) of the substrate 1000 or more.

The end point detector 5 is disposed in each of the ion source group 200A that emits the perpendicular ion beam IB1 and the ion source group 200B that emits the tilted ion beam IB2 so that the surface of the substrate (to-be-processed layer) can be observed via the through hole of the shield 6I.

The common shield 6I is provided for the first and second ion source groups 200A, 200B. The shield 6I extends over a perpendicular ion beam irradiation region to a tilted ion beam irradiation region in a region between the ion source groups 200A, 200B and the substrate holder 4.

The substrate 1000 including the to-be-processed layer 1X is irradiated with the ion beams IB1, IB2 of mutually different incident angles by the first ion source group 200A and the second ion source group 200B of the etching apparatus 9B in FIG. 44.

Processing of the to-be-processed layer (formation of MTJ elements) by the etching apparatus 9B in FIG. 44 is performed as described below.

The substrate 1000 having a laminated body (to-be-processed layer) including a magnetic layer and a tunnel barrier layer formed thereon is held by the substrate holder 4 in the chamber 90.

The substrate 1000 is moved to a position opposed to the first ion source group 200A across the shield 6I by a substrate moving mechanism (not shown) of the substrate holder 4. In the perpendicular beam region, the to-be-processed layer 1X on the substrate 1000 is irradiated with the ion beam (perpendicular ion beam) IB1 from the first ion source group 200A via the through hole of the shield 6I approximately perpendicularly with respect to the substrate surface.

When etching of the to-be-processed layer 1X by the ion beam IB1 output from the first ion source group 200A proceeds to a certain point due to ion beam irradiation for a predetermined time, the substrate 1000 is moved from the perpendicular beam region to the tilted beam region in the same vacuum chamber 90 by a moving operation MV3 of the substrate 1000 performed by the substrate holder 4. The substrate 1000 is moved to a position opposed to the second ion source group 200B across the shield 6I by the moving operation MV3 of the substrate 1000.

In the tilted beam region 200B, the to-be-processed layer 1X on which the etching process in the perpendicular beam region has been performed is irradiated with the ion beam (tilted ion beam) IB2 from the second ion source group 200B via the through hole 69I of the shield 6I from a slanting direction with respect to the substrate surface. Accordingly, etching (tilted ion milling) from a slanting direction by the ion beam IB2 at a predetermined tilt angle is performed on the to-be-processed layer 1X on the substrate 1000.

In the etching process of the to-be-processed layer by the ion beam IB2 in a slanting direction with respect to the substrate surface, the to-be-processed layer 1X may be irradiated with the ion beam (tilted ion beam) IB2 while rotating (turning on its axis) the substrate 1000 by the substrate rotating mechanism of the substrate holder 4 to uniformly irradiate the side face of the to-be-processed layer (MTJ element) with the ion beam 132.

MTJ elements in a predetermined shape are formed on the substrate 1000 by irradiation of a plurality of the ion beams IB1, IB2 having different magnitudes of the incident angle with the substrate 1000 described above.

Incidentally, the to-be-processed layer may be processed into MTJ elements in a predetermined shape by alternately performing etching in the perpendicular beam region and etching in the tilted beam region. Also, an etching process of the to-be-processed layer in the perpendicular beam region may be performed after an etching process of the to-be-processed layer in the tilted beam region being first performed.

The first ion source group (perpendicular ion beam region) 200A and the second on source group (perpendicular ion beam region) 200B may be disposed in mutually different chambers.

FIG. 45 is a schematic sectional view illustrating a modification of the ion beam etching apparatus in the present second concrete example. FIG. 45 shows the configuration of the second ion source group 200B of the etching apparatus including the first and second ion source groups shown in FIG. 44.

In the ion beam etching apparatus in FIGS. 44 and 45, in addition to the ion sources 2D, 2E, 2F that irradiate the substrate 1000 with the ion beam IB2 set to a positive incident angle θP when the incident angle of an ion beam is defined relative to the direction perpendicular to the surface of the substrate 1000 as a reference (0°), ion sources 2G, 2H, 2I that irradiate the substrate 1000 with an ion beam IB3 set to a negative incident angle θN may be disposed in a tilted ion beam region (ion source group) 200Bx.

With the ion beams IB2, IB3 of the different ion beam incident angles θP, θN from the ion source group 200Bx, the ion beams IB2, IB3 from a plurality of directions are incident on the substrate 1000.

Accordingly, the side face of the to-be-processed layer (MTJ element) is uniformly irradiated with the tilted ion beams IB2, IB3, further improving uniformity of etching of the to-be-processed layer 1X.

Magnitudes of the incident angle θN of an ion beam and the incident angle θP of an ion beam may be set to the same magnitude (that is, −θP=θN) or to different magnitudes as long as the signs (irradiation directions of ion beams) are opposite to each other.

During ion beam irradiation in the tilted ion beam region, for example, a reciprocating operation of the substrate 1000 along the X direction and the Y direction or a rotating operation of the substrate is performed under the control of the substrate holder 4.

The etching apparatus in FIGS. 44 and 45 can reduce that an attachment attached to the surface of the to-be-processed layer 1X is implanted into the to-be-processed layer 1X as etching of the to-be-processed layer 1X proceeds and so can process the to-be-processed layer (magnetic layer) at a low level of damage.

(6-3) Third Concrete Example

A concrete example of the device manufacturing apparatus (ion beam etching apparatus) according to an embodiment will be described using FIGS. 46 and 47.

FIG. 46 is a schematic sectional view illustrating a third concrete example of the ion beam etching apparatus according to an embodiment.

As shown in FIG. 46, an etching apparatus 9C in the present third concrete example includes the first source group 200A that outputs the ion beam IB1 perpendicular to the surface of the substrate 1000 and the second ion source group 200B that outputs the ion beam IB2 tilted with respect to the surface of the substrate 1000. The plurality of through holes 69I are disposed in the shield 6I.

A plurality of ion sources 2 and the shield 6I are disposed in the vacuum chamber 90 such that the one ion source 2A that emits the perpendicular ion beam IB1 and the one ion source 2D that emits the tilted ion beam IB2 correspond to the one common through hole 69I in the shield 6I.

The plurality of ion sources 2A to 2C, 2D to 2F are arranged in the chamber 90 of the etching apparatus such that the ion sources 2D, 2E, 2F that emit the ion beam 152 in a slanting direction with respect to the surface of the substrate 1000 are adjacent to the ion sources 2A, 2B, 2C that emit the ion beam IB1 in a direction perpendicular to the surface of the substrate 1000. For example, the ion sources 2A to 2C that emit the perpendicular ion beam IB1 and the ion sources 2D to 2F that emit the tilted ion beam IB2 may be arranged alternately along a certain direction.

For example, two ion sources, an ion source that emits the perpendicular ion beam IB1 and an ion source that emits the tilted ion beam IB2 provided for the common through hole 69I, are adjacent to each other in a region of the size of the substrate or less.

In the etching apparatus shown in FIG. 46, both of the perpendicular and tilted ion beams IB1, IB2 pass through the common through hole 69I.

For example, the first ion source group 200A and the second ion source group 200B are controlled by mutually different power supplies V1, V2 respectively. The plurality of ion sources 2A, 2B, 2C of the first ion source group 200A are connected to the first power supply V1 and the plurality of ion sources 2D, 2E, 2F of the second ion source group 200B are connected to the second power supply V2.

The first ion source group 200A and the second ion source group 200B may be driven at the same time or at mutually different times.

The etching apparatus 9C in the present concrete example can irradiate the to-be-processed layer 1X with the ion beam IB1 from the plurality of ion sources 2A, 2B, 2C of the first ion source group 200A at the same time as the ion beam IB2 from the plurality of ion sources 2D, 2E, 2F of the second ion source group 200B or at a different time from the ion beam IB2 from the plurality of ion sources 2D, 2E, 2F of the second ion source group 200B by the application times of the power supply voltages V1, V2 to the ion source groups 200A, 200B being controlled respectively.

FIG. 47 is schematic diagram illustrating operation examples of the ion beam etching apparatus in FIG. 46.

For example, as shown in (a) of FIG. 47, supply power to the second ion source group 200B is reduced and the plurality of ion sources 2 in the second ion source group 200E are put into a discharge state using weak power in the irradiation process of the ion beam (perpendicular ion beam) IB1 from the plurality of ion sources 2 of the first ion source group 200A. In this case, energy of the ion beam IB2 from the ion source 2 of the second ion source group 200B is much weaker than energy of the ion beam IB1 from the ion source 2 of the first ion source group 200A.

For example, power of 100V-5 A is supplied to each of the ion sources 2 of the first ion source group 200A and power of 70V-1 A is supplied to each of the ion sources 2 of the second ion source group 200B during irradiation of the ion beam IB1 from the first ion source group 200A.

Next, as shown in (b) of FIG. 47, supply power to the first ion source group 200A is reduced and the plurality of ion sources 2 in the first ion source group 200A are put into a discharge state using weak power in the irradiation process of the ion beam IB2 from the plurality of ion sources 2 of the second ion source group 200B. In this case, energy of the ion beam IB1 from the ion source 2 of the first ion source group 200A is much weaker than energy of the ion beam IB2 from the ion source 2 of the second ion source group 200B.

For example, power of 70V-1 A is supplied to each of the ion sources 2 of the first ion source group 200A and power of 100V-5 A is supplied to each of the ion sources 2 of the second ion source group 200B during irradiation of the ion beam IB2 from the second ion source group 200B.

Regarding a drive region of an end hole type ion source when the voltage of 100 V or less is applied, the dependence of energy of an ion beam on supply power is large. Thus, if the voltage is decreased by only a few tens of V, energy of an ion beam falls rapidly and the etching rate of the to-be-processed layer falls rapidly. Therefore, an ion source in a state in which the voltage of 100 V or less is applied is substantially equivalent to an off state. As a result, an ion beam from an ion source in a state in which the voltage of 100 V or less is applied (ion source in a weak discharge state) hardly contributes to etching of the to-be-processed layer.

The time for the drive state of an ion source to reach a state in which an ion beam of predetermined intensity is generated can be shortened when compared with the time for the drive state of an ion source to reach a state in which an ion beam of predetermined intensity is generated from a state in which the voltage of 0 V is applied to the ion source by the ion source 2 being maintained in a weak discharge state by applying the voltage of a certain magnitude.

Thus, in addition to improvements of uniformity of etching described above, the activation of the ion source 2 (discharge of ions) is made more smooth by a power supply system of the ion source being formed such that supply power to each ion source is controlled and therefore, the to-be-processed layer can be processed into an MTJ element in a predetermined shape in a shorter time.

Further, the size (area) of the etching apparatus can be made smaller by the two or more ion sources 2A to 2C, 2D to 2F, which irradiate the substrate 1000 with the ion beams IB1, IB2 of mutually different incident angles (irradiation directions), irradiating the substrate 1000 with the ion beams IB1, IB2 via the common through hole 69I disposed in the shield 6I.

In FIG. 46, an example in which the substrate 1000 is irradiated with the ion beams IB1, IB2 of two mutually different incident angles (irradiation directions) via the common through hole 69I in the shield 6I is shown. However, the substrate 1000 may be irradiated with ion beams of three or more mutually different incident angles (irradiation directions) via the same through hole 69I. In this case, three or more ion sources that irradiate the substrate 1000 with ion beams of mutually different incident angles (irradiation directions) are installed in the etching apparatus such that the one through hole 69I is used in common.

(6-4) Fourth Concrete Examples

A fourth concrete example of the device manufacturing apparatus (ion beam etching apparatus) according to an embodiment will be described using FIG. 48.

Figure 48:
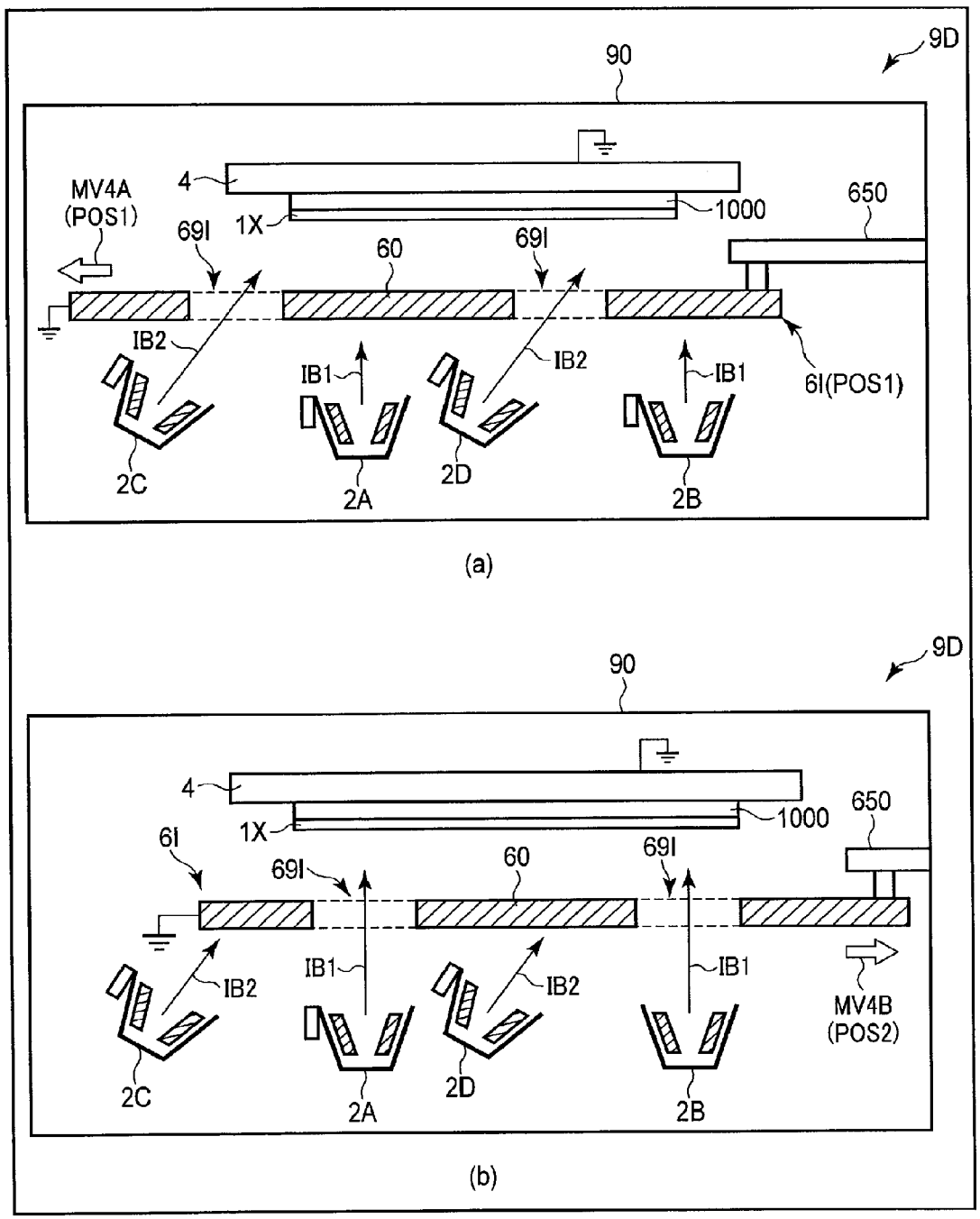
FIG. 48 is diagrams showing a fourth concrete example of the device manufacturing apparatus according to an embodiment.

FIG. 48 is schematic sectional view illustrating the fourth concrete example of the ion beam etching apparatus according to an embodiment.

Here, the control of irradiation of a substrate with an ion beam from a gridless ion source by a driving of a shield in the etching apparatus will be described.

An ion beam etching apparatus 9D in FIG. 48 has a configuration in which the substrate 1000 is irradiated with the ion beams IB1, IB2 from two mutually different directions at mutually different times by shifting operations MV4A, MV4B of the shield 6I. The ion beam etching apparatus 9D in the present concrete example includes a shield moving mechanism 650.

As shown in FIG. 48, the plurality of ion sources 2A, 2B, 2C, 2D are arranged in the chamber 90 of the etching apparatus 9D such that the ion sources 2C, 2D that emit an ion beam in a slanting direction with respect to the surface of the substrate are adjacent to the ion sources 2A, 2B that emit an ion beam in a direction perpendicular to the surface of the substrate.

The position of the shield 6I in the chamber 90 is controlled by the shield 6I being moved by the shield moving mechanism 650 so that the substrate 1000 is selectively irradiated at some time with the ion beams IB1, IB2 with which the substrate 100 is irradiated from mutually different incident angles (irradiation directions). The position of the through hole 69I in the shield 6I and the amount of movement of the shield 6I in the chamber 90 are appropriately set so that the substrate can selectively be irradiated with ion beams of mutually different incident angles at different times.

In addition, the interval between the ion sources 2A, 2B of the ion beam IB1 of some incident angle and the ion sources 2C, 2D of the ion beam IB2 of another incident angle is appropriately set so that the substrate 1000 is selectively irradiated at some time with the ion beams IB1, IB2 with which the substrate 100 is irradiated from mutually different incident angles (irradiation directions).

As shown in (a) of FIG. 48, when the substrate 1000 is irradiated with the ion beam IB2 in a slanting direction with respect to the surface of the substrate 1000, the shield 6I is moved to a first position POS1 by the moving operation MV4A of the shield 6I performed by the shield moving mechanism 650.

After the movement of the shield 6I, the position of the through hole 69I formed inside the shield 6I is present in a position where the tilted ion beam IB2 emitted from the ion sources 2C, 2D passes. Accordingly, the to-be-processed layer 1X is irradiated with the tilted ion beam IB2.

When the substrate 1000 is irradiated with the tilted ion beam IB2, the plate portion 60 of the shield 6I is present on a straight line (ion beam emission center axis) from the emission port of the ion sources 2A, 2B that emit the perpendicular ion beam IB1 to the substrate 1000. Accordingly, the perpendicular ion beam IB1 is blocked.

Next, when the substrate 1000 is irradiated with the ion beam IB1 in a direction perpendicular to the surface of the substrate 1000, the shield 6I is moved to a second position POS2 by the moving operation MV4B of the shield 6I performed by the shield moving mechanism 650, thereby shifting the position of the through hole 69I with respect to the ion source 2. The position of the through hole 69I formed inside the shield 6I is present in a position where the ion beam IB1 emitted from the ion sources 2A, 2B for perpendicular irradiation passes. Accordingly, the to-be-processed layer 1X is irradiated with the perpendicular ion beam IB1.

In this case, the plate portion 60 of the shield 6I is present on a straight line from the emission port of the ion sources 2C, 2D for tilted irradiation to the substrate 1000. Accordingly, the tilted ion beam IB2 is blocked.

In the ion beam etching apparatus 9D in the present concrete example, as described above, the layout of the through hole 69 of the shield 6I with respect to the ion sources 2 for tilted incidence and perpendicular incidence and the layout of the ion sources 2 in the chamber 90 are designed such that the substrate 1000 is irradiated with the ion beams IB1, IB2 of mutually different incident angles at mutually different times. Incidentally, the position of the shield is changed while the substrate 1000 always continues to reciprocate.

The ion beam etching apparatus 9D in the present concrete example can irradiate the to-be-processed layer 1X on the substrate 1000 with the ion beams IB1, IB2 in mutually different directions at different times while the ion sources 2 for tilted incidence and perpendicular incidence are always ON by the position of the shield 6I in the chamber 90 being moved during irradiation of ion beams.

Accordingly, the etching apparatus 9D in the present concrete example can quickly change the incident angle of an ion beam with respect to the substrate, shortening the processing time of the to-be-processed layer (formation time of MTJ elements).

(6-5) Fifth Concrete Example

A concrete example of the etching apparatus according to an embodiment will be described with reference to FIG. 49.

Here, the relationship of the opening dimension of a through hole of a shield to the end of a substrate holding portion and the end of a substrate (to-be-processed layer) will be described using (a) to (d) of FIG. 49.

(a) to (d) of FIG. 49 is diagram showing the relationship of the positions and dimensions of each of the end of the substrate holder (substrate holding portion), the end of the substrate (layer to-be-processed), and the through hole of the shield.

If the ion source 2 as a whole is an anode (reference potential), the shield 6, the substrate 1000 going through the through hole 69 of the shield 6, and the substrate holder 4 form one cathode. Thus, as will be described below, variations in size of the cathode with respect to the ion source during etching could cause nonuniformity of an ion beam.

(a) of FIG. 49 shows a state in which the substrate 1000 is translated to a position opposed to the one ion source 2.

If, as shown in (a) of FIG. 49, a portion of the substrate holder 4 is exposed to the ion source 2 via the through hole 69 of the shield 6, electric lines of force arising from the anode 22 of the ion source 2 are concentrated on the sample table 4 of metal via the through hole 69. As a result, the ion beam IB is not supplied into the through hole 69 uniformly.

(b) of FIG. 49 shows a state in which the movement of the substrate holder 4 further proceeds and the substrate holder 4 covers the opening of the ion source 2 and the whole surface of the through hole 69.

If, as shown in (b) of FIG. 49, the anode 22 of the ion source 2 is set as the reference, the region opposed to the through hole 69 of the shield 6 is wholly covered with the substrate holder 4 of metal and thus, electric lines of force are distributed throughout the inside of the through hole 69. Therefore, the potential inside the through hole 69 relative to the ion source 2 can be regarded as relatively the same potential with respect to the ion source 2. As a result, the ion beam IB is uniformly distributed inside the through hole 69.

(c) of FIG. 49 shows a state in which the substrate holder 4 further moves to a position where the substrate 1000 is irradiated with the ion beam TB. Also in this case, like the state in (b) of FIG. 49, the space where the substrate 1000 is opposed to the through hole 69 is wholly covered with the substrate holder 4 of a conductor. Thus, the to-be-processed layer 1X on the substrate 1000 is irradiated with the ion beam TB almost uniformly.

Here, a case when the interval between the end of the substrate holder 4 and the end of the substrate 1000 is small will be considered using (d) of FIG. 49.

If, as shown in (d) of FIG. 49, the interval between the end of the substrate holder 4 and the end of the substrate 1000 is small, when moved to a position where the substrate 1000 overlaps with the through hole 69 of the shield, the substrate holder 4 does not cover the whole through hole 69.

In the state in (d) of FIG. 49, like the state shown in (a) of FIG. 49, electric lines of force from the ion source 2 via the through hole 69 are concentrated on the end of the substrate holder 4, making an ion beam inside the through hole 69 nonuniform. The nonuniformity of an ion beam is observed as current variations and continues until the substrate holder 4 occupies about 70% of the area of the through hole 69 (opening of the ion source 2) or more.

Thus, compared with the to-be-processed layer on the center portion of the substrate 1000, the to-be-processed layer on the end of the substrate 1000 in (d) of FIG. 49 is more likely to have variations of the etching depth (etching rate) of the to-be-processed layer or variations of the taper angle on the sidewall of MTJ elements formed on the end of the substrate 1000.

Thus, if the diameter of the through hole 69 of the shield 6 is indicated by "Dz" or the area of the through hole 69 is indicated by "Az" in (d) of FIG. 49, it is preferable that the substrate 1000 appear in a position where the substrate 1000 vertically overlaps with the through hole 69 (position where the substrate 1000 is opposed to the through hole 69) after the substrate holder 4 moves to a position where the substrate holder 4 is opposed to the through hole 69 such that the substrate holder 4 covers 70% or more of the through hole 69 when viewed from the ion source side (for example, when the through hole 69 is viewed from the center of the opening of the ion source 2).

Particularly preferably, it is desirable that the substrate 1000 appear in a position of the through hole 69 after the substrate holder 4 covers 100% of the area of the through hole 69 when viewed from the ion source side. This means that if the interval between the end of the substrate holder 4 and the end of the substrate 1000 in the traveling direction of the substrate holder is indicated by "Sz", the interval Sz is larger than the diameter Dz from the viewpoint of uniformity of an electric field from the ion source 2 to the substrate holder/substrate 4, 1000. While an example in which the substrate holder 4 linearly moves toward the shield 6 is shown, a similar effect can also be achieved by combining rotational motion and linear motion of the substrate.

The etching apparatus in the present concrete example can further improve uniformity of etching of the to-be-processed layer and a plurality of MTJ elements can be formed on the substrate with small variations by the arrangement of the substrate on the substrate holder, the relationship between the size of the substrate holder and the size of the substrate, and the size of the through hole being designed just like in the present concrete example.

(6-6) Sixth Concrete Example

A concrete example of the device manufacturing apparatus (ion beam etching apparatus) according to an embodiment will be described using FIGS. 50 to 53.

Figure 50:
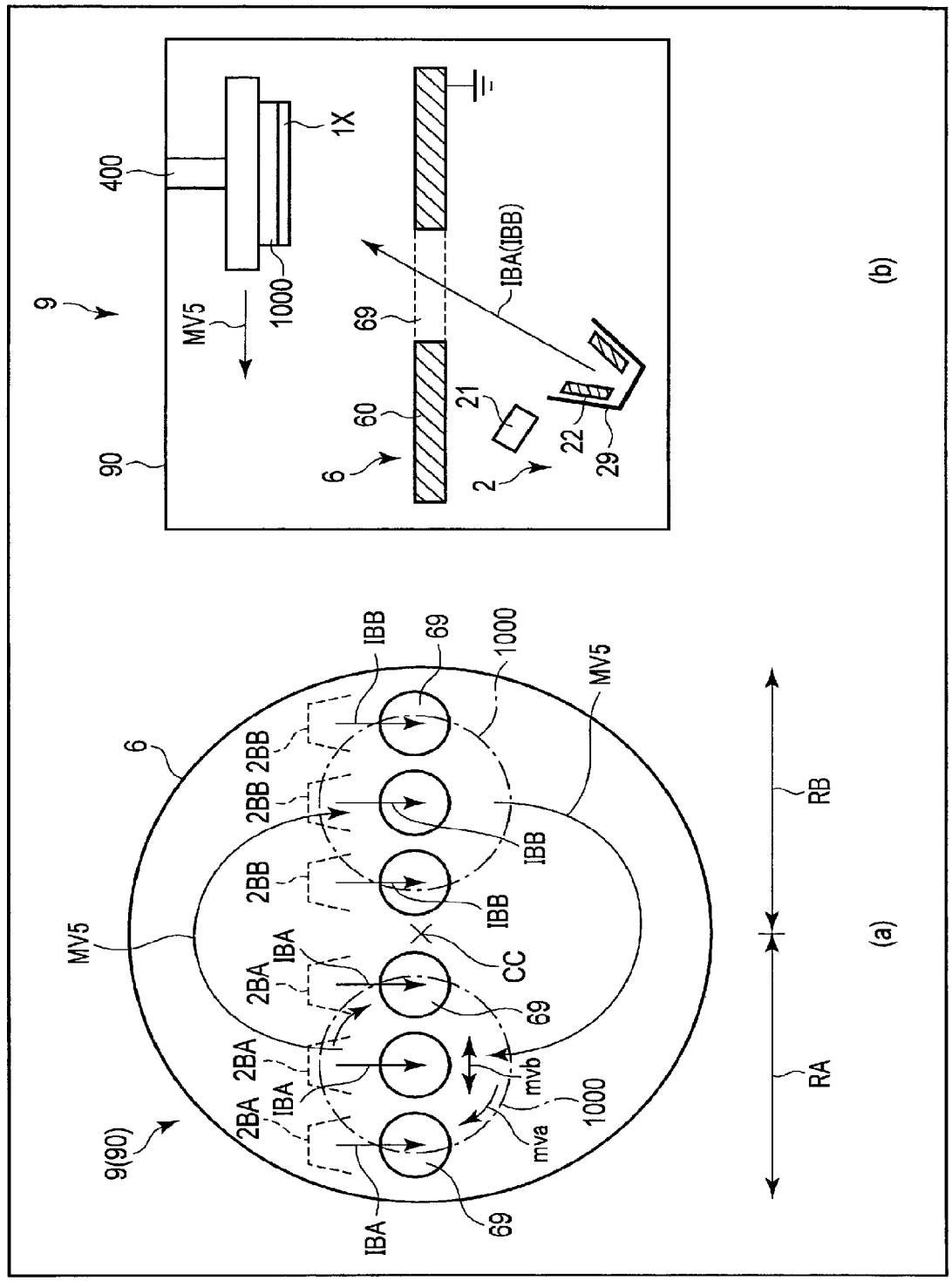
FIG. 50 is diagram showing a sixth concrete example of the device manufacturing apparatus according to an embodiment.

FIG. 50 is diagram showing a configuration example of the ion beam etching apparatus in the present concrete example.

(a) of FIG. 50 is a plan view schematically showing ion sources and a shield having through holes in the ion beam etching apparatus in the present concrete example. (b) of FIG. 50 is a sectional view schematically showing the configuration inside the etching apparatus in the present concrete example. Incidentally, (a) of FIG. 50 shows a plan view when the ion source side is viewed from the substrate holder side.

As shown in (a) and (b) of FIG. 50, a plurality of ion sources 2BA, 2BB are arrayed on the same straight line inside the etching apparatus 9. These ion sources 2BA, 2BB are disposed inside the ion beam etching apparatus such that the substrate 1000 is irradiated with ion beams IBA, IBB from a slanting direction with respect to the substrate surface. The one ion source 2B is disposed for the one through hole 69.

As shown in (a) and (b) of FIG. 50, the substrate 1000 is revolved around in the chamber 90 by the substrate moving mechanism 400 of the substrate holder 4. Revolution motion MV5 of the substrate 1000 is performed, for example, during irradiation of an ion beam. The revolution motion MV5 is motion around a center CC of the chamber 90 as an axis in a direction perpendicular to the substrate surface. In addition to the revolution motion inside the chamber 90, at least one operation of rotational (turning) motion mva of the substrate 1000 itself and a straight line operation (reciprocating motion) mvb is performed on the substrate 1000 by the substrate holder 4 during irradiation of an ion beam. While such motion is performed on the substrate 1000, the substrate 1000 moves in the irradiation region of the ion beam IB from the ion source 2.

If, as shown in (a) of FIG. 50, ion beam emission ports of all the ion sources 2BA, 2BB arrayed on the same straight line are installed in the same direction, mutually different side faces (for example, side faces opposite to each other) of the MTJ element are irradiated with the ion beam IBA from a plurality of ion sources 2BA arranged on a region RA side and the ion beam IBB from a plurality of ion sources 2BB arranged on a region RB side. The side faces of the MTJ element (to-be-processed layer) 1X are each etched by the ion beams IBA, IBB.

In the example shown in FIG. 50, the irradiation region/irradiation direction of an ion beam is set for every 180° in the chamber.

Thus, when the to-be-processed layer is irradiated with ion beams from mutually different directions by the substrate 1000 being rotated in the apparatus so as to pass through two ion beam irradiation regions, compared with a case of irradiation of ion beams from one direction (for example, when ion beams are irradiated from the plurality of ion sources 2BA), the etching apparatus 9 in the present concrete example can make the taper shape of a plurality of MTJ elements formed on the substrate uniform.

Figure 51:
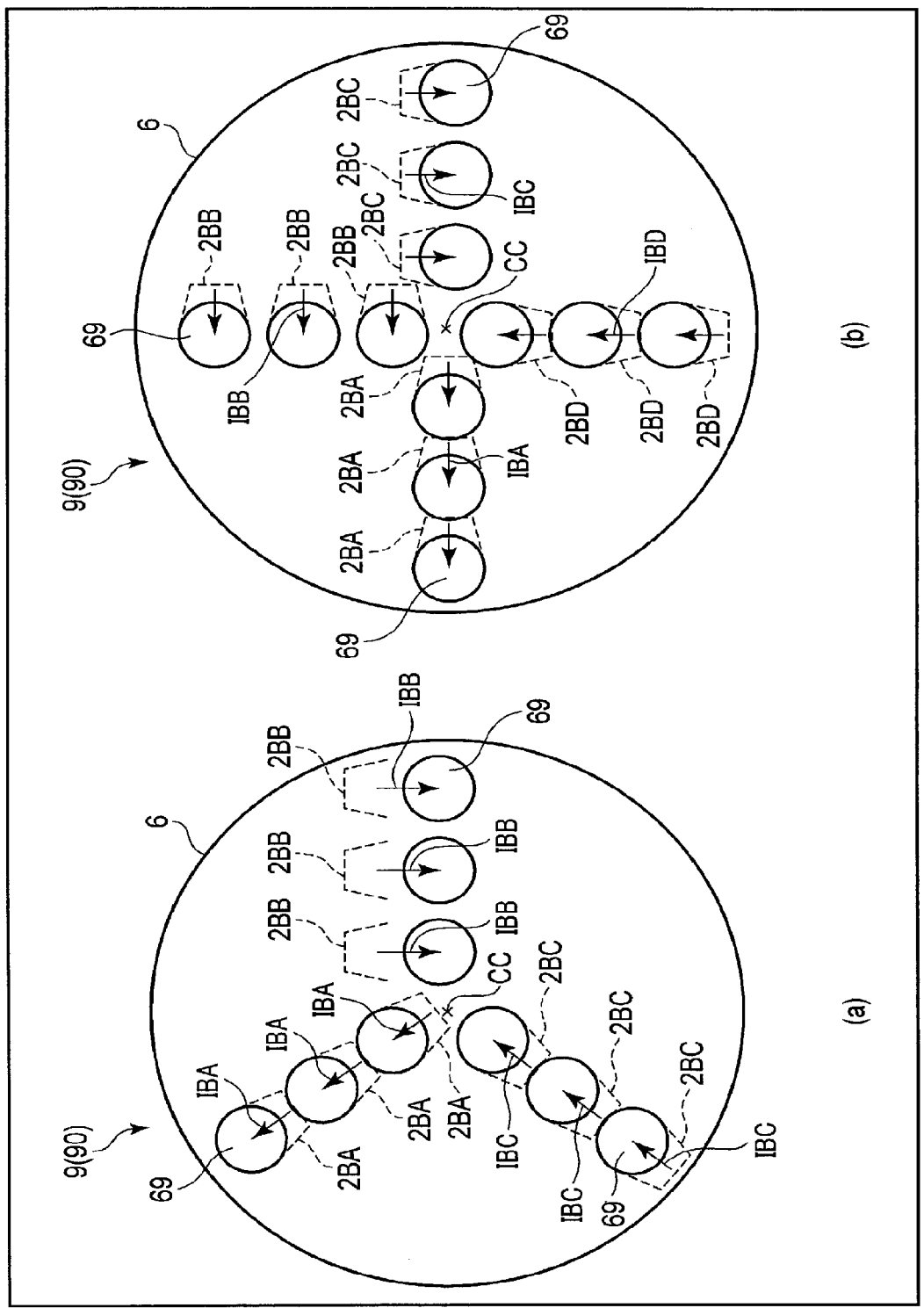

FIG. 51 shows modification of the ion beam etching apparatus shown in FIG. 50. (a) and (b) of FIG. 51 show plan views when the ion source side is viewed from the substrate holder side.

(a) of FIG. 51 shows an example of the layout of ion sources and the layout of through holes of the shield in the ion beam etching apparatus.

In the ion beam etching apparatus in (a) of FIG. 51, the through holes 69 are disposed in the shield 6 and ion sources 2BA, 2BB, 2BC are arranged inside the chamber 90 such that irradiation regions of ion beams IBA, IBB, IBC are set for every 120°. In this case, the to-be-processed layer is irradiated with the ion beams IBA, IBB, IBC from three different irradiation directions in the chamber 9.

(b) of FIG. 51 shows an example of the layout of ion sources and the layout of through holes of the shield in the ion beam etching apparatus.

In the ion beam etching apparatus in (b) of FIG. 51, the through holes 69 are disposed in the shield 6 and ion sources 2BA, 2BB, 2BC, 2BD are arranged inside the chamber 90 such that irradiation regions of ion beams IBA, IBB, IBC, IBD are set for every 90°. In this case, the to-be-processed layer is irradiated with the ion beams IBA, IBB, IBC, IBD from four different irradiation directions in the chamber.

A more uniform taper is formed on the side face of MTJ elements among a plurality of MTJ elements formed on the substrate 1000 with an increasingly finer angle of the irradiation direction of ion beams in the chamber and an increasing number of irradiation directions of ion beams to the substrate like the irradiation of two ion beams from the region of every 180° shown in (a) of FIG. 50, the irradiation of three ion beams from the region of every 120° shown in (a) of FIG. 51, and the irradiation of four ion beams from the region of every 90° shown in (b) of FIG. 51.

Figure 52:
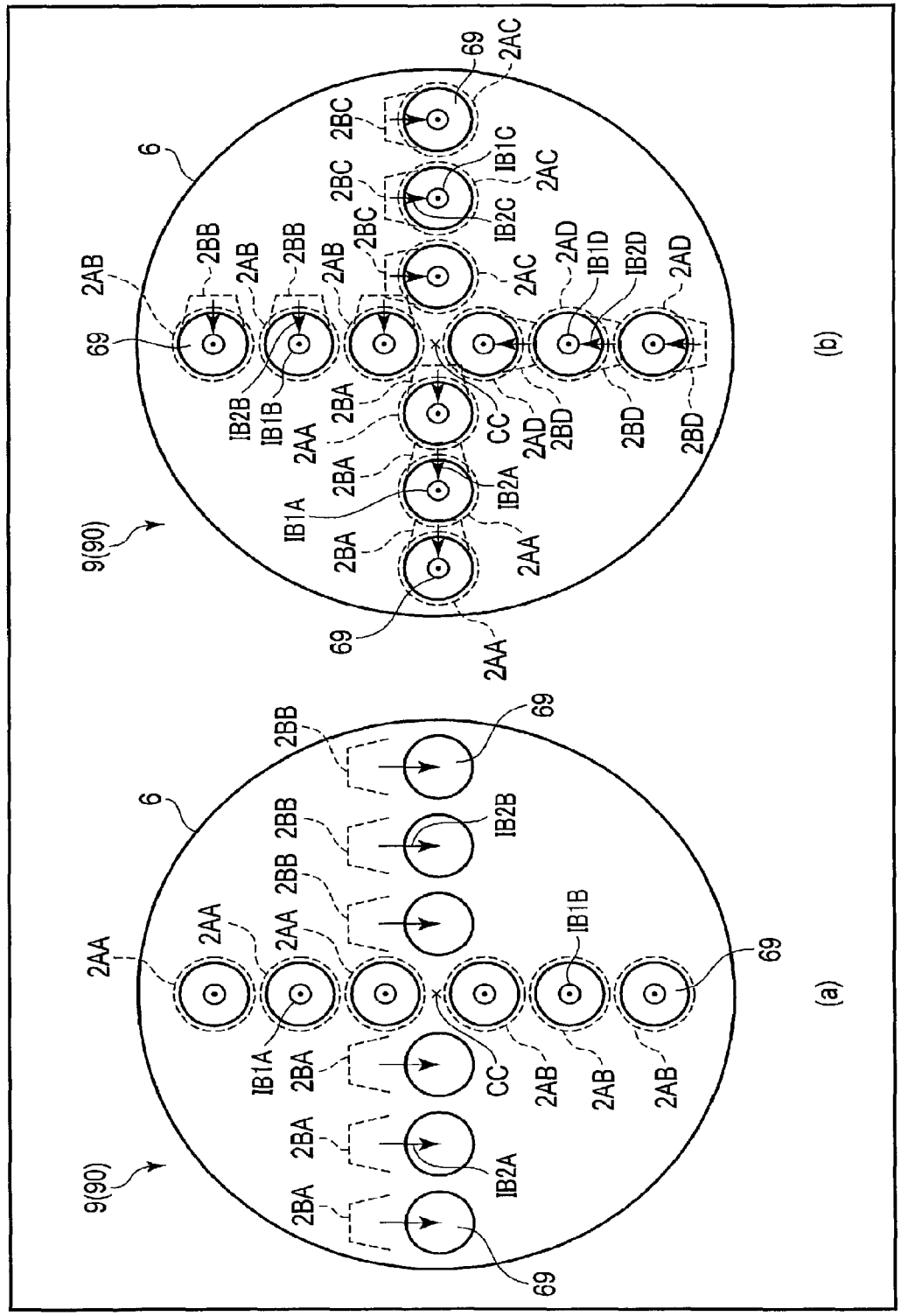

FIG. 52 shows modifications of the ion beam etching apparatus shown in FIG. 50.

(a) and (b) of FIG. 52 are each plan views schematically showing ion sources and a shield having through holes in the ion beam etching apparatus in the present concrete example. FIG. 52 show plan views when the ion source side is viewed from the substrate holder side.

In the example shown in (a) of FIG. 52, a plurality of ion sources 2A that emit an ion beam in a direction perpendicular to the surface of the substrate 1000 and a plurality of ion sources 2B that emit an ion beam in a slanting direction with respect to the substrate surface are disposed in the vacuum chamber 90 of the etching apparatus 9.

A plurality of ion sources 2AA, 2AB that emit ion beams IB1A, IB1B in a vertical direction are arrayed along a first direction. A plurality of ion sources 2BA, 2BB that emit ion beams IB2A, IB2B in a slanting direction are arrayed along a second direction intersecting the first direction. For example, the second direction intersects the first direction at right angles.

The ion sources 2AA, 2AB that emit the ion beams IB1A, IB1B in a vertical direction or the ion sources 2BA, 2BB that emit the ion beams IB2A, IB2B in a slanting direction are allocated to each of the through holes 69.

Like the examples shown in FIGS. 50 and 51, the substrate is revolved in the chamber by the substrate holder to pass through each ion beam irradiation region.

Accordingly, the substrate can be irradiated with the ion beams IB1A, IB1B, IB2A, IB2B at different incident angles in one chamber.

Like the example shown in (b) of FIG. 52, ion sources 2AA, 2AB, 2AC, 2AD that emit ion beams IB1A, IB1B, IB1C, IB1D in a vertical direction and ion sources 2BA, 2BB, 2BC, 2BD that emit ion beams IB2A, IB2B, IB2C, IB2D in a slanting direction may both be allocated to the one through hole 69.

When, as shown in (b) of FIG. 52, a plurality of ion sources 2AA to 2AD, 2BA to 2BD are disposed for each of the through holes 69, the incident angle of an ion beam to the substrate is changed by, as described using FIGS. 46 and 47, controlling power supplied to the ion sources 2AA to 2AD that emit the ion beams IB1A to IB1D in a vertical direction and the ion sources 2BA to 2BD that emit the ion beams IB2A to IB2D in a slanting direction.

By controlling power supplied to the ion sources, the ion sources 2AA to 2AD that emit the ion beams IB1A to IB1D in a vertical direction or the ion sources 2BA to 2BD that emit the ion beams IB2A to IB2D in a slanting direction generate ion beams to etch the to-be-processed layer in a strong discharge state and the other ion sources generate ion beams that hardly contribute to etching in a weak discharge state. For example, the strong discharge state of ion sources and the weak discharge state of ion sources are sequentially or alternately switched during etching of the to-be-processed layer.

Further, if the substrate is revolved in the chamber during irradiation of ion beams, the etching apparatus in the present concrete example can make the etching depth (etching rate) of the to-be-processed layer ix in the substrate 1000 uniform by controlling the output of the ion source 2 such as increasing power (for example, a current) supplied to the ion source on the outer side (outer edge side) of the chamber in which the rotational speed of the substrate is fast, as compared with power supplied to the ion source arranged on the inner side (center CC side) of the chamber in which the rotational speed of the substrate is slow.

The ion beam etching apparatus in the modification shown in FIG. 52 can perform etching of the to-be-processed layer using two or more incident angles of ion beams (here, ion beams in a vertical direction and in a slanting direction with respect to the substrate surface) in the one vacuum chamber 90.

A modification of the etching apparatus in the present concrete example will be described with reference to FIG. 53.

(a) and (b) of FIG. 53 are each plan views schematically showing ion sources and a shield having through holes in the ion beam etching apparatus in the present concrete example. (a) and (b) of FIG. 53 show plan views when the ion source side is viewed from the substrate holder side.

In the above examples, examples in which etching of the to-be-processed layer is performed under two etching conditions (for example, incident angles of ion beams with respect to the substrate) are shown. However, the to-be-processed layer may also be etched using an etching apparatus capable of selecting three or more etching conditions.

In the ion beam etching apparatus shown in FIG. 53, a plurality of ion sources 2A that output ion beams in a direction perpendicular to the substrate surface and a plurality of ion sources 2B that output ion beams in a slanting direction with respect to the substrate surface are disposed in the chamber 90 of the etching apparatus 9.

When the to-be-processed layer on the substrate is etched, the ion sources 2A, 2B are driven under different driving conditions such that conditions and characteristics of ion beams IB1, IB2 output by the ion sources 2A, 2B in (a) of FIG. 53 are different from conditions and characteristics of ion beams IB1x, IB2x output by the ion sources 2A, 2B in (b) of FIG. 53.

After the to-be-processed layer is etched by the ion beams IB1, IB2 output under the driving conditions of the ion sources 2A, 2B in (a) of FIG. 53, the to-be-processed layer is etched by the ion beams IB1x, IB2x output under the driving conditions of the ion sources 2A, 2B in (b) of FIG. 53.

The to-be-processed layer may also be etched by the irradiation of ion beams under the driving conditions of the ion sources 2A, 2B in (a) of FIG. 53 and the irradiation of ion beams under the driving conditions of the ion sources 2A, 2B in (b) of FIG. 53 being alternately repeated.

When, as shown in FIG. 53, some to-be-processed layer on the substrate is etched, the etching apparatus in the present example can select conditions and characteristics of an ion beam for each of a plurality of layers included in the to-be-processed layer by the driving conditions of ion sources being controlled.

In a magnetic device such as an MTJ element, optimal etching conditions in each layer included in the MTJ element may be different.

The influence of processing conditions of each layer in the MTJ element may markedly appear in characteristics of the MTJ element with a decreasing size of the MTJ element, for example, as the diameter of the MTJ element in a direction parallel to the substrate surface decreases to 25 nm or less.

Thus, it is preferable to select the incident angle of an ion beam with respect to the to-be-processed layer, energy of an ion beam, or the ion type to form an ion beam in accordance with the timing of etching of each layer included in the to-be-processed layer (laminated structure). However, when ion sources of the single type and characteristics are used for the etching apparatus, it may be difficult to finely change the incident angle of an ion beam, energy of an ion beam, or the ion type of an ion beam each time each layer is etched in terms of time and cost.

As described above, putting all of the plurality of ion sources that generate ion beams under mutually different conditions into a discharge state at the same time and putting, among all the ion sources, ion sources satisfying some condition into a discharge state of 100 V or less has a large effect to make the operation of the ion beam etching apparatus efficient.

That is, energy of an ion beam of a gridless ion source falls extremely by merely decreasing the voltage applied to the ion source to a few tens of % to 50% of a working voltage (rated voltage of the ion source), leading to a lower etching rate of the to-be-processed layer. Thus, when, among a plurality of ion sources in the etching apparatus, some ion source is driven at the voltage (rated voltage) of 100 V and at the same time, another ion source is driven at the voltage of 50 V, even if an ion beam is output from the ion source driven at 50 V in the etching apparatus, etching of the to-be-processed layer is substantially the same as etching performed only by an ion beam from the ion source driven at 100 V.

Then, in the present concrete example, if some ion sources of the plurality of ion sources are maintained in a discharge state of low voltage, the applied voltage of some ion source driven at the rated voltage is decreased and the applied voltage of another ion source is instantaneously increased from the voltage of a low discharge state to the rated voltage (here, 100 V). Accordingly, the ion beam etching apparatus in the present concrete example can swiftly switch the discharge state of ion sources.

Thus, the etching apparatus in the present concrete example can provide a plurality of etching conditions and also switch etching conditions from among the plurality of etching conditions at high speed by a plurality of ion sources being included in one etching apparatus.

As a result, the etching apparatus in the present embodiment can provide low-cost devices (for example, MRAM).

(7) Application Example

An application example of a magnetoresistive effect element formed by the device manufacturing apparatus (ion beam etching apparatus) according to an embodiment will be described with reference to FIGS. 54 and 55. In the application example, the same reference numerals are attached to substantially the same components as components described in the above embodiment and the description of such components is provided when necessary.

(a) Configuration

A magnetoresistive effect element formed by the ion beam etching apparatus in the above embodiment is used as a magnetic memory, for example, as a memory element of Magnetoresistive Random Access Memory (MRAM). In the present application example, Spin-torque transfer MRAM (STT type MRAM) will be illustrated.

FIG. 54 is a diagram showing a circuit configuration of a memory cell array of MRAM in the present application example and the neighborhood thereof.

As shown in FIG. 54, a memory cell array 1009 includes a plurality of memory cells MC.

The plurality of memory cells MC are arranged in the memory cell array 1009 in an array form. In the memory cell array 1009, a plurality of bit lines BL, bBL and a plurality of word lines WL are disposed. The bit lines BL, bBL extend in the column direction and the word lines WL extend in the row direction. The two bit lines BL, bBL form a bit line pair.

The memory cell MC is connected to the bit lines BL, bBL and the word line WL.

The plurality of memory cells MC arrayed in the column direction are connected to the common bit line pair BL and bBL. The plurality of memory cells MC arrayed in the row direction are connected to the common word line WL.

The memory cell MC includes, for example, one magnetoresistive effect element (MTJ element) 1 as a memory element and one selection switch 1002. The selection switch 1002 is, for example, a field effect transistor (FET). Hereinafter, a field effect transistor as the selection switch 1002 will be called a select transistor 1002.

One end of the MTJ element 1 is connected to the bit line BL and the other end of the MTJ element 1 is connected to one end (source/drain) of a current path of the select transistor 1002. The other end (drain/source) of the current path of the select transistor 1002 is connected to the bit line bBL. A control terminal (gate) of the select transistor 1002 is connected to the word line WL.

One end of the word line WL is connected to a row control circuit 1004. The row control circuit 1004 controls activation/deactivation of the word line based on an address signal from outside.

Column control circuits 1003A, 1003B are connected to one end and the other end of the bit lines BL, bBL. The column control circuits 1003A, 1003B control activation/deactivation of the bit lines BL, bBL based on an address signal from outside.

Write circuits 1005A, 1005B are connected to one end and the other end of the bit lines BL, bBL via the column control circuits 1003A, 1003E respectively. The write circuits 1005A, 1005B each have source circuits such as a current source or voltage source to generate a write current and sink circuits to absorb the write current.

In an STT type MRAM, the write circuits 1005A, 1005B supply a write current $I_{WR}$ to a memory cell selected from outside (hereinafter, called a selected cell) when data is written.

When data is written into the MTJ element 1, the write circuits 1005A, 1005B bidirectionally pass a write current to the MTJ element 1 in the memory cell MC in accordance with data to be written into the selected cell. That is, a write current from the bit line BL toward the bit line bBL or a write current from the bit line bBL toward the bit line BL is output from the write circuits 1005A, 1005B in accordance with data to be written into the MTJ element 1.

A read circuit 1006 is connected to one end of the bit lines BL, bBL via the column control circuit 1003A. The read circuit 1006 includes a voltage source or current source that generates a read current, a sense amplifier that detects and amplifies a read signal, and a latch circuit that temporarily holds data. The read circuit 1006 supplies a read current to the selected cell when data is read from the MTJ element 1. The current value of a read current is smaller than that of a write current (magnetization reversal threshold) so that magnetization of the storage layer is not reversed by the read current.

The current value or the potential in a reading node is different depending on the magnitude of resistance of the MTJ element 1 to which a read current is supplied. Data stored in the MTJ element 1 is determined based on a variation amount (read signal, read output) in accordance with the magnitude of the resistance.

In the example shown in FIG. 54, the read circuit 1006 is disposed on one end side in the column direction of the memory cell array 1009, but two read circuits may be disposed on one end and the other end in the column direction.

For example, a circuit (hereinafter, called a peripheral circuit) other than the row/column control circuit, the write circuit, and the read circuit is disposed in the same chip as that of the memory cell array 1009. For example, a buffer circuit, a state machine (control circuit), or an ECC (Error Checking and Correcting) circuit may be disposed in the chip as a peripheral circuit.

Figure 55:
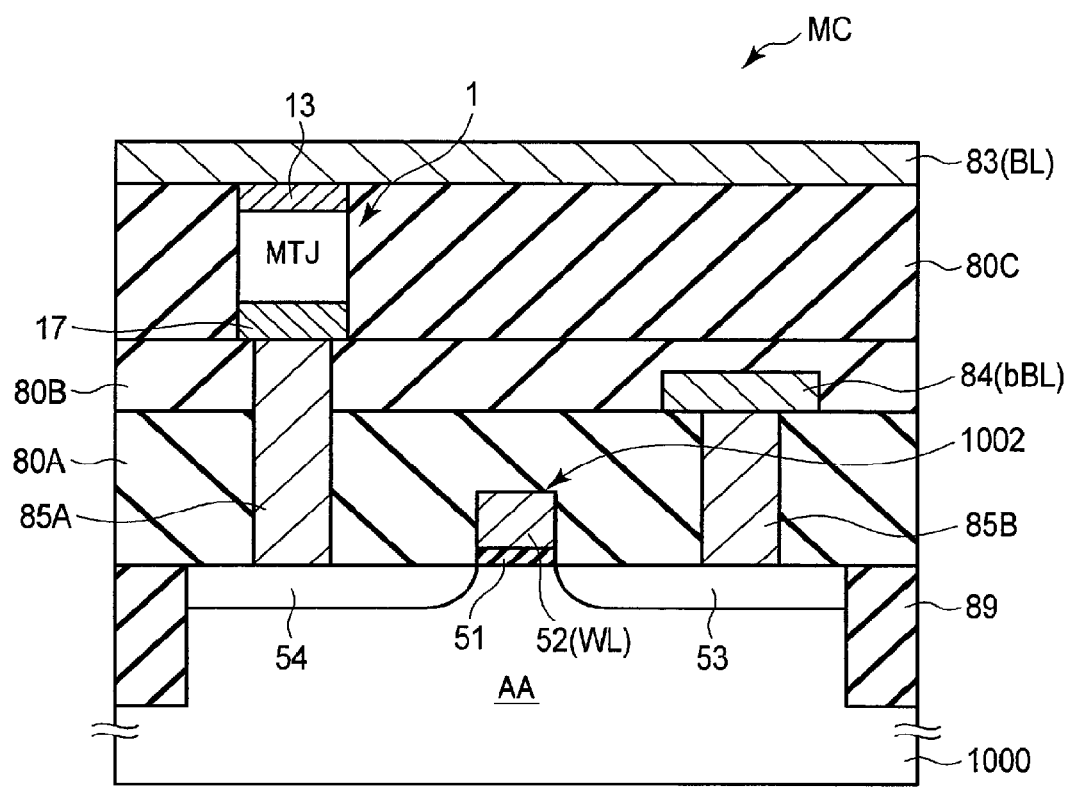

FIG. 55 is a sectional view showing an example of the structure of the memory cell MC disposed in the memory cell array 1009 of MRAM in the present application example.

The memory cell MC is formed in an active region AA of the semiconductor substrate 1000. The active region AA is partitioned by an insulating film 89 embedded in an element isolation region of the semiconductor substrate 1000. Interlayer insulating films 80A, 80B, 80C are disposed on the semiconductor substrate 1000. The MTJ element 1 is disposed on the interlayer insulating films 80A, 80B. The MTJ element 1 is covered with the interlayer insulating film 80C via a protective film (not shown).

The top end of the MTJ element 1 is connected to a bit line 83 (BL) via an upper electrode 13. The bit line 83 is disposed on the interlayer insulating film 80C covering the MTJ element 1. The bottom end of the MTJ element 1 is connected to one source/drain diffusion layer 54 of the select transistor 1002 via a lower electrode (underlayer) 17 and a contact plug 85A inside the interlayer insulating films 80A, 80B. Another source/drain diffusion layer 53 of the select transistor 1002 is connected to a bit line 84 (bBL) via a contact plug 85B inside the interlayer insulating films 80A.

A gate electrode 52 is disposed on the surface of the active region AA between the source/drain diffusion layer 53 and the source/drain diffusion layers 54 via a gate insulating film 51. The gate electrode 52 extends in a row direction and is used as the word line WL.

The MTJ element 1 is disposed immediately above the plug 85A, but may also be arranged in a position deviating from immediately above the contact plug (for example, above the gate electrode of the select transistor) by using an intermediate interconnect layer.

In FIG. 55, an example in which one memory cell is disposed in one active region AA is shown. However, two memory cells may be disposed in one active region AA side by side in the column direction so as to share one bit line bBL and the source/drain diffusion layer 53. The cell size of the memory cell MC is thereby reduced.

In FIG. 55, a field effect transistor in a planar structure is shown as the select transistor 1002, but the structure of the select transistor 1002 is not limited to the above structure. For example, a field effect transistor in a three-dimensional structure such as RCAT (Recess Channel Array Transistor) and FinFET may be used as a select transistor. RCAT has a structure in which the gate electrode is embedded in a recess in a semiconductor region via a gate insulating film. FinFET has a structure in which the gate electrode three-dimensionally intersects with a semiconductor region (fin) in a thin rectangular shape via a gate insulating film.

(b) Manufacturing Method

A memory cell of a magnetic memory is formed as described below.

For example, the select transistor 1002 is formed on the semiconductor substrate 1000 according to known technology. The interlayer insulating films 80A, 80B are formed in the semiconductor substrate 1000 so as to cover the formed select transistor 1002. Contact holes are formed inside the interlayer insulating films 80A, 80B such that the top surface of the source/drain diffusion layers 53, 54 of the select transistor 1002 is exposed and the contact plugs 85A, 85B are embedded in the contact holes.

As described above (for example, FIGS. 2 to 7), a laminated structure including constituent members of the MTJ element is formed on the interlayer insulating film 80B. Then, the laminated structure is processed based on a hard mask having a predetermined shape.

Processing of the laminated structure is performed using an ion beam having an incident dispersion angle of any magnitude (for example, 5° to 60°) output from a gridless ion source (for example, an end hole type ion source). In this case, it is preferable to generate an ion beam such that 10% or more of the ions have an energy of 100 eV.

The laminated structure is irradiated with an ion beam from the gridless ion source (for example, an end hole type ion source) via a through hole of a shield disposed in the etching apparatus.

Uniformity of etching of the to-be-processed layer is improved and variations of element characteristics of a plurality of MTJ elements on the substrate are reduced by etching of the MTJ element being performed by an ion beam passing through the through hole of the shield.

In the etching apparatus according to the present embodiment, as a result of being able to improve the etching rate of the to-be-processed layer by an ion beam passing through the through hole of the shield, the time to form an MTJ element is reduced and throughput of a device including the MTJ element is improved.

After the MTJ element 1 is formed by the irradiation of an ion beam by an ion beam etching apparatus according to the present embodiment, a protective film (not shown) covering the MTJ element 1 is formed by the ALD method. Then, the interlayer insulating film 80C is deposited on the interlayer insulating films 80A, 80B so as to cover the MTJ element 1. The bit line 83 is formed on the interlayer insulating film 80C so as to be connected to the MTJ element 1.

The memory cell of MRAM is formed by performing the above process.

By applying a device manufacturing apparatus (ion beam etching apparatus) according to the present embodiment to the formation of a magnetoresistive element included in a magnetic memory, the present application example can achieve speedup of etching of the above to-be-processed layer and improvements of uniformity of etching. As a result, according to the present application example, magnetic memories in which defects of magnetoresistive effect elements are reduced can be manufactured. Therefore, a manufacturing method of magnetic devices using a device manufacturing apparatus according to the present embodiment can improve manufacturing yields of magnetic memories at a relatively low manufacturing cost and provide highly reliable magnetic memories.

(8) Other

Magnetic memories using magnetoresistive effect elements formed by a device manufacturing apparatus according to the above embodiment are used as an alternative memory of, for example, DRAM, SRAM or the like. Magnetoresistive effect elements formed by the device manufacturing apparatus according to the above embodiment may also be applied to magnetic memories of other than MRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A device manufacturing apparatus comprising:
 a substrate holding portion holding a substrate to be processed;
 an ion source including a housing, an anode disposed in the housing, a cathode disposed outside the housing, and a first opening disposed in a portion of the housing such that the anode is exposed to a region between the anode and the substrate holding portion, the ion source configured to generate an ion beam with which the substrate is irradiated; and
 at least one first structure disposed between the ion source and the substrate holding portion, and having a first through hole through which the ion beam passes,
 wherein
 the first structure includes a conductor, and
 an opening dimension of the first through hole is equal to or larger than an opening dimension of the first opening.

2. The apparatus of claim 1, wherein
 the first structure is disposed on a side of the substrate holding portion from an intermediate position between the ion source and the substrate holding portion.

3. The apparatus of claim 1, wherein
 the housing has a cylindrical structure,
 the ion source further includes a magnetic field source installed on a center axis of the housing to generate a first magnetic field,
 the first magnetic field includes a first magnetic field component in a first direction along an emission direction of the ion beam and a second magnetic field component in a second direction perpendicular to the emission direction of the ion beam,
 the first magnetic field component on the center axis of the housing has a magnetic field strength stronger at a center of the housing than at the first opening, and
 the second magnetic field component in the first opening has a magnetic field strength weaker at the center of the first opening than at an end of the first opening.

4. The apparatus of claim 1, wherein
 the first structure has a first protruding portion disposed along an edge of the first through hole and protruding toward a side of the ion source, and
 an opening dimension of the first protruding portion on the side of the ion source is smaller than an opening dimension of the first protruding portion on a side of the substrate holding portion.

5. The apparatus of claim 1, wherein
 the first structure has a second protruding portion disposed along an edge of the first through hole and protruding toward a side of the substrate holding portion, and
 an opening dimension of the second protruding portion on the side of the substrate holding portion is larger than an opening dimension of the second protruding portion on a side of the ion source.

6. The apparatus of claim 1, further comprising:
a second structure disposed between the first structure and the substrate holding portion and having a second through hole through which the ion beam passes, wherein
the second structure has a third protruding portion disposed along an edge of the second through hole and protruding toward a side of the substrate holding portion, and
an opening dimension of the third protruding portion on the side of the substrate holding portion is larger than an opening dimension of the third protruding portion on a side of the ion source.

7. The apparatus of claim 1, wherein
the first structure includes a first portion on an edge of the first through hole and a second portion on the edge of the first through hole, the second portion is opposed to the first portion,
a first interval between the first portion and a center of the substrate holding portion in a direction perpendicular to a surface of the substrate holding portion is smaller than a second interval between the second portion and the center of the substrate holding portion in the direction perpendicular to the surface of the substrate holding portion, and
the ion source is set to irradiate with the ion beam in a slanting direction with respect to the surface of the substrate holding portion and from the side of the first portion.

8. The apparatus of claim 1, wherein
a surface of the first structure and a surface of the substrate holding portion are opposed to each other, and
the substrate holding portion moves the substrate in a direction parallel to the surface of the first structure.

9. The apparatus of claim 1, wherein
the substrate is irradiated with the ion beam in a state in which the substrate holding portion covers 70% or more of an area of the first through hole when viewed from a side of the ion source.

10. The apparatus of claim 1, wherein
the substrate is irradiated with the ion beam in a state in which the substrate holding portion covers 100% of an area of the first through hole when viewed from a side of the ion source.

11. A manufacturing method of a magnetic device comprising:
generating the ion beam by the device manufacturing apparatus of claim 1; and
forming at least one magnetoresistive effect element by processing the substrate by the ion beam passing through the first through hole, the substrate comprising the layer to be processed including a laminated structure, the laminated structure including at least a first magnetic layer in which an orientation of magnetization is variable, a second magnetic layer in which the orientation of the magnetization is invariable, and a nonmagnetic layer between the first and second magnetic layers.

12. The method of claim 11, wherein
the layer is processed by the ion beam such that a maximum dimension of the first magnetic layer of the magnetoresistive effect element in the direction parallel to a surface of the substrate is 25 nm or less.

13. A device manufacturing apparatus comprising:
a substrate holding portion holding a substrate to be processed;
a first ion source including a first housing, a first anode disposed inside the first housing, a first cathode disposed outside the first housing, and a first opening disposed in a portion of the first housing such that the first anode is exposed to a region between the first anode and the substrate holding portion, the first ion source configured to generate a first ion beam with which the substrate is irradiated;
a second ion source including a second housing, a second anode disposed inside the second housing, a second cathode disposed outside the second housing, and a second opening disposed in a portion of the second housing such that the second anode is exposed to a region between the second anode and the substrate holding portion, the second ion source configured to generate a second ion beam with which the substrate is irradiated; and
a first structure disposed between the first and second ion sources and the substrate holding portion, and having at least one through hole through which the first and second ion beams pass,
wherein
the first structure includes a conductor,
opening dimension of the at least one through hole are equal to or larger than the opening dimensions of the first and second openings,
the first ion source is set to irradiate with the first ion beam from a first direction with respect to a surface of the substrate holding portion, and
the second ion source is set to irradiate with the second ion beam from a second direction with respect to the surface of the substrate holding portion, the second direction is different from the first direction.

14. The apparatus of claim 13, wherein
the at least one through hole comprises first and second through holes which are different from each other, the first ion beam passing through the first through hole, the second ion beam passing through the second through hole.

15. The apparatus of claim 13, wherein
the first and second ion beams pass through the one through hole.

16. The apparatus of claim 13, wherein
a timing in which the substrate holding portion is irradiated with the second ion beam is different from a timing in which the substrate holding portion is irradiated with the first ion beam.

17. The apparatus of claim 13, wherein
the first ion source is connected to a first power supply,
the second ion source is connected to a second power supply, the second power supply is different from the first power supply, and
when a rated voltage of the first ion source is supplied from the first power supply to the first ion source, a first voltage is supplied from the second power supply to the second ion source,
the first voltage is smaller than a rated voltage of the second ion source and larger than a ground voltage.

18. The apparatus of claim 13, wherein
a surface of the first structure and a surface of the substrate holding portion are opposed to each other,
the first structure moves in a direction parallel to the surface of the first structure, and
when the at least one through hole is positioned between the first opening and the substrate holding portion, a portion of the first structure excluding the at least one through hole is positioned between the second opening and the substrate holding portion.

19. A manufacturing method of a magnetic device comprising:
generating the first and second ion beams by the apparatus of claim 13; and
forming at least one magnetoresistive effect element on the substrate by processing the substrate by the first and second ion beams passing through the at least one through hole, the substrate comprising a layer to be processed including a laminated structure, the laminated structure including at least a first magnetic layer in which an orientation of magnetization is variable, a second magnetic layer in which the orientation of the magnetization is invariable, and a nonmagnetic layer between the first and second magnetic layers.

20. The method of claim 19, wherein
the substrate is processed by the first and second ion beams such that a maximum dimension of the first magnetic layer of the magnetoresistive effect element in the direction parallel to a surface of the substrate is 25 nm or less.

\* \* \* \* \*